US009765635B2

(12) United States Patent
Gorokhovsky

(10) Patent No.: US 9,765,635 B2
(45) Date of Patent: *Sep. 19, 2017

(54) EROSION AND CORROSION RESISTANT PROTECTIVE COATINGS FOR TURBOMACHINERY

(71) Applicant: Nano-Product Engineering, LLC, Lafayette, CO (US)

(72) Inventor: Vladimir Gorokhovsky, Lafayette, CO (US)

(73) Assignee: Nano-Product Engineering, LLC., Lafayette, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/234,210

(22) Filed: Aug. 11, 2016

(65) Prior Publication Data
US 2017/0030204 A1 Feb. 2, 2017

Related U.S. Application Data

(63) Continuation-in-part of application No. 12/790,691, filed on May 28, 2010, now Pat. No. 9,482,105.

(51) Int. Cl.
*F01D 5/14* (2006.01)
*F01D 5/28* (2006.01)
(Continued)

(52) U.S. Cl.
CPC ............ *F01D 5/288* (2013.01); *C23C 14/028* (2013.01); *C23C 14/0688* (2013.01);
(Continued)

(58) Field of Classification Search
CPC . F01D 5/288; F01D 5/28; F01D 5/284; F01D 5/286; F01D 5/12; F01D 5/147; F01D 5/141; F01D 5/00
See application file for complete search history.

(56) References Cited

U.S. PATENT DOCUMENTS 3,584,972 A * 6/1971 Bratkovich ............ B21D 53/78
29/889.721
4,851,095 A 7/1989 Scobey et al.
(Continued)

OTHER PUBLICATIONS

Y.H. Cheng, T. Browne, B. Heckerman, J.C. Jiang, E.I. Meletis, C. Bowman, V. Gorokhovsky, "Internal stresses in TiN/Ti multilayer coatings deposited by large area filtered arc deposition," Published Nov. 4, 2008, Journal of Applied Physics, vol. 104, 093502.*
(Continued)

*Primary Examiner* — Nicholas Kokkinos
(74) *Attorney, Agent, or Firm* — Lathrop & Gage LLP

(57) ABSTRACT

An erosion and corrosion resistant protective coating for turbomachinery application includes at least one ceramic or metal-ceramic coating segment deposited on surface of a conductive metal substrate subjected to a pre-deposition treatment by at least blasting to provide the surface with texture. The erosion and corrosion resistant coating has a plurality of dome-like structures with dome width between in range from about 0.01 µm to about 30 µm. The at least one coating segment is formed by condensation of ion bombardment from a metal-gaseous plasma flow, wherein, at least during deposition of first micron of the coating segment, deposition rate of metal ions is at least 3 µm/hr and kinetic energy of deposited metal ions exceeds 5 eV.

57 Claims, 34 Drawing Sheets

(51) Int. Cl.
*C23C 14/02* (2006.01)
*C23C 14/06* (2006.01)
*C23C 14/32* (2006.01)
*C23C 14/35* (2006.01)
*C23C 28/00* (2006.01)

(52) U.S. Cl.
CPC ............ *C23C 14/325* (2013.01); *C23C 14/35* (2013.01); *C23C 28/322* (2013.01); *C23C 28/34* (2013.01); *C23C 28/343* (2013.01); *C23C 28/36* (2013.01); *C23C 28/44* (2013.01); *F05D 2250/28* (2013.01)

(56) References Cited

U.S. PATENT DOCUMENTS

| | | | |
|---|---|---|---|
| 4,916,022 A * | 4/1990 | Solfest | C23C 14/083 416/241 B |
| 4,923,713 A * | 5/1990 | Rudd | B05D 5/04 427/171 |
| 4,981,756 A | 1/1991 | Rhandhawa | |
| 5,152,774 A | 10/1992 | Schroeder | |
| 5,174,024 A | 12/1992 | Sterrett | |
| RE34,173 E * | 2/1993 | Kerber | C23C 14/0641 416/241 B |
| 5,435,900 A | 7/1995 | Gorokhovsky | |
| 5,656,364 A | 8/1997 | Rickerby et al. | |
| 5,912,087 A * | 6/1999 | Jackson | C23C 28/3215 416/241 B |
| 5,940,095 A | 8/1999 | Parish et al. | |
| 5,940,975 A | 8/1999 | Decker et al. | |
| 5,992,268 A | 11/1999 | Decker et al. | |
| 6,043,451 A | 3/2000 | Julien et al. | |
| 6,617,057 B2 * | 9/2003 | Gorokhovsky | C23C 14/022 428/156 |
| 6,663,755 B2 | 12/2003 | Gorokhovsky | |
| 6,835,045 B1 | 12/2004 | Barbee et al. | |
| 7,247,348 B2 | 7/2007 | Power | |
| 7,300,559 B2 | 11/2007 | Gorokhovsky | |
| 9,482,105 B1 * | 11/2016 | Gorokhovsky | F01D 5/28 |
| 2005/0036892 A1 * | 2/2005 | Bajan | C23C 4/02 416/241 R |
| 2005/0139290 A1 | 6/2005 | Boisvert | |
| 2007/0284255 A1 | 12/2007 | Gorokhovsky et al. | |

OTHER PUBLICATIONS

Gorokhovsky, Bowman, Vanvorous, and Wallace. "Deposition of various metal, ceramic, and cermet coatings by an industrial-scale large area filtered arc deposition process", J. Vac. Sci. Technol. A, Jun. 30, 2009, pp. 1080-1095, vol. 27, Issue 4.

Gorokhovsky, "Characterization of thick ceramic and cermet coatings deposited by an industrial-scale LAFAD process", Surface & Coatings Technology, available online Oct. 27, 2009, pp. 1216-1221, vol. 204, Issue 8.

Novikov, Superhard i-C coating used in complex process of surface strengthening of tools and machine parts, Surface and Coatings Technology, 47, book, pp. 770-791, 1991, Elsevier Sequoia, Printed in the Netherlands.

Gorokhovsky, Hard Ceramic and Cermet Coatings for Erosion Protection of Turbomachinery Components, proceedings of ASME Turbo Expo 2009, Jun. 8-12, 2009, pp. 1-11, Orlando, Florida, USA.

Gorokhovsky, Vacuum Metal Web Coating With Cermets, proceedings of fourth International Conference on Vacuum Web Coating, Oct. 31-Nov. 2, 1990, pp. 214-231, Reno, Nevada, USA.

Gorokhovsky, Study of the Corrosion Resistance of Titanium Nitride Coated Surgical Tools, proceedings of the International Ion Engineering Congress, Sep. 12-16, 1983, pp. 1315-1318, Sakyo-ku, Kyoto, Jap.

Champagne, Jr, Formation of 'Super Plastic Agglomerate Mixing' (SPAM) Between Copper and 6061-T6511 4 Aluminum Deposited by the Supersonic Particle Deposition Process (SPD), USArmy Research Lab Weapons and Materials Directorate, Aberdeen, MD, USA.

* cited by examiner

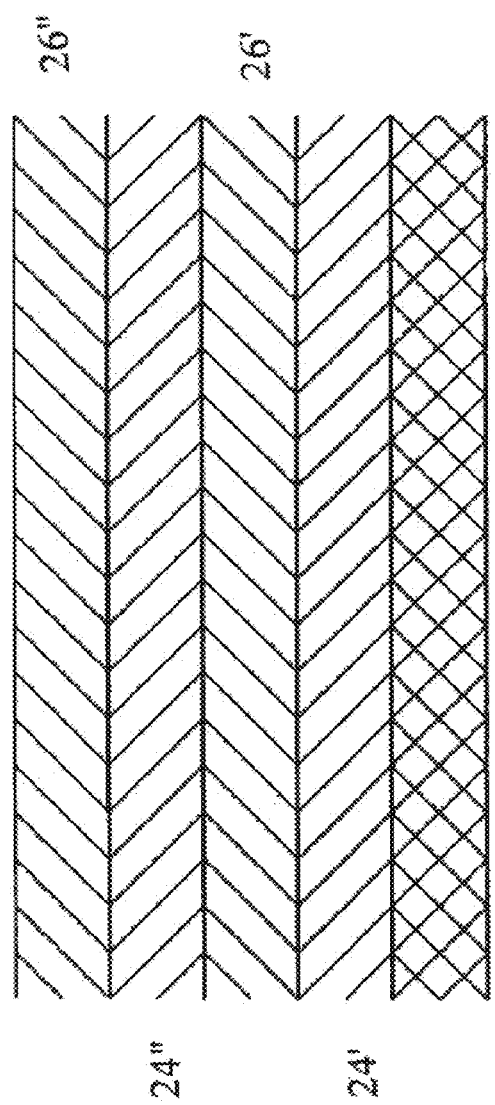

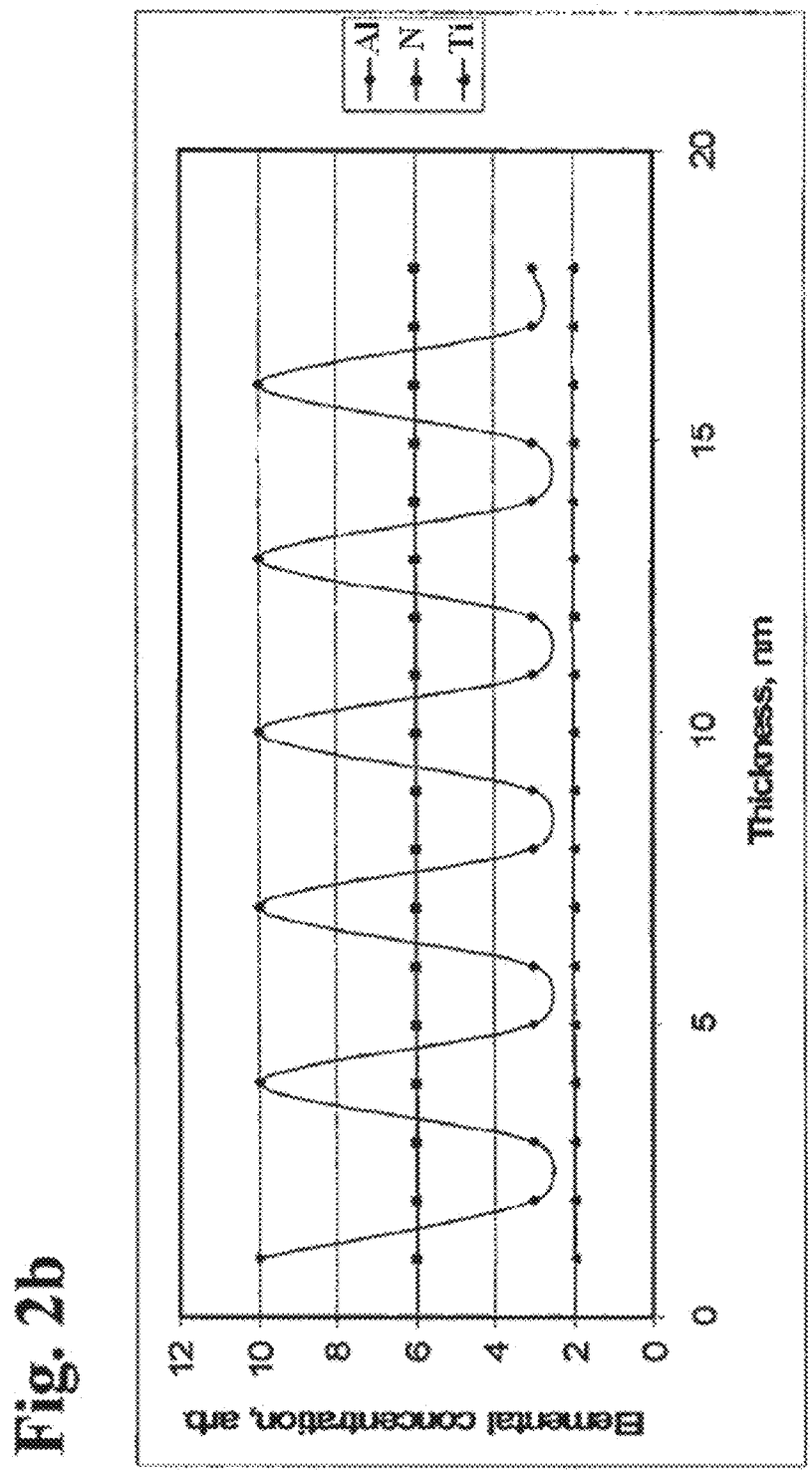

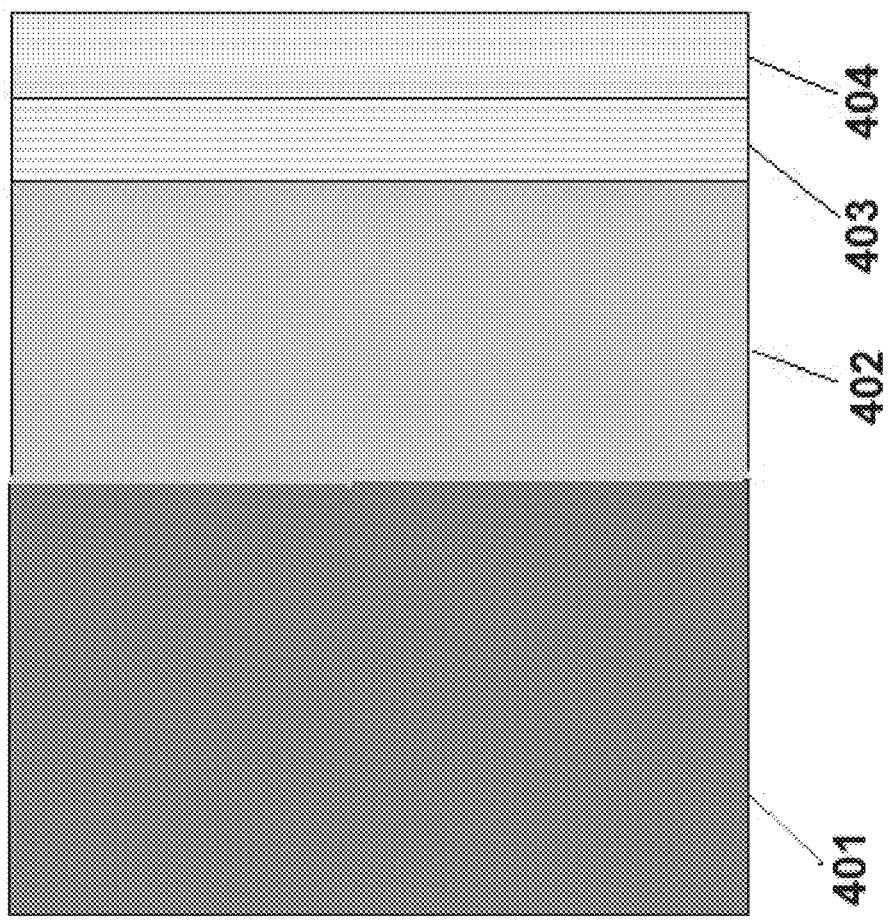

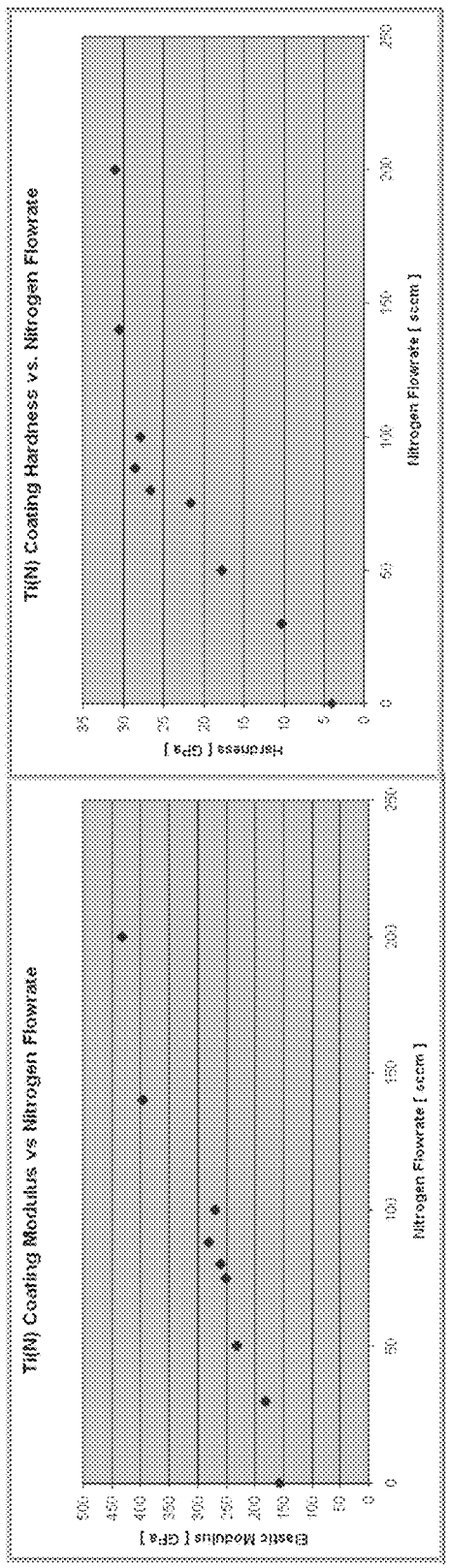
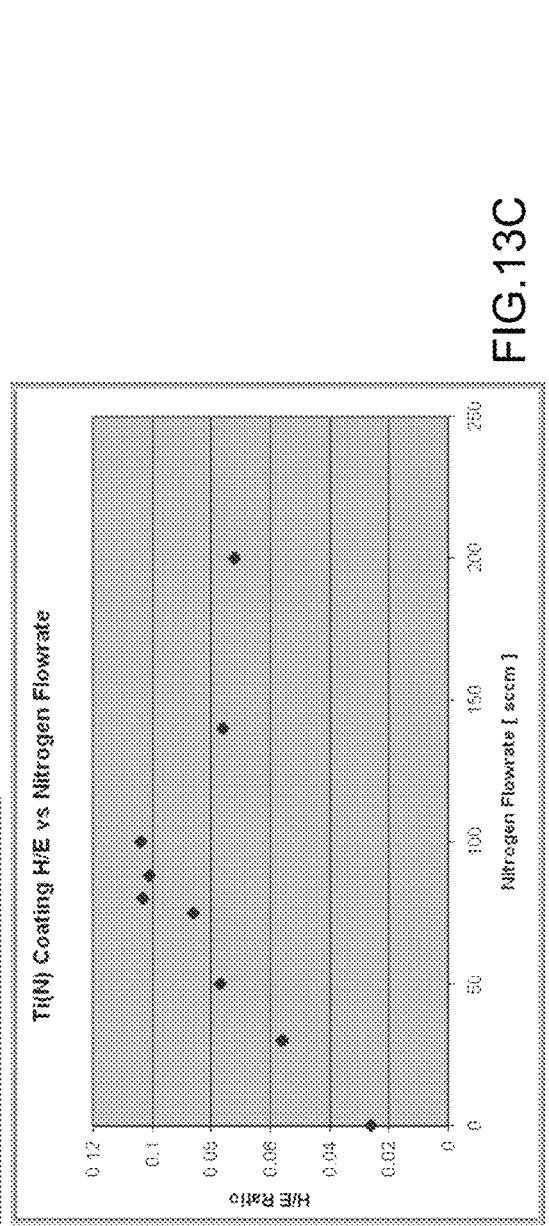
FIG.13A
FIG.13B
FIG.13C

Fig.21

Table 2. Mechanical properties of one-segment and two-segments coatings subjected to erosion testing based on E50TF121 Test Protocol.

| Coating ID | Coating Description | Ti sublayer time, min | TiN sublayer time, min | Total Coating Thickness um | Hardness H, GPa | Elastic Modulus E, GPa | Coating Toughness H/E |
|---|---|---|---|---|---|---|---|
| K1 | Nano-microlaminated Ti/TiN | 2 | 13 | 40.0 | 22.3 | 359.0 | 0.062 |
| K3 | Nano-microlaminated Ti/TiN | 2 | 13 | 45.0 | 21.8 | 380.0 | 0.057 |
| P1 | Microlaminated Ti/TiN | 5 | 15 | 32.5 | 18.2 | 317.5 | 0.057 |
| Q1 | Microlaminated Ti/TiN | 5 | 25 | 40.0 | 21.9 | 366.5 | 0.060 |
| G2 | Microlaminated Ti/TiN | 20 | 40 | 33.5 | 19.0 | 318.0 | 0.060 |
| S1 | Sub-stoichiometric monolithic TiN | | | 34.0 | 37.7 | 394.0 | 0.096 |
| P1+S1 | 2-segments | | | 66.5 | 37.0 | 392.0 | 0.094 |
| Q1+S1 | 2-segments | | | 74.0 | 36.4 | 381.0 | 0.096 |
| G2+S1 | 2-segments | | | 67.5 | 36.6 | 371.0 | 0.099 |

Fig.22

Table 3. E50TF121 Test Protocol: 20deg, Arizona Dust A4 Coarse, 600g total erodent at ~4g/sec.

| Coating ID | Coating Type | Multilayer Ratio | Coating Thickness [um] | Erosion Mass Loss [ug/g] | Coating Breached? [yes/no] |
|---|---|---|---|---|---|
| AB1 | Ti + TiN | Dual metal/ceramic segment | 32 | 0.1 | no |
| J2 | TiN | monolayer | 32 | 0.2 | no |
| X2 | TiNx | monolayer | 32 | 0.2 | no |
| G4 + X2 | Ti-TiN + TiNx | 1:2 + monolayer | 65 | 0.3 | no |
| K4 | Ti-TiN | 1:6.5 | 32 | 0.5 | no |
| G4 + K4 | Ti-TiN | 1:2 + 1:6.5 | 65 | 0.5 | no |
| G4 + J2 | Ti-TiN + TiN | 1:2 + TiN monolayer | 65 | 1.8 | yes |
| 17-4PH | uncoated, baseline | n/a | n/a | 3.5 | n/a |
| G4 | Ti-TiN | 1:2 | 32 | 5.2 | yes |

Fig.23

Table 4. E50TF121 Test Protocol 90deg, Arizona Test Dust A4 Coarse, 600g total erodent at ~4g/sec

| Coating ID | Coating Type | Multilayer Ratio | Coating Thickness [um] | Erosion Mass Loss [ug/g] | Coating Breached? [yes/no] |
|---|---|---|---|---|---|
| AB1 | Ti + TiN | Dual metal/ceramic segment | 32 | 0.2 | no |
| J2 | TiN | monolayer | 32 | 0.5 | no |
| X2 | TiNx | monolayer | 32 | 0.8 | no |
| K4 | Ti-TiN | 1:6.5 | 32 | 0.8 | no |
| G4 + J2 | Ti-TiN + TiN | 1:2 + monolayer | 65 | 1.3 | yes |
| G4 + K4 | Ti-TiN | 1:2 + 1:6.5 | 65 | 1.7 | no |
| G4 + X2 | Ti-TiN + TiNx | 1:2 + TiN monolayer | 65 | 4.7 | no |
| 17-4PH | uncoated, baseline | n/a | n/a | 160.7 | n/a |

Table 5. Summary of tests per E50TF121 Test Protocol: 90deg, 50um Al2O3, 600g total erodent at ~6.5g/sec

| Coating ID | Coating Type | Multilayer Ratio | Coating Thickness [um] | Erosion Mass Loss [ug/g] | Coating Breached? [yes/no] |
|---|---|---|---|---|---|
| AB1 | Ti + TiN | dual layer | 32 | 0.1 | no |
| J2 | TiN | monolayer | 32 | 0.2 | no |
| X2 | TiNx | monolayer | 32 | 0.2 | no |
| G4 + X2 | Ti-TiN + TiNx | 1:2 + monolayer | 65 | 0.3 | no |
| K4 | Ti-TiN | 1:6.5 | 32 | 0.5 | no |
| G4 + K4 | Ti-TiN | 1:2 + 1:6.5 | 65 | 0.5 | no |
| G4 + J2 | Ti-TiN + TiN | 1:2 + monolayer | 65 | 1.8 | yes |
| 17-4PH | uncoated, baseline | n/a | n/a | 3.5 | n/a |
| G4 | Ti-TiN | 1:2 | 32 | 5.2 | yes |

Fig.24

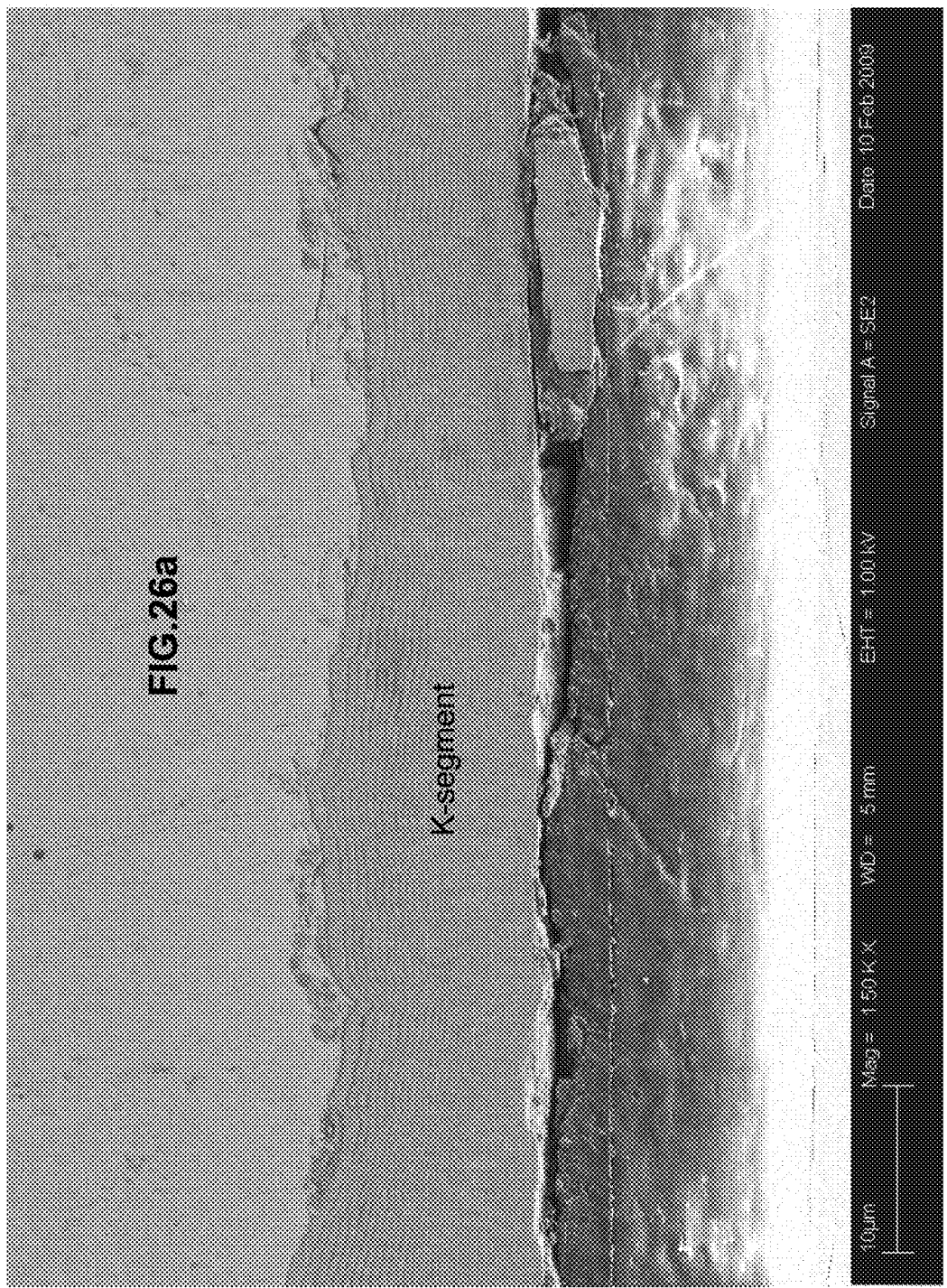

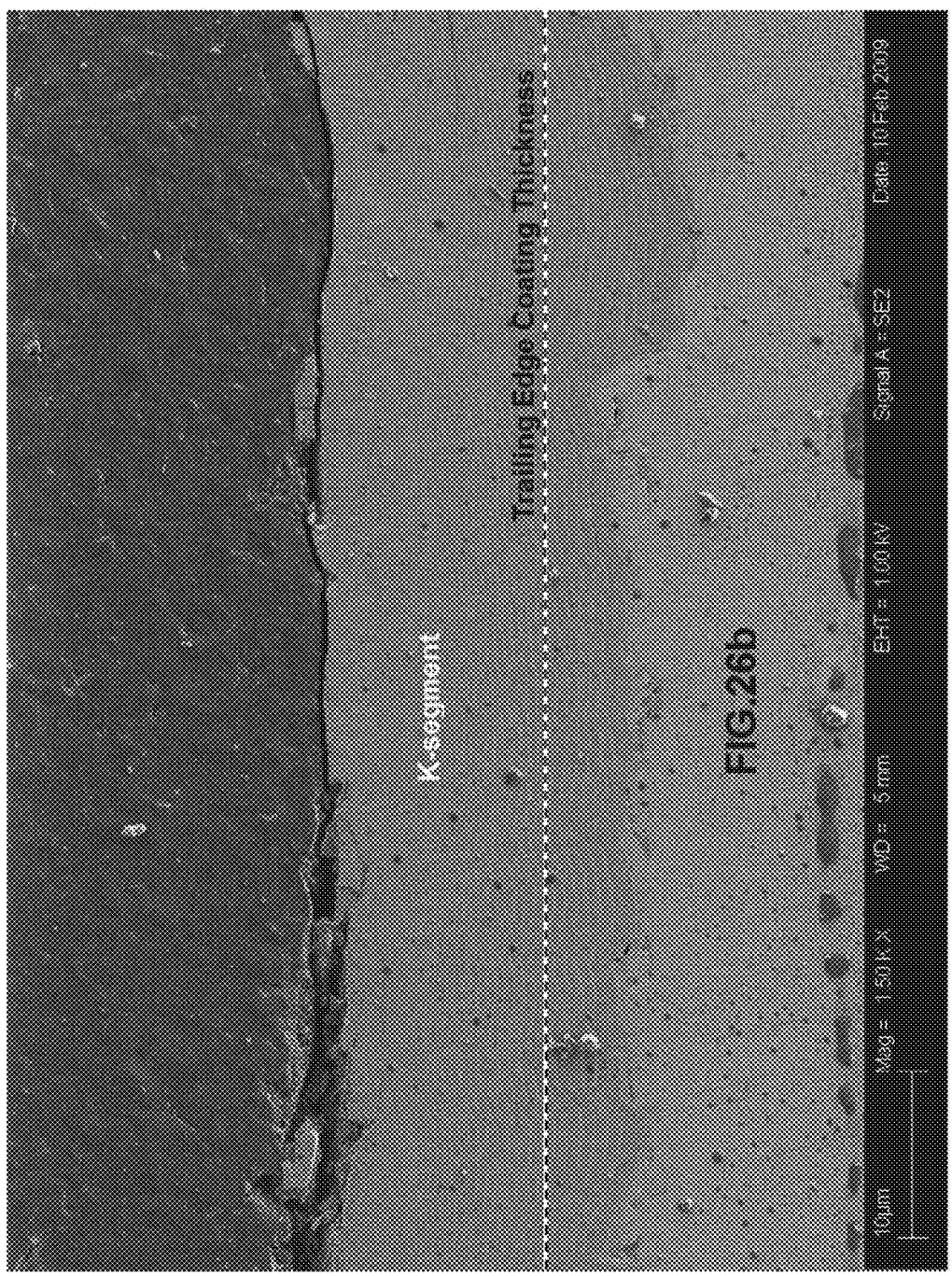

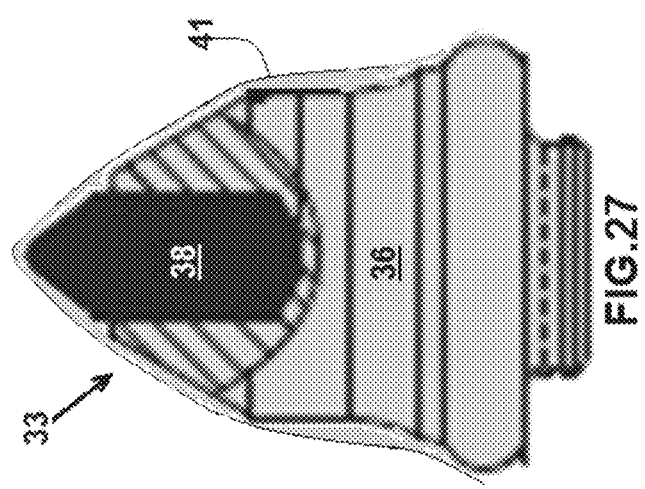

EROSION AND CORROSION RESISTANT PROTECTIVE COATINGS FOR TURBOMACHINERY

CROSS-REFERENCE TO RELATED APPLICATIONS

This application is a continuation-in-part of U.S. patent application Ser. No. 12/790,691 filed May 28, 2010, now U.S. Pat. No. 9,482,105, which is incorporated herein by reference in its entirety.

FIELD OF THE INVENTION

The present invention relates to coated metal sheets to protect against abrasion and erosion wear, corrosion, high temperature oxidation, and other types of surface born degradation, and also relates to the method of making the protective coatings on metal sheets and various applications of metal sheets with protective coatings, and more particularly for protection of turbomachinery components such as covers for helicopter rotors and airfoils for turbine engines.

BACKGROUND OF THE INVENTION

The rotorblades of modern helicopters are made of composite materials and suffer from wear due to sand and rain erosion as well as overheating by absorbing the sun's infrared rays. Wear degrades the adhesive used in these laminated composites and results in debonding and delaminating the blade's composite skin. Specifically, the high temperatures resulting from the blade absorbing the sun's infrared rays cause bonding deterioration and delamination of helicopter rotor blade components. Debonding is the disintegration of the epoxy or other adhesive materials between spar connections, and delamination is the peeling of layers of the composite skin forming the outer surface of the rotor blade. In addition to the ultraviolet effects of the sun, erosion, poor repairs and repeated high cyclical loading exasperates the problems of wear causing minute openings in the rotorblade's skin. A protector for protecting aircraft, particularly helicopter rotor blades, from absorbing the sun's infrared rays and the accompanied heat build-up in order to keep adhesive material between spar connections from debonding and to avoid delamination from the rotor blade's composite skin is described in U.S. Pat. No. 6,835,045 to Barbee et al. This rotor blade protector includes a cover configured to encircle the length of the rotor blade and a guide form for installing and removing the cover. The inner surface of the cover is coated, by vacuum deposition technology, with aluminum, titanium, or other metals or alloys. A stripper rod is attached to the guide so that aircraft personnel can install and remove the protector from the helicopter rotor blade while standing on the ground. This invention, while helping to protect the rotor blade against overheating, does not help in preventing deterioration due to sand and rain erosion.

A pre-shaped protective layer consisting of an abrasive strip having a mesh bonded to its inside surface to ease its attachment to the surface of the rotor blade is proposed in U.S. Pat. No. 5,174,024 by Sterrett. The abrasive strip is used as a sacrificial layer which is to be replaced as it wears away with usage. While this invention improves the bonding between the abrasion strip and the blade, it does not help to substantially improve the erosion resistance of the strip which will result in the necessity of replacing the strip too often especially when helicopters operate in harsh environments.

Hard wearing surfaces are in common use in various industries, and such hard wearing surfaces are frequently obtained by coating the surface of a tool made of steel or similar metal, or other hard, enduring material, with a layer of hard wearing ceramic substance, such as carbides, nitrides and carbonitrides, or providing a hard microcrystalline diamond coating. There are known methods for obtaining hard wearing coatings, such as for example, having a coating of diamond particles in combination with a carbide or nitride layer and then filling the gaps between the abrasive particles with a softer intermetallic compound. Another known method is vapor deposition of hard-wearing ceramic materials from plasma or by utilizing molten ceramic substances.

A device for yielding hard ceramic surfaces by cathodic arc plasma deposition is described in U.S. Pat. No. 4,851,095, issued to M. A. Scobey et al. on Jul. 25, 1989. The apparatus of Scobey et al. utilizes a high intensity ion flux. Vapor deposition of a hard ceramic material, such as titanium or zirconium nitride on a stainless steel or titanium surface by utilizing a molten evaporant and a hollow cathode, is described in U.S. Pat. No. 5,152,774, issued to W. A. Schroeder on Oct. 6, 1992. The vapor deposition of Schroeder is conducted at relatively low temperature, thus the substrate will have lost little of its initial high strength properties, however, the requirement of low surface roughness of the deposited layer is not addressed by U.S. Pat. No. 5,152,774. In U.S. Pat. No. 4,981,756, issued to H. S. Rhandhawa on Jan. 1, 1991, a method is taught to coat surgical tools and instruments by cathodic arc plasma deposition. The ceramic coating obtained by this technology is a nitride, carbide or carbonitride of zirconium or hafnium, in a single layer of 3-10 µm thickness. U.S. Pat. No. 4,981,756 also refers to various publications describing known equipment for obtaining hard-wearing surfaces by cathodic arc plasma deposition. U.S. Pat. Nos. 5,940,975 and 5,992,268 issued to T. G. Decker et al. on Aug. 24, 1999 and Nov. 30, 1999, respectively, teach hard, amorphous diamond coatings obtained in a single layer on thin metallic blades or similar metallic strips utilizing filtered cathodic arc plasma generated by vaporizing graphite. It is noted that coating thickness in these processes is limited to below 20 µm. Such coatings are used for a wide range of applications: surface engineered medical instruments, cutting and forming tools, protective-decorative, to name a few. Unfortunately these coatings are too thin for application as a protective erosion and corrosion resistive coatings for protective shields of the helicopter rotor blades. In addition these coatings do not have high enough reflectivity to reduce the heat ingested from sun's radiation.

The grain size of deposits obtained in conventional physical vapor deposition (PVD) methods such as cathodic plasma arc, magnetron sputtering or electron beam PVD (EB-PVD) as well as CVD methods may range between 0.5 to 10 µm. Any post-deposition heat treatment which may be required to maintain corrosion resistance of the substrate, may lead to internal stresses in the coating due to differences in the grain size, and can eventually lead to abrasion, spalling, crack formation, grain separation, surface fractures, uneven edges and rough surfaces, and the like, which can drastically reduce the wear resistance and durability of coated objects. None of the above discussed methods are concerned with even grain size and surface structure, and low micro-roughness of the vapor deposited hard, ceramic coatings. Another disadvantage of the above mentioned conventional PVD and CVD technologies is that they are producing the hard, but brittle coatings which have very limited ductility, unable for bending without developing a large cracks, fracturing and delaminations. This makes these coatings non-applicable for such applications as protective shields for the helicopter rotor blades made of thin metal sheets or foils.

Erosion protection coatings for turbomachinery components such as turbine engine compressor blades, vanes, rotor blades and turbine discs are deposited mostly by thermal spray, CVD and PVD methods including cathodic arc evaporation, electron beam evaporation and magnetron sputtering. Thermal spray methods are producing large surface roughness as well as voids and porosity in coating layers detrimental to erosion and corrosion protection, while PVD and CVD methods are known to produce denser coatings having smoother surfaces. Specifically, the TiN erosion resistant coatings and MCrAlY environmental and bond coatings deposited by conventional direct cathodic arc deposition process (without filtration of macroparticles) are reported, for instance, in US Patent Application No. 2004/0126492 by Weaver et al., and described in "Ti—N multilayer systems for compressor airfoil sand erosion protection," A. Feuerstein, et al., Surface & Coatings Technology 204 (2009) 1092-1096. Cathodic arc deposition process produces large flux of metal vapor plasma featuring metal ions with energies exceeding 40 eV for most of the metal targets, but as a drawback it also generates large amount of microparticles having diameters ranging from nanoparticles to more than 10 μm. As a result, cathodic arc coatings incorporate a large number of macroparticles emitted by the arc cathode target creating a rough surface morphology comprising a large density of isolated bumps and other surface defects which protrude above the surface at 10 to 20 μm and more. The same is true for commercial ultra-thick magnetron sputtering coatings described, for instance, in "Deposition of thick nitrides and carbonitrides for sand erosion protection," R. Wei et al., Surface & Coatings Technology 201 (2006) 4453-4459, consisting of a noddle-like defects protruding across the coating as a result of the deposition of metal sputtering atoms with very low kinetic energy, typically less than 5 eV and extremely low ionization of metal sputtering flow typically less than 0.1%. Sputtering metal atoms carrying low energy, not exceeding the inter-atomic bonding energy of the substrate atomic lattice, form a network of surface adatoms not having enough energy for surface diffusion, which can adjust the surface energy and smooth unevenness of the growing film. CVD and E-beam evaporating coatings feature large columnar structure resulting in a surface roughness comparable to the width of the columns of about 100 um. These processes require high substrate temperatures, typically above 900 deg C., resulting in a dramatic increase of surface roughness by thermal surface grooving.

In U.S. Pat. No. 6,617,057 issued to Gorokhovsky, a multilayer cermet coating is described which employs alternating metal and ceramic layer. This coating architecture provides high hardness and at the same time secures a necessary elasticity and ductility so the brittle hard ceramic layer will not fail due to bending and deformation of the substrates while a tool is in operation. Using multilayer coating architecture for erosion resistant coatings used for turbomachinery components has been described in U.S. Pat. No. 5,656,364 to Rickerby et al., which is incorporated herein by reference. Using the advanced filtered cathodic arc technology to create the multilayer coating eliminates the problems of surface roughness, produces coatings with extremely low density of growing defects, voids and porosity. This coating was successfully applied to the metal foils for their primary usage as erosion and corrosion protective-decorative coating for exterior architectural parts which is described in "Vacuum Cermet Coatings on Coiled Materials," V. Gorokhovsky, Proceedings of the Fourth International Conference on Vacuum Web Coating, (ed. by R. Bakish), Reno, Nev., 1990. The disadvantage of this type of coating is its limited thickness range, which makes it non-applicable as erosion and corrosion resistive coatings for the protective shields of helicopter rotor blades.

There is a need for a method which can provide a fine grained, hard wearing ceramic surface that has low microroughness, low defect density, and the ability to withstand post-deposition heat treatment, if necessary, without detriment and degradation of the coating while securing high flexibility at a coating thicknesses exceeding 20 μm, and having high erosion and corrosion resistance properties as well as high reflectivity of the sun's radiation.

All patents, patent applications, provisional patent applications and publications referred to or cited herein, are incorporated by reference in their entirety to the extent they are not inconsistent with the teachings of the specification.

BRIEF SUMMARY OF THE INVENTION

A hard wearing ceramic surface provides high flexibility when the coating thickness exceeds 5 μm yet, has high erosion and corrosion resistance properties as well as anti-icing properties and high reflectivity of the sun's radiation. The coating has either monolithic or multilayer architecture consisting of alternating metal layers and ceramic layers. Sublayer thickness and coarseness vary among the layers across the multiple layers so the coating remains flexible against the thin metal substrate that is a sheath for protecting helicopter rotorblades or airfoil yet presents a tough outer surface that is resistant to erosion and corrosion.

In an embodiment, an erosion and corrosion resistant protective coating for turbomachinery application includes at least one coating segment deposited on surface of a conductive metal substrate subjected to a pre-deposition treatment by at least blasting to provide the surface with texture. Each of the at least one coating segment is ceramic or metal-ceramic and has thickness of at least about 5 μm and hardness in range between about 0.3 GPa and about 80 GPa. The erosion and corrosion resistant coating has surface roughness characterized by Ra<1 μm, and a plurality of dome-like structures with dome width between about 0.01 μm and about 30 μm. The at least one coating segment is formed by condensation of ion bombardment from a metal-gaseous plasma flow, wherein, at least during deposition of first micron of the coating segment, deposition rate of metal ions is at least 3 μm/hr and kinetic energy of deposited metal ions exceeds 5 eV.

In an embodiment, an erosion and corrosion resistant protective coating for turbomachinery applications includes at least one ceramic or metal-ceramic coating segment deposited on surface of a conductive metal substrate subjected to a pre-deposition treatment by at least blasting to provide the surface of the conductive metal substrate with texture. Each coating segment is formed by concurrent condensation of ion bombardment from metal-gaseous plasma flow and at least 95% ionized metal atoms, wherein, at least during deposition of first micron of the coating segment, deposition rate of metal ions is at least 3 μm/hr while kinetic energy of metal ions exceeds at least 5 eV., each coating segment having thickness of at least about 5

μm. The erosion and corrosion resistant protective coating has an array of dome-like surface structures with a dome width of about 0.01 μm to about 30 μm.

In an embodiment, an erosion and corrosion resistant protective coating for turbomachinery applications includes at least one coating segment, each being ceramic or metal-ceramic and having thickness of at least about 5 μm and hardness in range between about 0.3 GPa and about 80 GPa. The erosion and corrosion resistant coating has roughness characterized by Ra<1 μm, and dome-like structures with dome width between about 0.01 μm and about 30 μm

BRIEF DESCRIPTION OF THE SEVERAL VIEWS OF THE DRAWINGS

FIG. 2a is a schematic illustration of an exemplary coating composition showing a multilayer Me/MeN coating architecture.

FIG. 2b is a graph showing exemplary distribution across TiAlN coating with modulated aluminum content.

FIG. 4 is a schematic diagram of a cross sectional view of one exemplary protector for helicopter rotorblades including a cold spray metallic interlayer.

FIGS. 13A-C show mechanical properties of one exemplary sub-stoichiometric monolithic TiN coating vs, nitrogen flowrate during LAFAD coating process.

FIG. 21 shows mechanical properties of exemplary one-segment and two-segments coatings subjected to erosion testing based on E50TF121 test protocol.

FIG. 22 shows erosion performance of exemplary coatings subjected to 20° angle of impact by by Arizona Test Dust grade A4 Coarse.

FIG. 23 shows erosion performance of exemplary coatings subjected to 90° angle of impact by by Arizona Test Dust grade A4 Coarse.

FIG. 24 is a summary of tests per E50TF121 Test Protocol of exemplary coatings subjected to 90° angle of impact by 50 um Al2O3.

FIG. 26 are SEM micro-images of the cross-section of 1-segment Ti/TiN micro-nano-laminated coating, of K-type deposited on airfoil made of 17-4PH steel: (a) cross section near trailing edge of the airfoil and (b) cross section near leading edge of the airfoil.

FIG. 27 is schematic cross-section of mining pick with ultra-thick TiN coating.

DETAILED DESCRIPTION OF THE INVENTION

Figure 1:
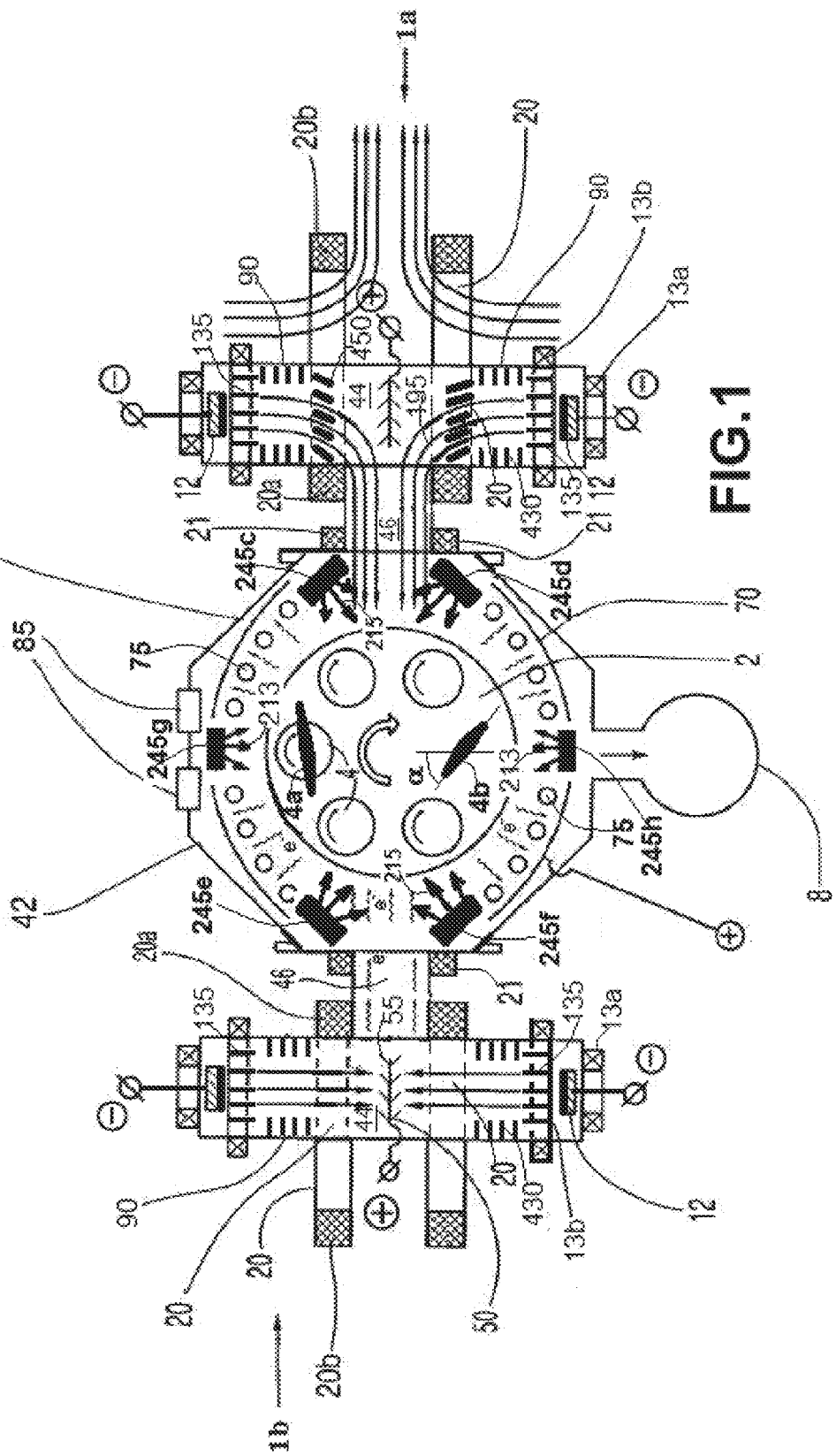
FIG. 1 is an illustrative plan view of the LAFAD coating system equipped with two LAFAD unidirectional dual large area filtered arc sources and optional magnetron sputtering sources, according to an embodiment.

For the sake of clarity, definition of what is understood by some of the terminology used in the discussion of the preferred embodiments of the present invention is provided below.

"Substrate" is understood to mean a three dimensional body providing the surface on which the vapor species is deposited. Only a portion of the surface, usually the surface in the proximity of one end of the substrate body, is utilized as the depositing surface, and the other end of the body of the substrate is attached to, or is supported by, a substrate mount or holder. It is preferred that the portion of the surface on which the deposit is to be obtained, has close to uniform temperature, while the rest of the substrate may be in a temperature gradient.

"Plasma" is considered to mean an atmosphere of low pressure and high temperature, containing a mixture of ionized gases and metal vapor. Not all the gases in the plasma are ionized, but it is usual that the species to be deposited are ionized. The components of plasma often include argon or similar inert gases, both in the atomic state and in an ionized state.

"Even surface" in the context of a deposited layer surface is understood to mean that the average distance between the peaks of the deposited surface and the valleys of the deposited surface, is small. In other words, the micro-roughness of an evenly deposited surface is considered to be low.

In one embodiment of the present invention, multiple layers of a controlled thickness of a metal and of a hard-wearing ceramic compound of the same metal, are deposited in successive steps on a conductive substrate surface, usually stainless steel or titanium alloy. It is preferred that at least two pairs of the metal layer and the hard-wearing ceramic layer are deposited on the steel substrate. The number of layer pairs constituting the coating however may range from 2 to as high as 100 s, depending on the desired coating thickness, and on economic considerations. Several different coating deposition processes either associated with physical vapor deposition (PVD) or chemical vapor deposition (CVD) or hybrid PVD+CVD technology can be used for deposition of the coating of the subject invention. Protective or functional thin coatings on protectors of helicopter rotorblades and other turbomachinery components such as compressor blades for the turbine engines are applied to improve sand and rain erosion resistance, durability, dampening of vibration, to secure mechanical stability of the component and to avoid part deformation. In the case of helicopter rotorblades the protective coating must also have high surface reflectivity. Conventional CVD technology requires high temperature for decomposition of metal-organic, halide or hydrocarbon based precursors, which makes its applications restricted to high temperature substrates. Using low pressure plasma assisted CVD processes (PACVD) allows for reduced substrate temperatures during the coating deposition stage, but is still restricted to a limited number of elemental compositions and coating architectures. PVD processes such as magnetron sputtering and electron beam evaporation are widely used for coating deposition on cutting tools. Electron beam PVD technology (EBPVD) can provide a theoretically unlimited evaporation rate of a wide variety of different materials: metals, ceramics, cermets, both conductive and dielectric materials, but the ionization rate of the EBPVD metal vapor flow is extremely low (<0.1%) which require ion beam assistance to achieve dense coatings with acceptable adhesion and fine microstructure.

Sputtered multilayer coating stacks using multiple sources within the same system, are used routinely for industrial manufacturing on any substrate that can handle vacuum and plasma exposure. To reduce cross contamination from one source to another, either zoned vessels or other means to isolate a source from adjacent neighbors are common. Sputtering in conjunction with a reactive gas can yield a myriad of coatings with a wide variety of elemental compositions and architectures. Matrix sputter source structures using 2 or more targets parts are possible that yield various composition combinations simultaneously. The magnetron sputtering process is capable of generating an atomized vapor flow from targets having low electrical conductivity. Using a split target of graphite or boron carbide with a metal segment made of molybdenum, titanium or other transition metals allows for deposition of Me doped diamond-like and boron carbide based coatings. Co-sputtering (2 sources with different targets on each) yield variability of composition over the course of a given process. By having various targets adjacent or oriented at roughly 45° and varying the power to each source separately it is possible to yield not only different thickness but also different % composition within a thin film. The primary issues with sputtering are low ionization rate and necessity of using large concentrations of argon as a sputtering gas.

Low ionization rates on the order of 1-3% in magnetron sputtering flows reduce the intensity of ion bombardment assistance during coating deposition processes resulting in coarse coating morphology with large density of growth defects and fair adhesion. To improve coating structure, adhesion toughness, and functional properties, a number of different processes were introduced. Unbalanced magnetron methods are successful in attaining higher ionization (up to 10-15%) in comparison to conventional magnetron sources but it is still too low for substantial improvement of coating density and adhesion. Using recently introduced pulse magnetron sputtering technology allows further increases in the ionization rate, but the drawback of this approach is the reduction in the coating deposition rate (productivity). Large pulses can also generate an increased amount of macroparticles increasing the density of surface defects. The cathodic arc deposition (CAD) technology can evaporate electrically conductive (metal like) targets and produce more than 90% ionized metal vapor, typically a nearly 100% ionized (for example at least 95% or at least 98% ionized) vapor plasma with kinetic energy of ions ranging from 40 to 200 eV and it does not require sputtering gas, but it suffers from large amount of macroparticles generated along with vapor plasma from cathodic arc spots located at the cathode target surface. This setback of the conventional CAD technology is overcome by filtered cathodic arc processes, which effectively eliminate the macroparticles and yield up to 90% ionized and atomized metal vapor flow, typically nearly 100% ionized (for example at least 95% or at least 98% ionized) and atomized metal vapor flow. This filtration can occur by means of mechanical shutters in the direct path of the plasma to the substrate materials. The filtration can also be accomplished by bending the plasma flow in one or more bends using magnetic steering coils. In the following, a brief and simplified description of this technology will be provided, however, it should be understood that this is given merely to allow clarification of the process parameters and is not intended as an accurate scientific description of the mechanisms involved in filtered cathodic arc technology. In cathodic arc technology, metal droplets and metal are generated by applying an arc of high current to a negatively charged target metal in a vacuum chamber. At the same time, high concentrations of electrons are also released from the target metal cathode at high speed. The vacuum chamber, by definition, contains a gas at a low pressure, and the gas is typically fed to the chamber as a plasma containing a gas or a gas mixture at high temperature in a partially ionized state. The high speed electrons collide with the gas molecules, thereby further ionizing the gas molecules, which in turn collide with and ionize the metal droplets and metal vapor. The ionized gas and the ionized metal vapor and metal droplets proceed towards the negatively charged substrate also located in the vacuum chamber. The metal deposits in a layer over the surface of the substrate. When the gas is an inert gas no reaction takes place between the ionized gas and metal vapor. On the other hand, in the instance of the plasma also containing reactive gases, the ionized gases will react with the metal vapor, forming a deposited ceramic compound layer. In conventional cathodic arc plasma deposition the vaporized metal droplets in the plasma can vary in size, thus the metal or the ceramic compound deposited on the substrate is likely to exhibit widely varying grain sizes and surface unevenness.

In a recent modification of plasma technology, deposits are obtained by filtering a cathodic arc source by means of appropriately adjusted magnetic fields. An example of such a cathodic arc plasma coating apparatus is described in U.S.

Pat. No. 5,435,900 issued to V. I. Gorokhovsky, which is incorporated herein by reference. This design also incorporates the advanced hybrid filtered arc-magnetron sputtering deposition coating and surface treatment system described in D. G. Bhat, V. I. Gorokhovsky, R. Bhattacharya, R. Shivpuri, K. Kulkarni, "Development of a Coating for Wear and Cracking Prevention in Die-Casting Dies by the Filtered Cathodic Arc Process," in Transactions of the North American Die Casting Association, 20th International Die Casting Congress and Exposition, Cleveland, Ohio, November 1999, pp. 391-399, the entire disclosures of which are hereby incorporated by reference and also presented in the source and method of controlling vapor plasma flow taught by U.S. Pat. No. 9,257,263 to Gorokhovsky which is incorporated by reference. The universal surface engineering system which includes two large area dual filtered arc depositing (LAFAD) plasma sources, which can be used in practicing the present invention, is shown schematically in FIG. 1. FIG. 1 illustrates one exemplary hybrid filtered arc-magnetron sputtering deposition apparatus 360 including magnetrons in coating chamber 42. In deposition apparatus 360, two filtered cathodic arc sources, 1a and 1b, are provided on opposite sides of coating chamber 42. Each filtered arc source contains (a) a pair of cathode targets 12, positioned at the entrance of opposite cathode chambers 90, (b) magnetic steering coils 13a located upstream of cathode target 12, (c) focusing coil 13b located downstream of the cathode target 12, (d) deflecting coil 20 located at the entrance of plasma duct deflection section 44, (e) and focusing coil 21 surrounding exit tunnel section 46 of the plasma duct. Deflecting coil 20 includes (a) linear deflecting conductor 20a adjacent to cathode chamber 90 and to plasma duct 44 proximate to the wall of cathode chamber 90 that faces coating chamber 42 and (b) closing conductor 20b positioned distant from the wall of the cathode chamber 90 that faces away from the coating chamber 42. Metal droplets of larger size and most of the non-ionized neutral species are trapped on the baffles 430, positioned on walls of cathode chambers not occupied with plasma sources and baffles 55 positioned on anode-separator plate 50 as well as along the walls of the plasma duct (not shown). In a refinement, the stream baffles 450 can be added to the hybrid magnetron-filtered cathodic arc source design of FIG. 1 (shown in filtered-arc source 1a).

Generally, the stream baffles can be positioned anywhere between the cathode 12 in a cathode chamber 90 and the exit of the tunnel portion 46 of the plasma duct 44. For instance, the stream baffles 135 can be installed in front of the cathode 12 in cathode chamber 90, typically spaced from the cathode target surface at the distance of 1 cm to 10 cm where they can also serve as additional anode to improve the stability of cathodic arc spots on cathode target 12 and therefore reduce the probability of extinguishing the vacuum arc discharge. The baffles 135 installed in front of the cathode target 12 may have a positive potential in reference to the cathode 12 or be insulated and have a floating potential. When the baffles 135 are installed too close to the cathode target 12 surface (e.g. less than 1 cm) it can result in extinguishing of the arc spots and overheating the baffles. When the baffles 135 are installed at the distance greater than 10 cm from the cathode target 12 surface, their influence on arc spot steering and sustainability of the vacuum arc process is found to be negligible. The preferable position of the stream baffles will be in locations where the magnetic field force lines are bending. In this case the stream baffles will be declined in relation to the axes and walls of the cathode chamber 90 and/or plasma duct 44 and will trap the macroparticles, neutral particles and heavy ions more effectively. For instance the stream baffles 450 can be positioned at the entrance of the plasma duct 44 adjacent to the cathode chamber 90 and the plasma duct 44 as illustrated in FIG. 1. Alternatively, the stream baffles 450 can be positioned at the entrance to the tunnel portion 46 of the plasma duct 44. The axes of the stream baffles 450 can be aligned either parallel or transverse to the direction of the plasma flow, but the surface of the stream baffles 450 has to be aligned as close as possible to the direction parallel (tangential) to the direction of the plasma flow at the site of location of the stream baffles 450 so that the plasma flow streamlines will not cross the surface of the stream baffles 450. The best orientation of the stream baffles 450 is tangential to the direction of the plasma flow at the location of the stream baffles 450. The closest approximation to this ideal orientation is to align the steam baffles 450 parallel (tangential) to the external magnetic deflecting and/or focusing force lines at the location of each given stream baffle 450. In this case, the axes of the stream baffles 450 can be aligned either parallel or perpendicular to the external deflecting and/or focusing magnetic force lines. The easiest way to setup the orientation of the stream baffles 450 is to align them parallel (tangential) to the direction of the magnetic force lines at the location of the stream baffles 450, such that the baffles 450 are oriented generally tangential to magnetic field force lines at the point of each of the respective locations of the baffles 450. If stream baffles 450 are made of metal strips and are parallel (tangential) to the direction of the magnetic force lines and electrically isolated, stream baffles 450 will be charged positively due to the much larger mobility of heavy ions across the magnetic force lines compared to magnetized electrons. The orientation of the stream baffles 450 in a direction tangential to the magnetic force lines can be achieved by individual control of the position of each stream baffle 450 by suitable mechanical means. Alternatively, stream baffles 450 or at least a portion of them can be made of magnetic alloy, which force them to be positioned along the magnetic force line of the deflecting and/or focusing magnetic field of the filtered arc source. Stream baffles 450 aligned along the magnetic force lines provide optimized conditions for metal ion transport through the series of stream baffles 450 while at the same time dramatically increasing the efficiency of removing the macroparticles from the metal vapor plasma stream enhancing the effect of the wall baffles 430 which are installed on all walls not occupied by arc sources both in cathode chamber 90 and in plasma duct chamber 44.

Deposition apparatus 360 may be used for plasma immersed treatment of substrates 4 installed at the satellite substrate holders of the rotary substrate holding table 2, by selectively deactivating deflecting coils 20 and focusing coil 21 of filtered cathodic arc source 1b on one side of the coating chamber 42. When all plasma sources associated with cathode targets 12 are active, metal vapor plasma streams are generated in both filtered cathodic arc sources 1a and 1b. However, while the metal vapor plasma stream generated on the side of active coils 20 and 21 of the filtered cathodic arc source 1a is directed toward the coating chamber 42 by deflecting and focusing magnetic fields generated by deflecting coils 20 and focusing coils 21, the metal vapor plasma component of the plasma stream on the side of the inactive deflective coil 20 and focusing coil 21 of the other filtered cathodic arc source 1b remains largely confined within the cathode chambers 90. This selective deactivation of deflecting coils 20 and focusing coil 21 of filtered cathodic arc source 1b represents a magnetic shutter mode that cuts off the metal vapor plasma output of the filtered cathodic arc source 1b from the coating chamber 42 since there is no magnetic driving influence for metal vapor plasma on that side of coating chamber 42. The cathodes 12 on the side of the inactive coils 20 and 21 thus serve as powerful electron emitters for remote arc discharges between cathode targets 12 and remote anode 70 in coating chamber 42. This remote arc discharge improves ionization of the gaseous component of the plasma flowing past the exit tunnel section 46 and into coating chamber 42, and significantly improves the properties of the resulting coating.

In an embodiment, coating chamber 42 includes radiation heater 75. An electrostatic probe for measuring plasma density and IR pyrometer for measuring substrate temperature during coating deposition process may be installed to flanges 85 at coating chamber 42. Substrates 4 are installed at the satellites of the rotational substrate holding turntable 2 optionally with ability of double rotating (e.g. that substrates 4 can be rotating simultaneously around the axis of the turntable 2 and around the axis of the satellites installed above the turntable 2), connected to the bias power supply (not shown) for negatively biasing substrates to be coated during coating deposition process. As an example, the airfoils 4a and 4b are installed at the rotational turntable 2. As an example, the airfoils are shown as substrates to be installed at the turntable 2 either with ability of double rotation as for example shown in FIG. 1 for airfoil 4a or at acute angle ranging from 30 to 75 deg to the radius of turntable 2 as for example shown in FIG. 1 for airfoils 4b.

The deposition apparatus 360 optionally includes two magnetron sputtering sources 245g and 245h attached to opposing side walls of coating chamber 42 not occupied by filtered arc sources, said magnetron sputtering sources are magnetically coupled to the at least one of the unidirectional filtered cathodic arc metal vapor plasma sources 1a and 1b. In this design, the substrates to be coated 4 installed on turntable 2 are alternatingly subjected to vapor plasma flow 195 generated by the filtered arc source and metal atomic sputtering flow 213 generated by the magnetron sputtering source. Any given individual substrate 4 is not simultaneously subjected to both vapor plasma flow 195 and metal atomic sputtering flow 213 resulting in nano-laminated coating architecture with filtered vapor plasma layers followed by magnetron sputtering layers.

In addition, deposition apparatus 360 optionally includes two pairs of magnetron sputtering sources, including magnetrons 245c, 245d, 245e, and 245f installed in coating chamber 42 at the exit of tunnel portion 46 of each opposite dual filtered cathodic arc sources 1a and 1b. Each of magnetrons 245c,d,e and f is magnetically coupled with the focusing magnetic field generated by the focusing coil 21 at the exit of the tunnel portion of the filtered arc source. Magnetron sources 245c and 245d are magnetically coupled with dual filtered cathodic arc source 1a while the pair of magnetron sources 245e and 245f is magnetically coupled with rectangular dual filtered cathodic arc source 1b. As shown in FIG. 1, the metal atomic sputtering flows 215 generated by the pair of magnetron sources 245c and 245d coincides with the metal vapor plasma flow generating by the adjacent dual filtered cathodic arc source 1a having its deflected magnetic coils activated (when the magnetic shutter is open). At the opposite side of coating chamber 42, the metal atomic sputtering flows 215 generating by the pair of magnetron sources 245e and 245f coincides with the electron current of the remote arc discharge generated by the adjacent dual filtered cathodic arc source 1b having its deflected magnetic coils not activated (when the magnetic shutter is closed). In both cases the magnetron sputtering deposition process is enhanced either by metal ion flux or by electron flow resulting in improved density and other functional properties of the coatings.

This arrangement creates a highly ionized gaseous environment during all stages of the process: ion cleaning, ionitriding and deposition of coating layers. Metal vapor plasma flow can be effectively interrupted by using the LAFAD deflecting magnetic field as a magnetic shutter. In a pulse filtering mode magnetic deflecting coils are periodically turning on and off. This allows creating a multilayer and/or modulated coating composition with a wide range of the sizes of sublayers. The metal vapor plasma 195, generated by the filtered arc source, consists of nearly 100% ionized metal vapor (for example at least 95% or at least 98% ionized metal vapor). When the flow of metal ions 195 is co-directionally mixed with nearly neutral flow of sputtering atoms 215 generated by coincided magnetrons 245c, d,e and f, the ionization of the resulting co-directional metal vapor plasma flow can be controlled within the range of the ratio $\gamma_i$=(metal ions/(metal ions+metal atoms) from 0 (fully neutral metal atoms flux, when metal ion flux is nearly 0) to 1 (fully ionized metal vapor plasma, when sputtering atoms flux is nearly 0). It can be achieved by adjusting the arc currents in primary cathodic arc sources of the filtered arc source as well as adjusting the power of the magnetron sputtering source. Fully ionized metal plasma flow is generated when the magnetron sources are turned off, while filtered arc source is turned on. Nearly neutral flow of metal atoms is generated when filtered arc source is either turned off or the magnetic shutter is closed, blocking the exit of the metal vapor plasma toward coating chamber, while magnetron sputtering sources are turned on.

This technology is capable of producing a wide variety of coating architectures and structures. For example, by periodically turning OFF and ON the nitrogen supply line it is possible to deposit multilayer coatings with a sequence of ceramic (such as TiN) and metallic sublayers having thicknesses ranging from 50 nm to 1000 nm. Alternatively, by turning ON and OFF a magnetic deflecting coil with repetition frequencies typically ranging from 0.1-1000 Hz (magnetic shutter mode), the filtered cathodic arc vapor plasma flow generated by the filtered cathodic arc source can be periodically SHUT OFF and SHUT ON which can provide a periodical change in ion bombardment rate by metal ions (Ti) of growing magnetron sputtering TiN films. The filtered arc source may generate the metal vapor plasma flow in magnetic shutter mode simultaneously with continuous deposition of sputtering metal atoms by a magnetron sputtering source to develop a nanostructured coating architecture with sublayers as thin as 1 nm. This generates a periodic multilayer structure of the TiN based coatings with sublayer thicknesses at nanometric scale, which is beneficial for the coating toughness, erosion and corrosion protection properties.

In advanced embodiment of the coating process for deposition of erosion and corrosion resistant cermet coatings on turbomachinery component, the deposited coating is either nanocomposite or micro-nano-laminated. The coating system shown in FIG. 1 is used for this process. While this process may be used both for production of nanocomposite coatings and for production of micro/nano-laminated coatings, the following discussion pertains to micro/nano-laminated coatings. The micro/nano-laminated coating architecture is built by a sequence of metal-ceramic pairs comprising of the metal layers followed by ceramic layers. The arc cathode targets, magnetron targets and plasma assisted chemical vapor deposition (PACVD) reactive gaseous precursors are selected for the plasma vapor generation as they are capable of forming hard, wear resistant, and erosion and corrosion resistant compounds by gaseous-metal plasma vapor deposition. The metallic and non-metallic elements which are preferred in such compound formation include titanium, chromium, vanadium, molybdenum, aluminum, hafnium, zirconium, niobium, tungsten, their alloys, carbon, boron, silicon, and elements of similar nature. The preferred reaction gaseous precursors are nitrogen, hydrogen, oxygen, hydro-carbon gases, borazin, boron trichloride, trimethylsilane (3MS) and gases of similar nature. During deposition of such a coating, the gas atmosphere in the cathodic arc depositing device is controlled such that it can yield either a vapor deposited metal layer or a vapor deposited ceramic compound layer. The ceramic compounds that have desired wear resistance, corrosion resistance and hardness include the carbides, nitrides, carbonitrides, oxicarbides, oxinitrides, borides, silicates, of the above listed metals. The plasma for depositing the desired ceramic layers may contain one or more of the following gases: nitrogen, methane or other hydro-carbon gas, borazine, 3MS (trimethylsilane) and oxygen. Alternatively, doping of non-metallic elements such as silicon and boron may be achieved by using cathodic arc targets and/or magnetron targets containing these elements in addition to the basic metal matrix. In one example of vapor deposition of layers of the above listed metals, the only gas included in the plasma is argon and/or a similar inert gas. Argon may also be utilized to dilute or carry the gases reacting with the metal vapor or metal deposit, to form the desired ceramic-metal compounds. Metal and ceramic compound combinations suitable for forming hard, wear, erosion and corrosion resistant coatings by vapor deposition in the present invention, are listed in Table 1. In addition to the coating compositions presented in Table 1, the carbon based diamond-like coatings with addition of different metals such as Ti, B, Si or Cr doped DLCs having hardness above 30 GPa may be selected preferably for the top segment coating furthest from the substrate.

FIG. 2a shows the multilayer coating architecture consisting of metal sublayers 24', 24" in turn with ceramic sublayers 26', 26" on a metallic substrate 4 similar to that described in U.S. Pat. No. 6,617,057 issued to V. I. Gorokhovsky, which is incorporated herein by reference. This coating architecture can be further improved by reducing the bilayer periods to nanometric size, incorporating nanocomposite cermet structure into ceramic sublayer and modulating the content of selected elements across the coating. One of the ways of making the laminated coating architecture is by modulating the current of one of the primary cathodic arc sources of the LAFAD plasma source resulting in a modulating content of selected elements throughout the coating. Specifically, the bottom segment can have metallic layers with thicknesses ranging from about 0.5 to about 5 μm while the ratio of thicknesses of metal to ceramic sublayers in one bilayer can range from about 0.1 μm to about 0.5 μm. Metallic layer thickness decreases as distance from the substrate increases. The thickness ratio of metal-to ceramic sublayers in each coating bilayer can also decrease shifting the coating properties toward ceramic when the distance from the substrate increases. Alternatively the metal/ceramic composition with variable concentration of non-metallic element such as carbon, boron, silicon or nitrogen can be used to control the hardness, elastic modulus and other mechanical properties of the coating depending on its distance from the substrate. For example the Ti60N40 composition (60% Ti and 40% N) can be deposited at a location interfacing the substrate. As the distance from the substrate increases, the concentration of the nitrogen in a coating increases reaching a stoichiometric Ti50N50 composition at the top end of the coating away from the substrate. A metal rich coating has a ductile metal-like properties providing flexibility and mechanical response to substrate deformation, vibration and reduced coating stress while also improving corrosion resistance of the coatings. The ceramic like composition at the top area of the coating provides erosion and wear resistance properties.

In a preferred embodiment of the invention the coating architecture comprises two or more segments; each segment comprises multilayer metal/ceramic coating. The segments positioned closer to the substrate have thicker metallic interlayers and/or larger metal-to-ceramic thickness ratios. The thickness of each segment is in the range from 20 to 150 μm. In a further embodiment of the invention, the ceramic interlayers having thickness in the range from 5 to 30 μm can be used to separate the neighbor coating segments from each other. These interlayers can serve as corrosion barriers and also work as a membrane to accommodate coating stress in conditions of mechanical deformation and vibration.

To provide protection against sand and rain erosion, the total thickness of the metal-ceramic coating ranges from about 40 to about 300 μm. Thicknesses less than 40 μm do not provide the necessary erosion resistance properties while coatings having thicknesses of metal/ceramic segments in excess of 300 μm are not flexible enough to sustain deformations and vibrations.

FIG. 2b shows an example of a TiAlN coating with a modulated aluminum content, which is deposited by a dual filtered arc LAFAD plasma source with 2 targets: Ti and Al. The modulation of Al content is achieved by modulation of the arc current of the primary cathodic arc source with the Al target. Additionally, this mode can be used for precise thermal management of the substrate in the plasma vapor deposition process by modulating the ion current conveyed from the depositing metal vapor plasma toward the substrate to be coated. It is noted, however, that the apparatus of FIG. 1 is merely an example of a device utilizing magnetic plasma arc filtering. Any other high temperature depositing apparatus which may and may not be fitted with magnetic plasma arc filtering means can be employed in practicing the present invention. The operation pressure of the LAFAD plasma source, which is in the range from $10^{-6}$ torr to $10^{-2}$ torr, overlaps with almost all conventional low pressure PVD and PACVD plasma sources combining filtered arc sources with magnetrons, EBPVD sources and thermal evaporating sources. A hybrid surface engineering system layout was described in U.S. Pat. No. 7,300,559 issued to V. I. Gorokhovsky, which is incorporated herein by reference. This allows a wide variety of coating architectures and compositions to be deposited using evaporation targets composed of different materials as well as different reaction gas precursors in a strongly ionized plasma environment. It is also noted, that the preferred vapor depositing surface engineering system shown in FIG. 1 contains two LAFAD vapor plasma sources, but in processing the erosion resistant coatings, even using one LAFAD source with primary cathode targets made of the same metals or different metals may be sufficient. For example one target can be made of titanium and another of chromium. This results in deposition of TiCr/TiCrN nano-multilayer coatings with Ti and Cr based sublayers having thicknesses at a nanometric scale.

The application of magnetic filtering of the cathodic arc stream eliminates macroparticles, as well as neutral non-ionized species, and thereby substantially only ionized metal vapor will reach the substrate. This results in deposit layers of even grain size, and surfaces having very low microroughness. Such surfaces can be referred to as evenly deposited surfaces.

The substrate selected for deposition in the present process is a conductive material, such as a metal or a hard-wearing substance having relatively high electrical conductivity. It can be chosen from different grades of stainless steels or titanium alloys. In one of the preferred embodiments, the substrate is stainless steel of the ASA300, 400 (such as high chromium 440A, 440B, 440C and 440XH stainless steel) or 1700 series, such as the 17-4 series. In another embodiment it is Ti6Al4V alloy, widely used for manufacturing of turbomachinery components. It is possible that steels or titanium can be doped with other elements as well, such as, for example, silicon. Prior to the coating deposition process, the substrate can be subjected to a dry or wet blasting pre-treatment which has experimentally proved to contribute to better performance in sand and rain erosion protection applications. It was found experimentally that wet blasting or dry blasting pre-treatment increases erosion resistance by an order of magnitude as was presented in Vladimir Gorokhovsky, Chris Bowman, John Wallace, Dave VanVorous, John O'Keefe, Victor Champagne, Marc Pepi, Widen Tabakoff, "LAFAD Hard Ceramic and Cermet Coatings for Erosion and Corrosion Protection of Turbomachinery Components", Proceedings of ASME Turbo Expo 2009: Power for Land, Sea and Air GT2009 Jun. 8-12, 2009, Paper #GT2009-59391, which is incorporated herein by reference. Typically, a pre-deposition treatment by wet blasting, dry blasting, shot peening, laser peening, or combinations thereof as well as other similar methods, produce a substrate surface discrete texture and/or discrete cold work pattern having roughness Ra>100 nm, but not exceeding 5 µm. When the velocity of the blasting media is moderate, the pre-deposition blasting treatment does not change the initial substrate surface roughness, but still, unexpectedly, have effect on developing the dome-shape surface morphology of thick ceramic and metal-ceramic coatings deposited by condensation of energetic metal ions by the LAFAD process or by the hybrid LAFAD-magnetron sputtering process, due to producing discrete pattern of cold work spots resulting from discrete blasting. The cold work spots have different ion sputtering rates which can partially explain this effect.

After texturing the substrate surface by a dry or wet blasting pre-treatment, the substrate surface to be coated has to be cleaned, for example by a standard cleaning processes which may include degreasing, tumbling, grinding, polishing, chemical cleaning, degreasing, electrolytic cleaning, ion bombardment or similar conventional cleaning steps that can render the surface receptive of the deposited substance. The cleaned substrate can optionally be subjected to ion implantation to increase the hardness and corrosion resistance of the substrate surface and possibly further improve adherence of the deposited coating. The ion implantation step may be conducted in a separate apparatus, or the coating system shown on FIG. 1 can be adapted to the plasma immersion ion implantation process step similar to that of the prior art described in U.S. Pat. No. 7,300,559 issued to V. I. Gorokhovsky, which is incorporated herein by reference.

TABLE 1

| Item # | Metal Layer | Ceramic metal compound layer in combination with the metal, having desired wear resistant properties |
|---|---|---|
| 1 | Ti | TiC, TiN, Ti(CN), Ti(OCN) |
| 2 | Zr | ZrC, ZrN, Zr(CN), Zr(OCN) |
| 3 | V | VC, VN, V(CN), V(OCN) |

TABLE 1-continued

| Item # | Metal Layer | Ceramic metal compound layer in combination with the metal, having desired wear resistant properties |
|---|---|---|
| 4 | Cr | CrN, CrC, CrCN |
| 5 | Hf | HfN |
| 6 | Mo | MoN |
| 7 | Nb | NbN, NbC |
| 8 | W | WC |
| 9 | Ti-Zr alloy | TiZrC, TiZrN, TiZr(CN), TiZr(OCN) |
| 10 | Ti-Cr alloy | TiCrC, TiCrN, TiCr(CN) |
| 11 | V-Ti alloy | VTiC, VTiN, VTi(CN) |
| 12 | Ti, Mo | TiMoN |
| 13 | Ti, Al | TiAlN, TiAlON |
| 14 | Ti, Al, Si | TiAlSiN |
| 15 | Ti, Nb | TiNbN |
| 16 | Al | AlN, $Al_2O_3$ |
| 17 | Cr, B | $CrB_2$ |
| 18 | Ti, B | $TiB_2$ |
| 19 | Al, B | $AlB_2$ |

This pre-deposition treatment creates a case on the surface of the substrate to be coated preventing against the egg-shell effect which can reduce performance of thin film hard coatings deposited on a relatively soft substrate. This case is designed to accommodate the plastic deformation of the relatively soft substrate. This case also contains some elements identical to the elements in the first coating layer interfacing the substrate surface which increases adhesion of the coating to the substrate.

The substrate having a cleaned, and optionally ion implanted depositing surface, is then placed in the vacuum chamber of a suitable cathode arc plasma depositing device having at least one plasma vapor deposition means, such as described above. The arc cathode targets, magnetron targets, EBPVD evaporating material, resistive evaporating material and PACVD reactive gaseous precursors are selected for the plasma vapor generation, and are selected as they are capable of forming hard, wear, erosion and corrosion resistant compounds by vapor deposition. The metallic and non-metallic elements which are preferred in such compound formation include titanium, chromium, vanadium, molybdenum, aluminum, hafnium, zirconium, niobium, tungsten, their alloys, carbon, boron, silicon, and elements of similar nature. The preferred reaction gaseous precursor include nitrogen, hydrogen, oxygen, hydro-carbon gases, borazin, boron trichloride, trimethylsilane (3MS) and gases of similar nature.

The gas atmosphere in the cathodic arc depositing device is controlled such that it can yield either a vapor deposited metal layer or a vapor deposited ceramic compound layer. The ceramic compounds that have desired wear resistance, corrosion resistance and hardness are the carbides, nitrides, carbonitrides, oxycarbides and oxynitrides of the above listed metals. The plasma for depositing the desired ceramic layers may contain one or more of the following gases: nitrogen, methane or other hydro-carbon gas, borazin, 3MS and oxygen. In an embodiment of the vapor deposition of layers of the above listed metals, the only gas included in the plasma is argon or a similar inert gas. Argon may also be utilized to dilute or carry the gases reacting with the metal vapor or metal deposit, to form the desired ceramic [metal] compounds. The metal and ceramic compound combinations suitable for forming hard, wear, erosion and corrosion resistant coatings by vapor deposition in the present invention, are listed in Table 1 above. In addition to the coating compositions presented in Table 1, carbon based diamond-like coatings with addition of different metals such as Ti or Cr doped DLCs having hardness above 30 GPa can also be selected preferably for the top segment coating.

Figure 3A:
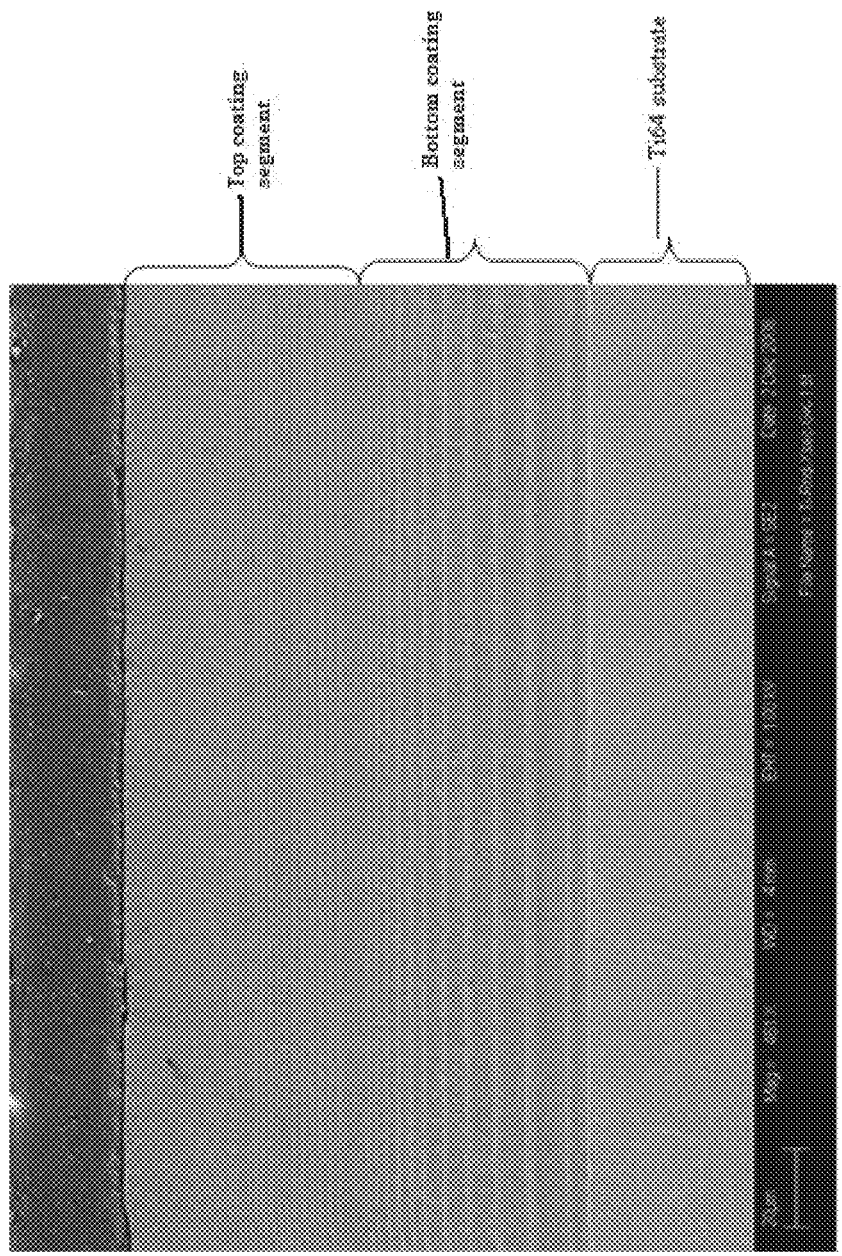
FIG. 3a is a SEM micro-image of the cross-section of one exemplary 2-segment Ti/TiN multilayer multi-segment coating.

When large metal sheets both straight, and pre-formed to the desirable application driven geometry, are used as substrates for the ultra-thick ceramic or cermet coatings, coating deposition results in substantial deformation of the substrates caused by large stresses in the coatings. To reduce or completely eliminate these stresses and associated distortion of the substrate, the coating architecture consists of one or more segments of a multilayer coatings as presented in a present invention. A first approach to such architecture is a multilayer coating design having metal sublayers in turn with ceramic sublayers similar to that described in U.S. Pat. No. 6,617,057 issued to V. I. Gorokhovsky, which is incorporated herein by reference. The mechanical properties in this prior described coating such as hardness and elastic modulus are evenly distributed across the coating. The coating therefore is unable to accommodate the large coating stress and low elastic modulus required when, for example, the thin metal substrate of a helicopter protector is bent and yet at the same time to secure the high hardness associated with brittle ceramic layers. To solve this problem the present invention proposes a change in the multilayer structure along the coating cross section with larger metallic segments incorporated in parts of the coating facing the substrate and more ceramic incorporated in the part of the coating facing toward the top of the coating. FIG. 3a shows a cross-section of one example of such an erosion resistant coating on a substrate. The coating of FIG. 3a has two segments: a bottom segment B with large metallic sublayers, lower hardness and lower elastic modulus overlayed by a top segment T with smaller metallic sublayers, and higher hardness and elastic modulus.

Figure 5:
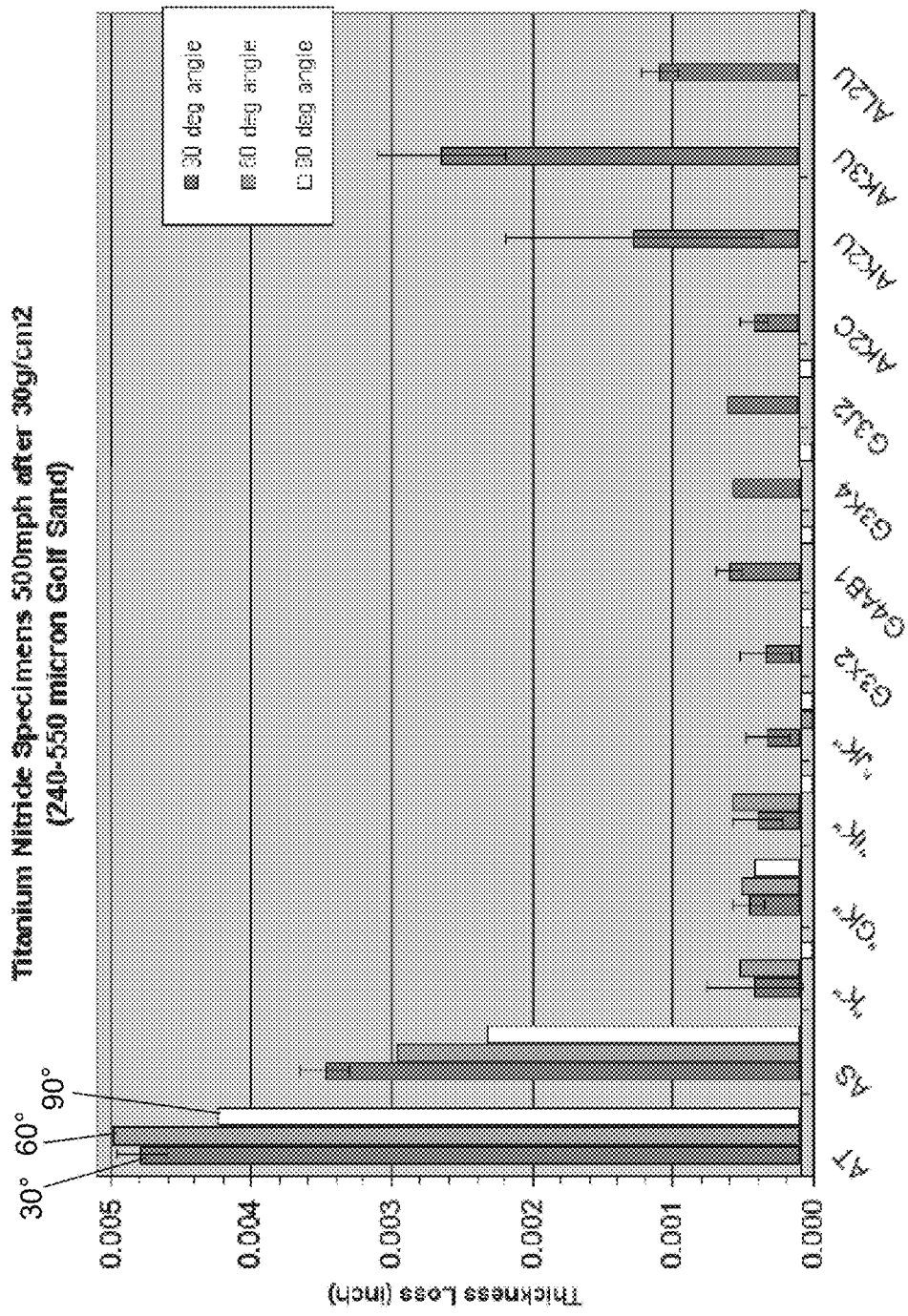
FIG. 5 is a chart representing sand erosion testing results of different TiN coatings deposited by LAFAD process.
Figure 6A:
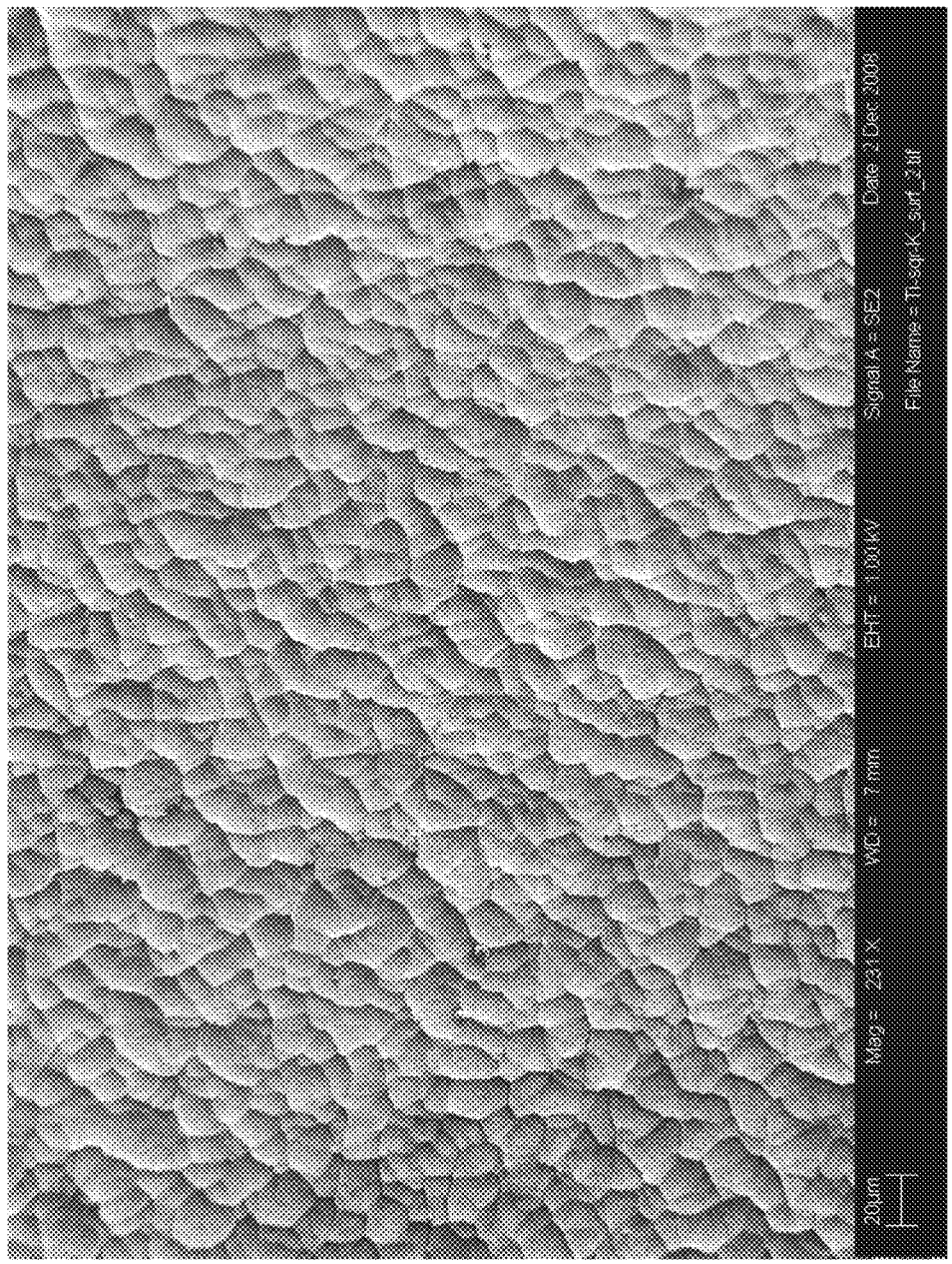
FIGS. 6A and 6B are SEM micrographs of the surface of one exemplary LAFAD thick multilayer coating deposited on a wet blasted titanium substrate.
Figure 6B:
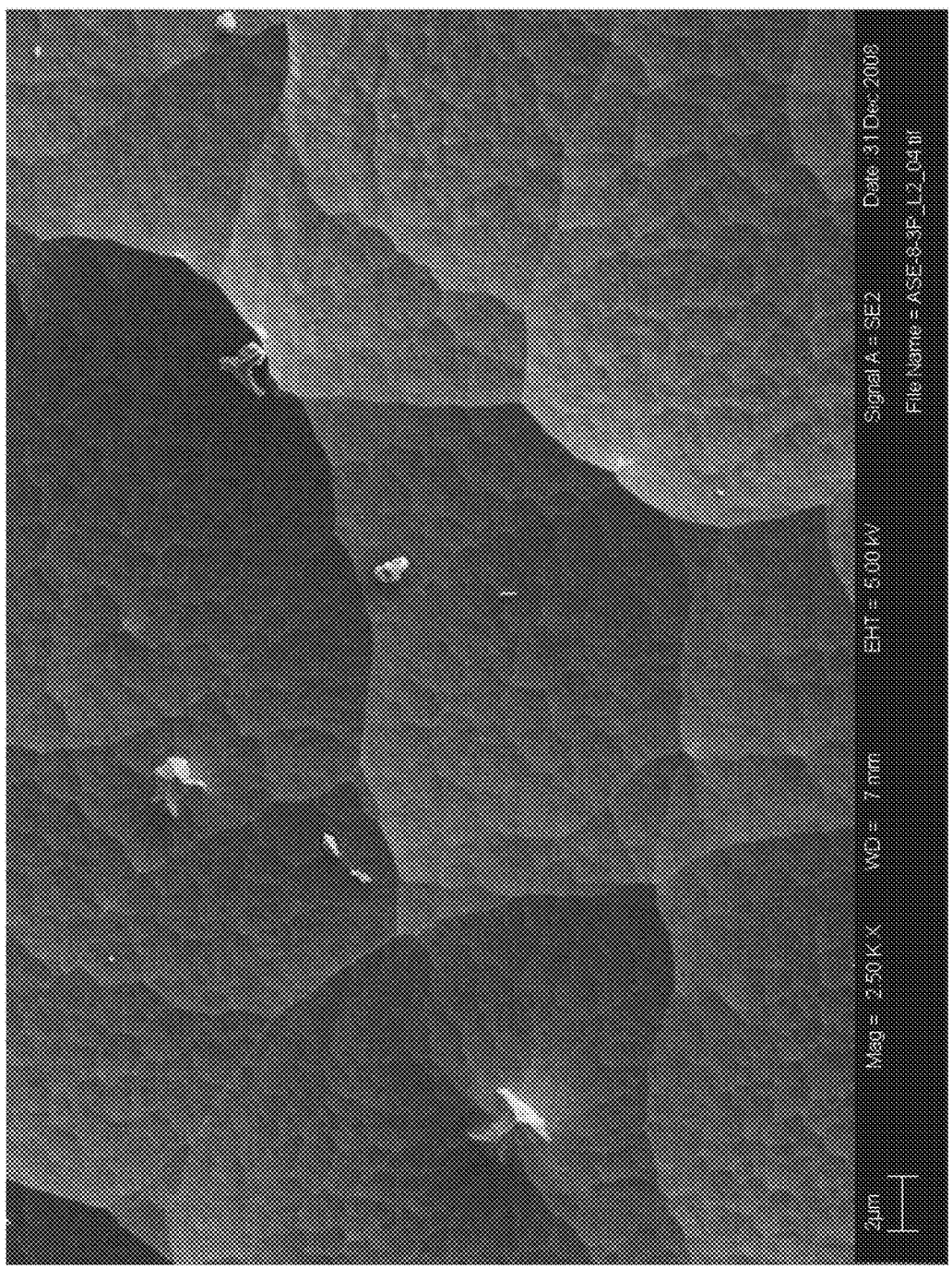

The results of testing for sand erosion resistance of the different duplex and single segment multilayer and monolithic TiN coatings deposited by LAFAD process are shown in FIG. 5. G is microlaminated coating having a thickness of approximately 50 μm. GK, IK and JK are duplex coatings with the bottom segment made either of multilayer G coating or monolithic I and J coatings, all of them about 50 μm thick. K is a nano-multilayer coating approximately 35 um thick. The GK coating cross-section is shown in FIG. 3a. AL2U is a TiAlN 50 μm coating. Letter "A" in coating identification stands for Arcomac Surface Engineering, LLC, of Missoula Mont. where the coating was deposited. The letters "C" and "U" stand for upper and central position of the square samples in a substrate holder during the LAFAD coating deposition trial. Note: (−) thickness loss value denotes coating failure during the test. 300 mph at 90 deg resulted in 0.0002-inch wear for K, GK, IK, JK. The "GK" sample had small pits at 90 deg after 30 g/cm² then was subsequently tested to 60 g/cm² at 500 mph at a 90 deg angle which caused several large through-coating pits exposing the substrate. "GK" 500 mph at 30 deg angle sample was subsequently tested to 60 g/cm², resulting in a net 0.0006-inch total wear. These results demonstrated that the 2-segment GK coating has a superior erosion resistance performance compared to single segment monolithic and multilayer coatings. It also overperforms the IK and JK coatings with a monolithic bottom segment layer. The typical surface morphology of all erosion resistant coatings deposited on dry-blasting or wet blasting pre-treated surfaces have shown a dome-like pattern as illustrated in the SEM microimage in FIG. 6a. The lateral size (the width) of the single dome in this pattern is typically in the range from 1 μm to 30 μm. The SEM micrograph of the coating featuring the dome-like structure with higher magnification is shown in FIG. 6b. It can be seen that the single dome is composed of much smaller domes having width as small as 100 nm, but detailed analysis of the microgram of dome-shaped LAFAD coatings has revealed that the single dome, typically having size in the micrometer range, is usually composed of nano-sized domes as narrow as 10 nm. At the same time, roughness of the surface featuring dome-like morphology does not exceed Ra=1 μm and typically less than 200 nm. It was found that dome-like surface morphology appears at substrates subjected to (a) discrete cold work pre-treatment by wet blasting, dry blasting shot peening, laser peening or their combination and (b) subsequent plasma vapor deposition conditions of intense metal ion bombardment. The intense metal ion bombardment is associated with a deposition rate of metal ions (for example Ti ions in the case of a TiN coating) in excess of 3 μm/hr at least during deposition of the first micron of the coating while the kinetic energy of these metal ions is in the range from 5 eV to 500 eV, most commonly in the range from 20 eV to 500 eV or in the range from 40 eV to 500 eV, depending on the surface bias. For titanium ions having an average charge of 2, these deposition rates and kinetic energies correspond to a metal ion flux exceeding 0.6 mA/cm² for titanium ions having average charge of 2. Metal ion energy less than 5 eV is not sufficient to induce increased surface diffusivity of metal adatoms necessary for formation of the dome-like morphology, while metal ions with energies in excess of 500 V may produce large re-sputtering of the coating surface exceeding the deposition rate. When the substrate surface is subjected to metal ion bombardment with high flux of metal ions carrying high kinetic energy, as is the case for the above stated energy and flux ranges, the adatom mobility across coating surface is mostly defined by the energy and momentum of incoming metal ions and is less reliant on surface thermal diffusivity.

Figure 3B:
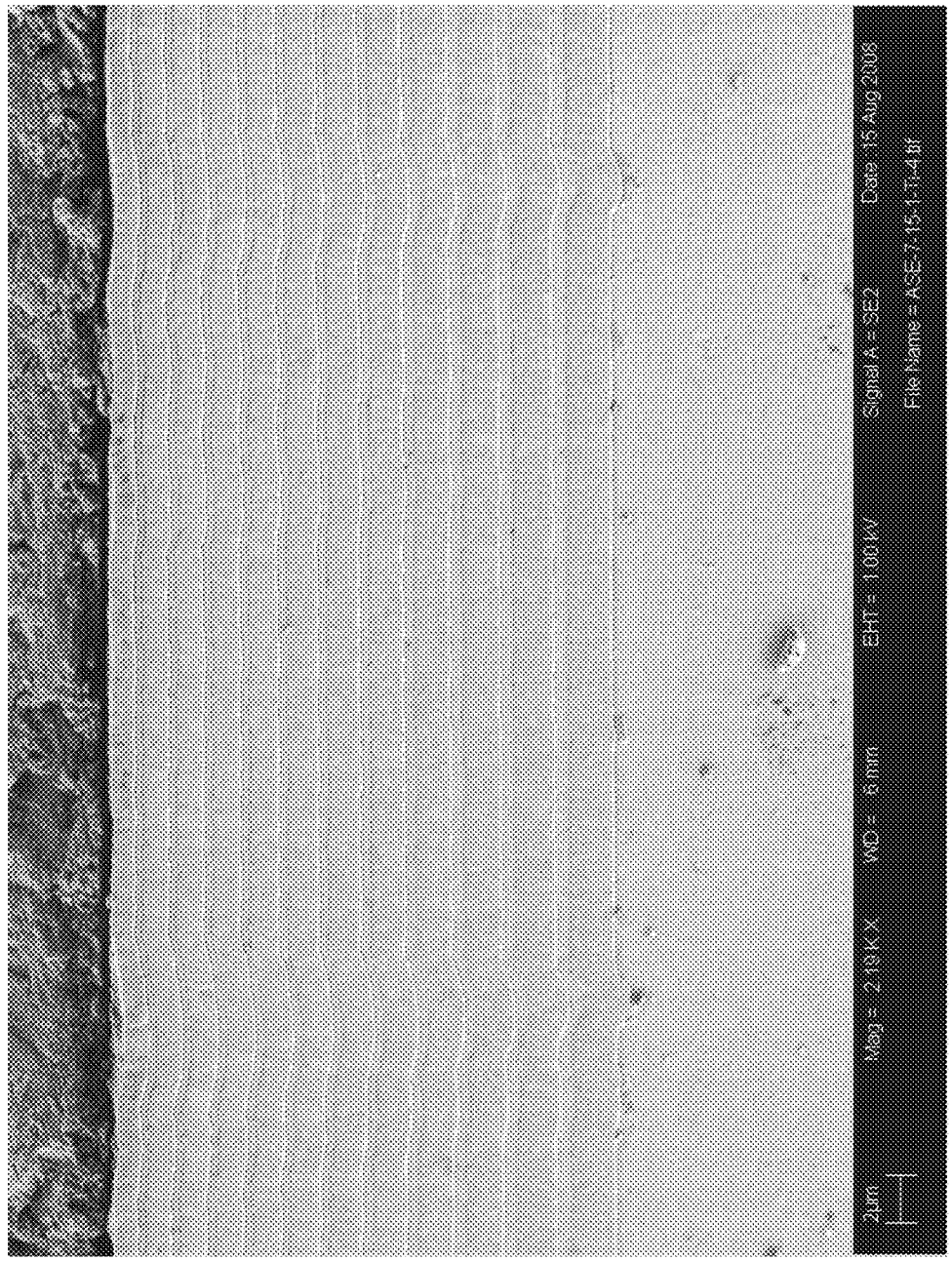
FIG. 3b is a SEM micro-image of the cross-section of one exemplary 1-segment Ti/TiN multilayer coating.

FIG. 3b illustrates the deposition of 1-segment Ti/TiN multilayer coating by one LAFAD dual filtered arc source on substrates installed on a 0.5 m diameter rotary table with rotation speed of 12 RPM during 8 hrs of total deposition time at 150 A arc current per primary cathodic arc source. The deposition time of the Ti sublayer was 300 s, the deposition time of TiN sublayer was 1500 s. The deposition rate was 3 μm/h during deposition of the first micron of the coating while the average deposition rate was 2.15 μm/h. FIG. 3b shows that this coating has a smoothing effect and low stress.

The coatings discussed here in reference to FIGS. 3a and 3b have demonstrated 10× higher erosion resistance compared to similar coatings deposited on a polished surface. When deposited on a polished surface, these coating do not develop the dome pattern that results when depositing the coatings on a pretreated, textured surface as discussed above. It was observed in a number of experimental trials and subsequent testing that the dome-like pattern is necessary to secure high erosion resistance for the coatings. In addition, this type of ceramic and metal ceramic coatings have demonstrated hydrophobic and anti-icing properties due to its chemical and topographical effects as well as high reflectivity of sun's radiation. This unexpected result of creating the dome-shaped coating surface morphology can be obtained by deposition of coatings under conditions of intense metal ion bombardment while the initial substrate surface is subjected to various pre-treatment methods including, but not limited to wet-blasting, dry blasting, shot peening and laser peening, which impose a discrete pattern of cold work on the substrate surface prior to the coating deposition process. When the surface peening or similar pre-deposition treatment imposes a discrete pattern of cold work on substrate surface even without changing the initial roughness of the substrate surface, it is sufficient for developing the coating surface morphology featuring the dome-shaped pattern during coating deposition process under conditions of intense ion bombardment. It may be partially explained by the fact that cold work affects the sputtering rate of materials. A cold work pattern distributed in a discrete manner by shot peening or wet blasting or similar pre-treatment processes results in distribution of a similar pattern of the sputtering rate across the substrate surface, which initiates the developing of a similar discrete distribution of coating surface roughness during the initial stage of the coating deposition process under conditions of intense ion bombardment, thus recreating a pattern similar to that imposed during pre-treatment cold work. Alternatively, powder spray coating such as cold spray, plasma spray, thermal spray or HVOF spray can be deposited as a first coating segment followed by the PVD metal/ceramic multilayer coating. In this case, the dome-like pattern will be also developed by building the PVD coating on a top of the powder coating having a well-shown surface pattern similar to that obtained by dry-blasting or wet blasting pre-treatment. Another unexpected effect, observed in metal, metal-ceramic, and ceramic coatings deposited under conditions of high flux metal ion bombardment, is a decrease of the coating layer roughness (that is, smoothening) of the coating layers with distance from the substrate surface. This decrease is characterized by the surface roughness Ra decreasing with distance of the coating layer from the substrate surface. This effect is clearly demonstrated in ultra-thick coating cross-sections shown in FIGS. 25 and 26. It was found that improved smoothness of the coating is at least in part due to high flux of metal ion bombardment during coating deposition process, such as when the metal ion flux exceeds (a) 0.6 mA/cm$^2$ for titanium ions having average charge of 2 (or, in corresponding deposition rates of TiN coating, 3 µm/hr of metal ion bombardment) during deposition of at least the first micron of the metal or metal-ceramic coating deposited under conditions of intense metal ion bombardment, and (b) 0.2 mA/cm$^2$ (or, in corresponding deposition rates, 1 µm/hr of metal ion bombardment) during deposition of the rest of the coating. At this high flux, the influence of metal ion bombardment on coating smoothening dominates over the conventional smoothening effect due to thermal diffusion of adatoms under conditions of high substrate surface temperature. The maximum metal ion flux during initial stages of deposition of metal ceramic coatings does not exceed 100 mA/cm$^2$. If maximum incoming metal ion flux exceeds 100 mA/cm$^2$, it may overheat and melt the coating and/or substrate 4. At the same time, the average deposition rate of thick ceramic and metal-ceramic coatings deposited by condensation of energetic metal ions generated by LAFAD process typically exceeds 2 µm/hr.

Figure 10:
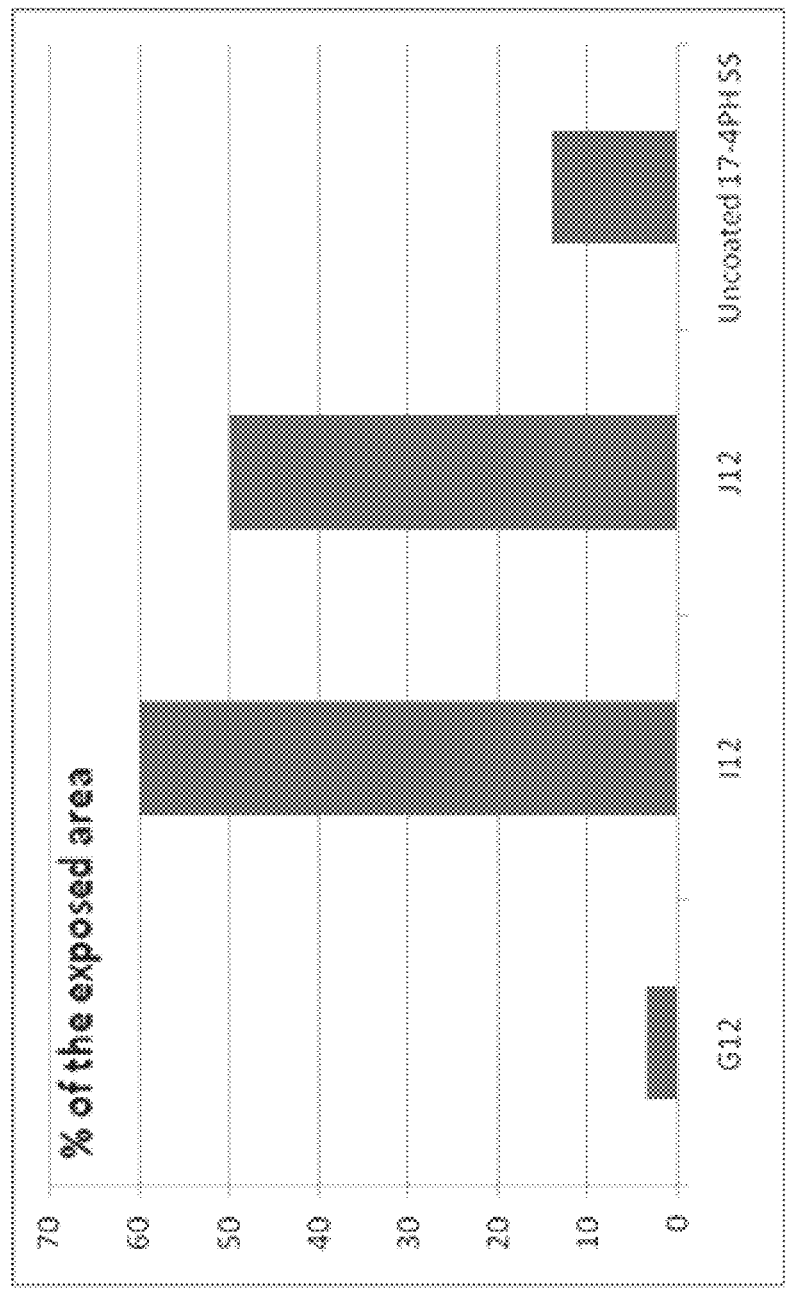
FIG. 10 shows a percentage of corrosion damage in various samples, compared to uncoated stainless steel, after 336 hours exposure to salt fog.
Figure 11:
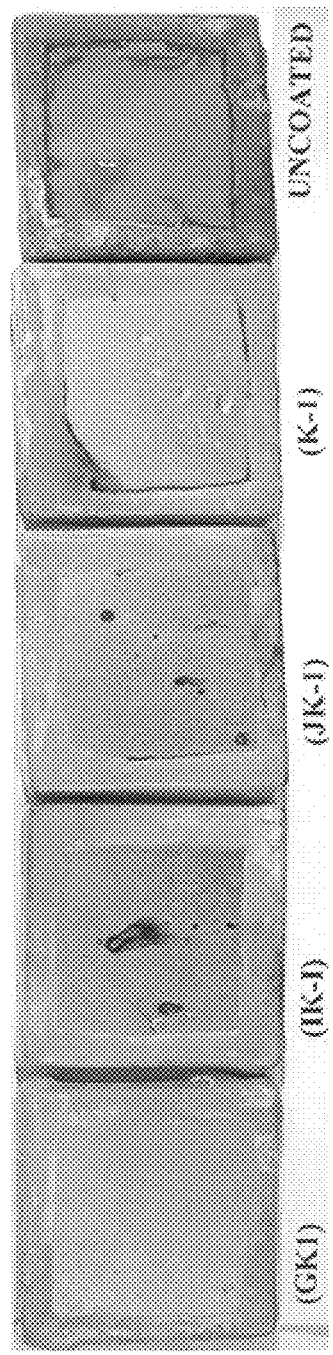
FIG. 11 shows a photograph of the corrosion damage on exemplary samples having 2-segment coatings GK1, IK1, JK1, sample with multilayer coating K1 and uncoated 17-4PH SS after 336 hours exposure to salt fog.

Salt spray corrosion tests of different single segment and dual-segment coatings were conducted per ASTM B 117-07/PTP 1019 standard for 336 hours with a specimen support angle of 15°. Epoxy paint was applied to the circumference and bottom of the samples as a corrosion mask to ensure that all corrosion occurred on the coated face of the samples. Photos were taken at 24 hour intervals and at completion of the testing, and the percentage of surface area covered with red corrosion was assessed. Bead blasted 17-4PH stainless steel substrates having an initial roughness RMS~0.8 µm were tested in uncoated and coated conditions to provide relative comparison of the corrosion protection of thick TiN based LAFAD coatings. From FIG. 10, it can be seen that microlaminated G12 coating having 10 Ti/TiN bilayers with total thickness of 50 um (the bottom coating segment shown in FIG. 3) overperforms both monolithic TiN coatings and uncoated 17-4PH steel. This G12 coating was deposited after a pre-deposition treatment that included bead blasting. The best results on corrosion protection performance were obtained with the ultra-thick nano-microlaminated Ti/TiN coatings having thicknesses ranging from 50 to 100 µm. These included a one-segment K-coating and two-segment K+G, K+I and K+J coatings. It can be seen from the photograph of the surface of coupons presented in FIG. 11, that the nano-microlaminated 50 µm thick single-segment K-coating and the 100 µm thick two-segment GK coating provided 100% inhibition of corrosion, while the 100 µm thick two-segment IK and JK coatings (consisting of bottom segment monolithic I or J coating followed by top segment nano-microlaminated K-coating) showed a few pits with not more than 2% of the exposed area corroded.

The following examples are offered to further illustrate but not limit both the compositions and the methods of the present invention.

Example 1: Large Area Filtered Arc Deposition (LAFAD) of Erosion and Corrosion Resistant TiAlN Multilayer Multi-Segment Coating on Metal Sheets, Foils, Instruments and Machine Components The arc coating apparatus shown in FIG. 1 is used in this process. The apparatus is equipped with two dual-filtered arc sources, 1a and 1b having round primary cathode targets 12 measuring 3" in diameter and 2" in height, one filtered arc source 1a having at least one titanium target, preferably two titanium targets, and the other 1b having at least one aluminum target, preferably two aluminum targets. The filtered arc sources 1a and 1b can operate in magnetic shutter mode: When the deflection magnetic system (magnetic deflection and focusing coils 20 and 21) is activated in magnetic shutter open mode, the metal vapor plasma generated by the cathode targets 12 is transported toward coating chamber 42 to provide metal or metal-ceramic coatings on substrates to be coated 4. When the deflecting magnetic system is inactive in magnetic shutter close mode, the heavy atomic particles (predominantly metal ions) are blocked from propagation into the coating chamber 42, but electron current can be conducted along the remote arc discharge established between cathode targets 12 in cathode chambers 90 and remote anodes 70 in coating chamber 42 to achieve a high rate of ionization and activation of reactive gaseous plasma environment. A 12" wide×60" long×1/64" thick stainless steel metal strip, an example of substrate 4 is installed around the turntable 2 with the center of the strip positioned at height even with the center of the opening of the plasma duct exit tunnel section 46. The metal strip substrate is subjected to either wet or dry blasting or shot peening or laser peening or similar pre-treatment prior to loading into the vacuum chamber for deposition of metal/ceramic coating. Coating chamber 42 is evacuated to 4×10$^{-6}$ Torr and then argon is injected to create a total pressure ranging from 4×10$^{-4}$ to 8×10$^{-4}$ Torr. The substrate metal strip is preheated to 350° C. by chamber heaters 75. Vertical magnetic rastering coils on both filtered arc sources 1a and 1b (not shown) were turned ON. The magnetic deflection system is inactive in both filtered arc sources 1a and 1b, while cathode targets 12 are activated in at least one filtered arc source, preferably filtered arc source 1a with the titanium targets, and the substrate turntable rotating speed is set at 16 RPM. The auxiliary arc discharge is activated between the cathodes 12 of the filtered arc source 1a and the distal auxiliary anodes 70 installed in the coating chamber 42. During the ion cleaning stage, the substrate bias is in the range from −200V to −500V for ion bombardment of substrates to be coated 4 by argon ions extracted from the remote arc discharge plasma. After the ion cleaning stage, a 2 min high voltage metal ion etching stage is performed at substrate table bias −1000 volts. At this stage, the magnetic deflecting system of filtered arc source 1a with titanium targets is turned open, switching this source into magnetic shutter open mode of operation when magnetic deflection and focusing coils 20 and 21 of titanium filtered arc source 1a are turned ON. After metal ion etching, the turntable bias is reduced to −40 volts and a titanium bond layer is deposited during a 3 min deposition time. After this stage, filtered arc source 1b with aluminum targets is activated (its deflection and focusing magnetic coils 20 and 21 are turned ON), switching this source into magnetic shutter open mode of operation. Nitrogen is injected at total pressure of 0.2 mtorr to replace the argon and act as a reactive gas during the deposition of TiAlN nano-multilayer coating. The primary cathodic arc currents of all cathode targets 12 in both filtered arc sources 1a and 1b are 200 amperes while the remote anode currents of titanium targets of source 1a are 100 amperes; the remote arc discharge is not conducted between cathode 12 of the filtered arc source 1b and remote anodes 70, providing a ratio of arc currents between cathode targets 12 of the filtered arc source 1a to cathode targets 12 of filtered arc source 1b at approximately 1.5 to compensate for larger erosion rate of aluminum targets compared to titanium targets. The coating deposition process is performed for 12 hrs. The magnetic deflecting system of the source 1b with aluminum targets is turned OFF each 10 min for a duration of 2 min working in a magnetic shutter mode. During these 2 minutes, nitrogen is replaced with argon during for deposition of titanium interlayers by source 1a operating in magnetic shutter ON mode. These titanium interlayers separate the TiAlN interlayers, thus forming a nano-multilayer TiAlN/Ti metal-ceramic laminated coating architecture. After the deposition process is finished, the chamber is cooled and the metal strip with nano-microlaminated TiAlN/Ti coating is removed from the chamber.

A similar process run was performed by using only one LAFAD unidirectional metal vapor plasma source 1a equipped with one titanium 12 and one aluminum target 12. The rest of the process parameters remained the same as described above. The maximum thickness of the TiAl/TiAlN nanolaminated multilayer coating deposited in this process was 60 μm as measured via SEM micrograph of the metallurgical cross section of the coated sample taken from the central area of the coated metal sheet strip. The coating thickness distribution over 12" wide area of the metal strip was +/−15%. The approximate thickness of TiAlN/TiAl biperiods in nanolaminated architecture was 4 nm. The thickness of metallic TiAl sublayers near the coating region interfacing the substrate was 0.6 μm while, at the top of the coating, the thickness of metallic interlayers was reduced to about 0.1 μm. The hardness of this coating measured by nano-indentation at the top surface of the coating was 30 GPa and elastic modulus 400 GPa exceeding the hardness of Ti/TiN based coatings. In this coating architecture, the Ti rich nano-sublayers are followed by Al-rich nano-sublayers as a result of sequential exposure of the substrate to the Ti metal vapor plasma flow generated by the primary cathodic arc source equipped with the titanium cathode target 12 followed by exposure to the aluminum vapor plasma generated by the primary cathodic arc source with aluminum cathode target 12 installed in the opposite position at LAFAD plasma source 1a. The thickness of titanium- and aluminum-rich sublayers are estimated to be about 4 nm.

Ultra-thick metal-ceramic coatings have various applications beyond turbomachinery components. For example, such coatings may be used as a protective coating for mining picks utilizing tungsten carbide capping or the advanced diamond-powder based composite. The cross-section of a mining pick 33 is shown schematically in FIG. 27. Mining pick 33 consists of steel body 36 and tungsten carbide or diamond-containing composite cutter 38 inserted at the top of steel body 36. An ultra-thick metal ceramic coating 41 such as TiN, TiAlN, or a similar composition, with thickness in the range from 10 μm to 500 μm is deposited by filtered arc process or by the hybrid filtered arc-magnetron sputtering process all-around the steel body 36 including the hard metal cutter 38. In a refinement, the ultra-thick superhard ceramic coatings deposited by filtered arc or hybrid filtered arc-magnetron sputtering process can be used as an active top segment of the cutting tool inserts or rotary tools, when deposited on top of the high speed steel base substrate. In another example, these ultra-thick metal-ceramic coatings, having exceptional wear-resistant properties, are applied to various medical and dental instruments as, for example, a top segment of ultra-sonic scalers. The thickness of the single ceramic or metal-ceramic coating segment, deposited by condensation of energetic metal ions generated by LAFAD process or by hybrid LAFAD-magneron sputtering process, is typically in the range from 5 μm to 500 μm. Coating thickness less than 5 μm is not suitable for erosion and corrosion protection applications in turbomachinery and other heavy duty applications, while coating thickness of single segment ceramic or metal-ceramic coating greater than 500 μm is not practical due to the coating deposition time being too greater. On the other hand, 2-segment coatings may have thickness as large as 1 mm with each segment thickness being up to 500 μm. Since the bottom segment of 2-segment coatings are capable of accommodating stresses, 2-segment coatings may generally be thicker than one-segment coatings.

Example 2: Deposition of a 2-Segment Micro-Nano-Laminated Ti/TiN Coating by LAFAD Process A Ti/TiN micro-nano-laminated coating was deposited by an LAFAD process on 1"×1"×⅛" square coupons made of Ti6Al4V alloy. The LAFAD process used in Example 2 is modified version of the process used in Example 1. For example, Example 2 utilizes titanium targets in both primary arc sources while Example 1 had titanium targets in one primary arc source and aluminum targets in the other primary arc source. The coupons 4 were pre-treated by wet blasting prior to being loading into coating chamber 42 of the coating system shown in FIG. 1. Only one unidirectional dual LAFAD source 1a was used in this process. Both primary cathodic arc sources of the LAFAD source 1a were equipped with titanium targets. Substrate coupons 4 were installed on turntable 2 rotating about a single rotation axis at a rotating speed of 12 RPM. In single-rotation (SR) mode, the substrates are rotated around the axis of the turntable with their front surface facing the chamber walls. The coating process consists of pre-heating to 350° C., twenty minutes of ion cleaning, and two minutes of high voltage (−1000V) metal ion etching and implantation, followed by coating deposition steps in a pressure range from 0.4 to 0.8 mTorr. To provide a substrate bias during the coating deposition process for deposition of conductive coatings, an MDX-II (Advanced Energy) power supply, coupled with Sparcle-V accessory, was used as a DC bias power supply. The substrate bias during deposition of the Ti/TiN coating was −40V. Each metal sublayer was deposited for 15 min followed by a 45 min deposition of a respective TiN ceramic sublayer. The total coating time was 12 hrs, which resulted in deposition of 10 bilayers of G coatings having a total thickness of 50 μm. This coating is shown in FIG. 3a. During this run, the 3" dia×3" tall conical titanium cathode targets were almost 90% consumed. The deposition rate of at least 3 μm/hr of Ti component of the coating deposited from nearly 100% ionized (for example at least 95% or at least 98% ionized) metal vapor plasma generated by LAFAD filtered arc source was used at least during deposition of the first micron of the coating to provide a high rate of metal ion bombardment necessary for formation of coating morphology and microstructure providing high erosion and corrosion resistant properties. This coating typically consists of dome-like surface features with single dome width ranging from 10 nm to 30 μm (including both larger domes and nanodomes), while surface roughness Ra does not exceed 1 μm. After cooling the chamber, the Ti cathode targets were replaced with the new targets and the coating deposition process was repeated with the same processing parameters as for deposition of G coating but the duration of each deposition of metallic sublayer was reduced to 3 min and the duration of each deposition of TiN ceramic sublayer was reduced to 12 min in comparison with the process of deposition of G coating bottom segment. The resulting top coating K segment had 40 layers over the total thickness of about 50 μm as shown in FIG. 3a. The thickness of metallic sublayers in the area interfacing with the G coating was about 300 nm reducing to about 50 nm at the top of K coating. The resulting GK coating had hardness 25 GPa and elastic modulus 415 GPa while the G coating had hardness of 19 GPa and elastic modulus 320 GPa. Hardness and elastic modulus were measured by nano-indentation technique. Typically, the hardness of the bottom segment in 2-segment ceramic or metal-ceramic coatings deposited by condensation of energetic metal ions generated by LAFAD process or hybrid LAFAD-magnetron sputtering process is ranging from 0.3 to 25 GPa while hardness of the top segment is ranging from 25 GPa to 80 GPa. Generally, the hardness of single monolithic ceramic segment or multilayer segment ranges from 0.3 GPa to 80 GPa depending on ratio of metal forming vs. ceramic forming phases. The hardness of most monolithic ceramics typically ranges from 15 GPa, as for example, the minimal hardness of CrN, to more than 40 GPa for B4C and related ceramics, while reaching up to 80 GPa for hydrogen free DLC deposited by filtered arc process. The hardness of ceramic coatings is influenced by their structure and composition. The nanolayered TiN/BCN ceramic have demonstrated hardness exceeding 45 GPa. The hardness of nanocomposite ceramics comprising different phases included within the main ceramic matrix can achieve the hardness exceeding 50 GPa, associated with superhard materials.

In a refinement, a 1-segment micro-nano-laminated TiN/Ti corrosion and erosion resistant coating with coating architecture similar to the top K coating of Example 2 shown in FIG. 3a was deposited on airfoils of turbine engine made of Ti6Al4V alloy and 17-4PH steel by filtered cathodic arc coating deposition process using LAFAD coating system of FIG. 1. Only one filtered arc source 1a was used in this coating deposition process. The airfoils were installed on turntable 2 either at a 60° angle to the radius as shown for airfoil samples 4b with the leading edge facing the walls of coating chamber 42 and the trailing edge directed toward the center of turntable 2, or, alternatively, with double rotation as shown for airfoil sample 4a in FIG. 1. In this double rotation, airfoil sample 4a further undergoes rotation about a longitudinal axis of airfoil sample 4a, wherein the longitudinal axis of airfoil sample 4a is parallel to the rotation axis of turntable 2. Both primary cathodic arc sources of the filtered cathodic arc source 1a were equipped with cathode targets 12 made of titanium. The rotation speed of turntable 2 was 12 RPM during all stages of the coating deposition process. The same process recipe as for the top K-segment coating of example 2 was used for deposition of a 1-segment micro-nano-laminated TiN/Ti coating architecture on airfoils. During this 12 hrs process, the coating was deposited by one LAFAD source 1a with deposition duration being 2 minutes for the Ti sublayer and 13 minutes for TiN sublayer. The total arc current generated by each of two primary cathodic arc sources of the LAFAD dual filtered arc source was 200 amperes, the nitrogen pressure 0.4 mTorr, and the substrate bias was −40 volts DC. The cross section of the resulting coating on leading and trailing edges of the airfoil installed at stationary 60 deg angle to the radius of the turntable (position 4b in FIG. 1) are shown in FIGS. 26a,b. FIG. 26a shows the trailing edge coating cross-section and FIG. 26b shows the leading edge coating cross-section. It can be seen that the difference between thicknesses of the coating of the leading edge (~20 μm) vs. trailing edge (~15 μm) does not exceed 30% demonstrating good conformity of the LAFAD process. To aid the comparison between leading and trailing edge thicknesses, the thickness of the trailing edge (FIG. 26a) is indicated by a dashed line in FIG. 26b. The thickness of erosion and corrosion resistant coatings on airfoils is typically ranging from 5 μm to 40 μm, and often not exceeding 30 μm to avoid the probability of delamination on very thin edges of the airfoils. On the other hand, for such applications as erosion and corrosion resistant coatings for protectors of the helicopter's rotorblades, the total coating thickness of ceramic or metal-ceramic coatings deposited by condensation of energetic metal ions generated by LAFAD process or by the hybrid LAFAD-magnetron sputtering process can reach 500 μm for single segment coating and up to 1 mm for 2-segment coatings.

Figure 25A:
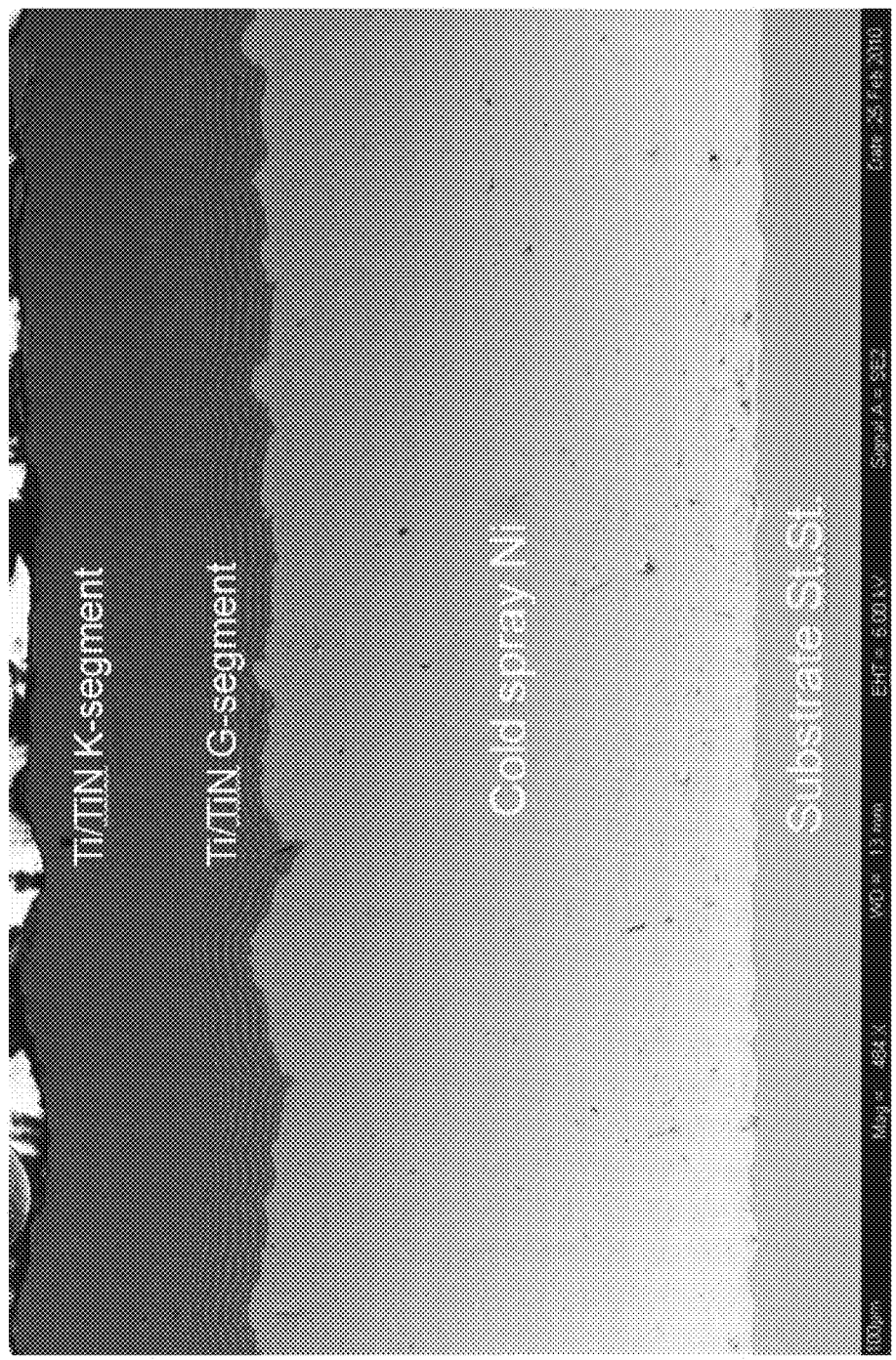
FIGS. 25a and b are SEM micro-images of the cross-section of one exemplary 3-segment coating utilizing cold spray nickel bottom segment coating, Ti/TiN microlaminated medium G-segment and Ti/TiN multilayer top K-segment.
Figure 25B:
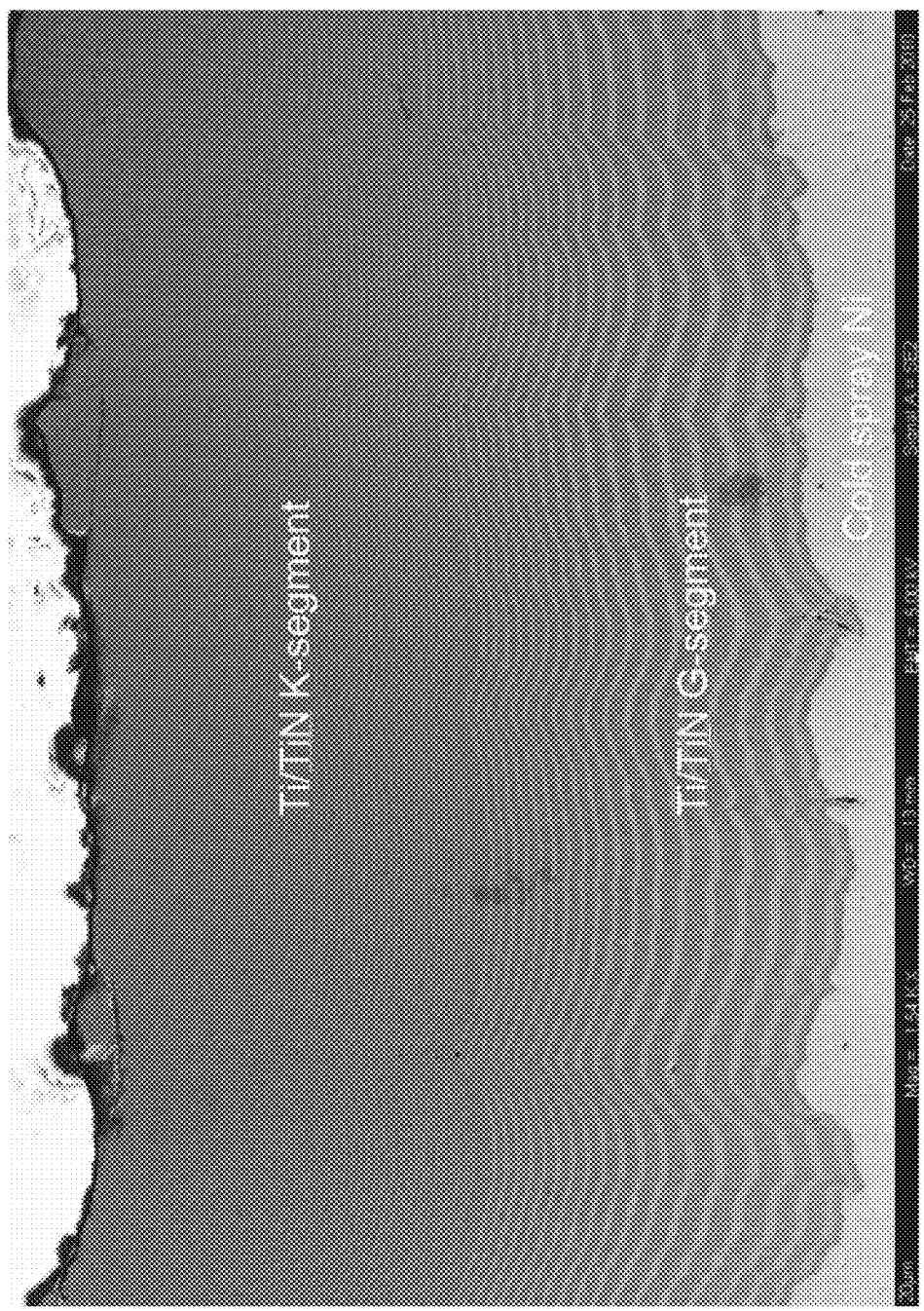
FIG. 25c is SEM micrograph of the cross section of one exemplary Ti/TiN multilayer coating of FIG. 25b with digitally traced interlayers.
FIG. 25d is the coefficient of determination $R^2$ in a linear approximation of the traced metal interlayer contours in Ti/TiN multilayer coating of FIG. 25c as a function of a distance from the bottom cold-spray Ni-layer surface.
Figure 25C:
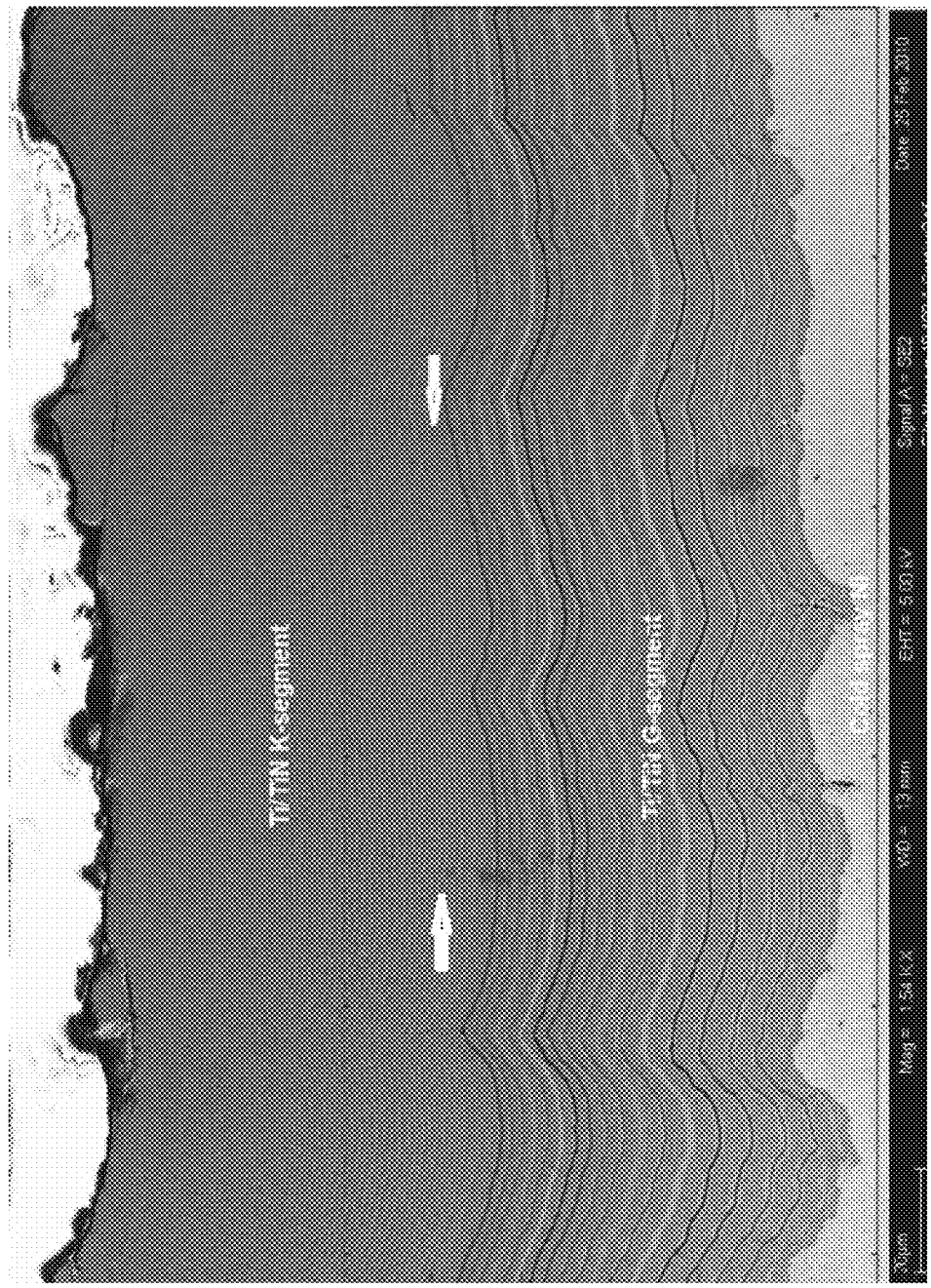
Figure 25D:
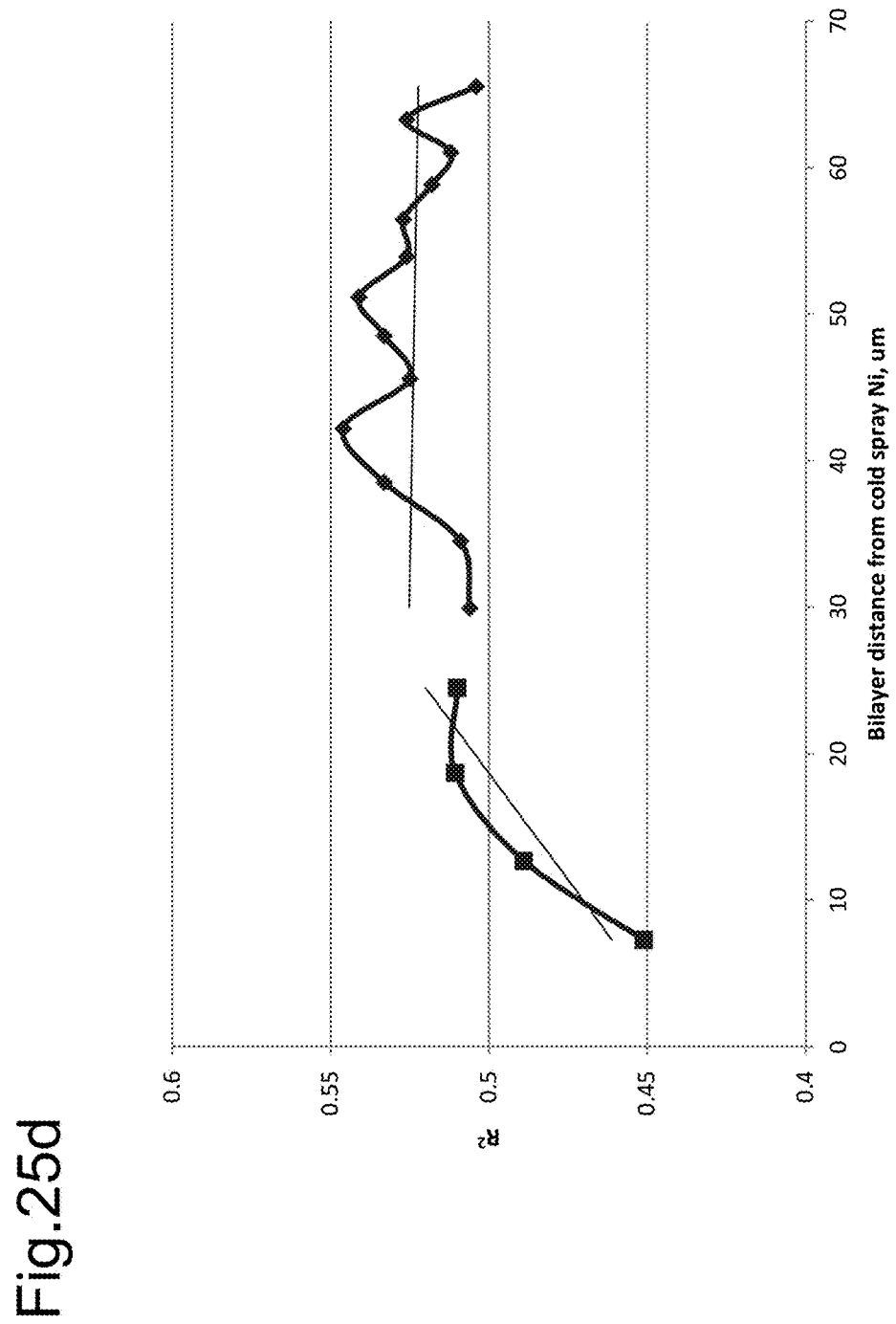

The unexpected decrease of roughness of subsequent coating layers with increase of the distance of the coating layer from the substrate is presenting in the 1-segment Ti/TiN nano-microlaminated coatings of airfoils shown in FIGS. 3b, 26a,b as well as in 2-segment GK coating deposited on rough layer of cold-spray Ni as illustrated in FIGS. 25a, b. The SEM micrographs of cross section of Ti/TiN 2-segment GK multilayer coating deposited by the LAFAD process on extremely rough surface of cold-spray nickel under conditions of intense metal ion bombardment are shown in FIGS. 25a,b and c. In the micrograph of FIG. 25c, the thin metal interlayers are traced over to demonstrate the smoothing effect of consecutive coating deposition with intense ion bombardment. The tracing lines were digitized to demonstrate increase in the coefficient of determination $R^2$ with respect to the least-squares linear approximation of the surface to quantify this effect (see FIG. 25d). The surface of the cold-spray nickel was not subjected to any roughness mitigating treatment such as tumbling, bead-blasting or polishing, leaving the roughness Ra>20 μm before deposition of LAFAD PVD Ti/TiN top segment metal-ceramic coating. The analysis of this cross-sectional micrograph demonstrates the dramatic decrease of the roughness of different lateral portions of this coating, as clearly shown in the portion of the cross section between two arrows in FIG. 25c. It can be seen that the smoothing effect takes place mostly during the initial time of the coating deposition process when the intensity of metal ion bombardment is high, exceeding the corresponding average coating deposition rate of 3 µm/hr, at least during the deposition of the first micron of the coating. The smoothing effect decreases when the coating thickness increases, which can be attributed to decreasing ion bombardment intensity. It can be seen in FIG. 25d that the coefficient of determination $R^2$ increases only at the beginning of the coating deposition process when the intensity of metal ion bombardment is highest. The increase of the coefficient of determination $R^2$ corresponds to a decrease in deviation of the coating layer from a flat plane. Typically the initial substrate roughness after pre-deposition treatment exceeds 0.1 mm, while the roughness of thick ceramic and metal-ceramic coatings deposited by condensation of energetic ions generated by LAFAD process or by the hybrid LAFAD-magnetron sputtering process is no more than Ra=1 µm. These ceramic and metal-ceramic coatings feature dome-shape surface morphology with single dome lateral size ranging from 10 nm to 30 µm.

Example 3: Deposition of TiN Erosion and Corrosion Resistant Coating on Airfoils by Hybrid Filtered Cathodic Arc-Magnetron Sputtering Deposition Process In this example, the TiN coating of monolithic coating architecture is applied by hybrid filtered cathodic arc-magnetron sputtering deposition technology for deposition of erosion and corrosion resistant coatings on airfoils of turbine engine. As in Example 2, the coating system shown schematically in FIG. 1 is used for this coating deposition process. The airfoils were installed at turntable 2, for example at the 60° to the radius as shown in airfoil samples 4b, or with double rotation as shown in airfoil sample 4a in FIG. 1. In double rotation, airfoil sample 4a further undergoes rotation about a longitudinal axis of airfoil sample 4a, which is parallel to the rotation axis of turntable 2. All primary cathodic arc sources of the filtered cathodic arc sources 1a and 1b are equipped with cathode targets 12 made of titanium. All targets of the coincided magnetron sputtering sources 245c,d,e,f are also made of titanium.

At the first stage, the remote arc discharge is ignited in argon at 2 mtorr between (a) cathode target 12 of the filtered arc source 1b, operating in magnetically shuttered mode, and (b) remote anode 70. The argon arc plasma fills coating chamber 42, effectively immersing substrate table 2 with substrates to be coated 4 in dense strongly ionized plasma. A bias voltage of −250 V is applied to substrate table 2 for 30 min for ion cleaning substrates to be coated 4. The rotation speed of substrate table 2 is set at 12 RPM. At the second stage, both cathodic arc sources of filtered cathodic arc source 1a are activated. Both the deflection and focusing magnetic coils of plasma duct 44 of filtered arc source 1a are also activated (opened magnetic shutter mode) to direct metal vapor plasma generated from cathodic arc targets 12 of the filtered cathodic arc source 1a toward substrates to be coated 4 in coating chamber 42. The bias applied to substrate table 2 is increased to −1000 V for metal ion etching and implantation of substrates to be coated 4. The metal ion etching stage lasts for 3 min followed by a filtered cathodic arc coating deposition stage. In the filtered cathodic arc coating deposition stage, the substrate bias is reduced to −30 V and a titanium adhesive sublayer is deposited during 10 min in argon at 2 mtorr. In a third stage, nitrogen is added to the chamber to maintain Ar:$N_2$ ratio of approximately 3:1 at a combined pressure of approximately 2 mtorr, and deposition of a TiN monolithic layer starts at a deposition rate of the Ti metal component (of the metal vapor plasma generated by filtered arc source 1a) of no less than 3 µm/hr. Both magnetron sputtering sources 245c and 245d coincided with filtered arc source 1a are activated at a magnetron sputtering power density ranging from 5 W/cm² to 20 W/cm², without interruption of the filtered cathodic arc source 1a, and a hybrid filtered cathodic arc-magnetron coating deposition process continues for 3 to 5 hrs to deposit TiN coatings on airfoils. The ionization of the coincided filtered arc vapor plasma flow-magnetron sputtering flow, defined as a ratio $\gamma_i$=(metal ion flux)/(metal ion flux+metal atom flux), during deposition of TiN coating ranges from 55% to 95%, while the average kinetic energy of the metal ions produced by filtered cathodic arc evaporation process is greater than at least 5 eV and, for most metal ions, greater than 20 eV. The ionization rate is typically higher at the beginning of the process, typically ranging from 50% to 95% and then reducing to a level ranging from 5% to 50% at the end of the coating deposition process. Reduction of ionization of the coincided filtered arc metal vapor plasma-magnetron sputtering metal atoms flow makes the coating less brittle, which allows avoiding cracks and delamination at the very thin edges of the airfoils. The coating thickness is ranging from 5 µm to 40 µm, but typically ranging from 8 µm to 32.5 µm or within the range from 10 µm to 25 µm.

Figure 7:
FIG. 7 is a schematic diagram of a cross-sectional view of a preferred embodiment of the protector for helicopter rotorblades utilizing 2-segments Ti/TiN multilayer coating and top DLC segment.

FIG. 7 illustrates a further embodiment of the present invention comprising a top superhard segment coating on a top of microlaminated metal/ceramic segments. In this embodiment, a diamond like coating (DLC) 705 having thickness ranging from 5 to 150 µm, but typically not exceeding 60 µm for compressor blades and diffuser applications is deposited on top of second segment 704 metal/ceramic microlaminated coating having smaller metal sublayers and smaller bilayers than that of the bottom segment 703. Carbon DLC coating 5 is a superhard coating which makes it a good candidate material for erosion resistant coating applications, as was indicated in U.S. Pat. No. 7,247,348 to Power, which is incorporated herein by reference. The carbon DLC coatings deposited by LAFAD process have demonstrated their superior hardness, good adhesion and mechanical stability as presented in N. Novikov, V. Gorokhovsky and B. Uryukov, "Superhard i-C Coatings Used in Complex Processes of Surface Strengthening of Tools and Machine Parts," Surface and Coatings Technology, 47, (1991) 770, which is incorporated herein by reference. The following example provides typical coating deposition process parameters for deposition of the top DLC coating for erosion protection of helicopter rotorblades.

Figure 8A:
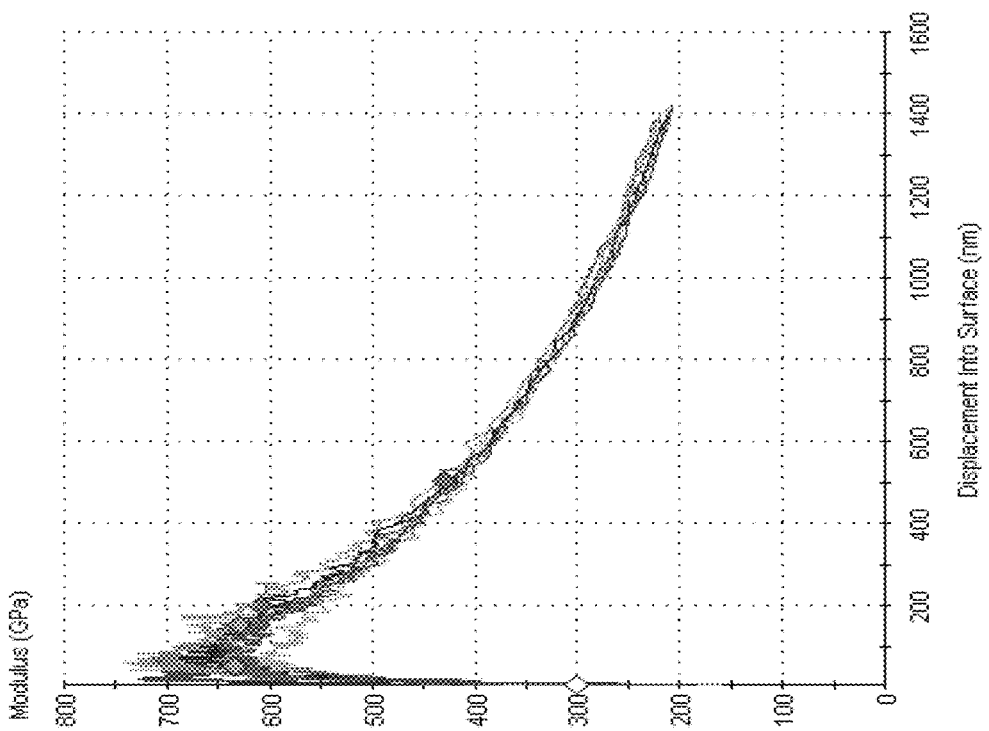
FIGS. 8A and 8B are graphs showing hardness and elastic modulus, respectively, of one exemplary 6 μm thick DLC coating on Al, as a function of displacement to the surface.
Figure 8B:
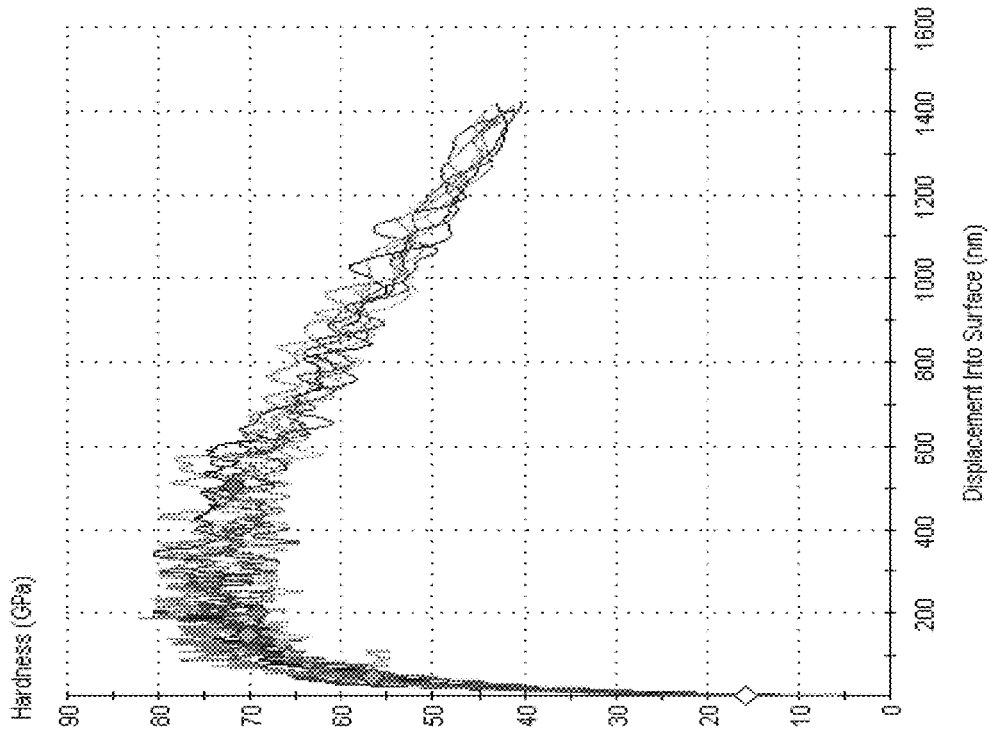
Figure 12:
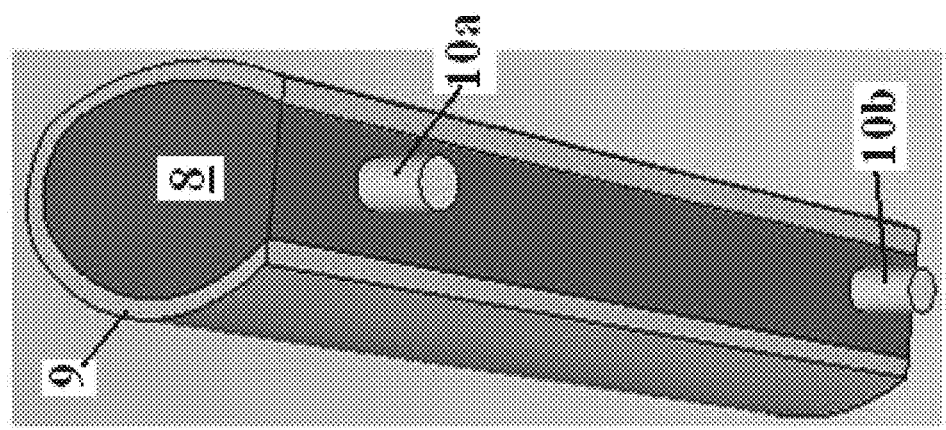
FIG. 12 shows a protector airfoil attached to the water-cooled protector holder for deposition of carbon DLC topcoat by LAFAD process, according to an embodiment.

Example 4: Deposition of DLC Coating on Water Cooled Aluminum Substrates by LAFAD Process The DLC coatings were deposited by one unidirectional LAFAD plasma source installed in a coating system similar to that shown in FIG. 1. Aluminum disk coupons 60 mm dia×5 mm thick and aluminum strips 100 mm long×60 mm wide×5 mm thick were installed on turntable 2 attached to the water-cooled copper blocks using thermal conducting paste. FIG. 12 shows one exemplary curved protector airfoil 9 attached to a water cooled copper block 8 for deposition of a carbon DLC. Copper block 8 has water inlet 10a and outlet 10*b*. The coating chamber was evacuated an ultimate vacuum of $10^{-6}$ torr. Both primary cathodic arc sources of LAFAD plasma source 1*a* were equipped with high purity graphite targets 4, preferably made of pyrolytic graphite. Additional anode grids, made of tungsten bars ½ thick with the distance between the bars ¾", were installed in front of the graphite targets to improve the stability of the cathodic arc evaporation process. These anode grids are an example of stream baffles 135 shown in FIG. 1 and served to trap macroparticles emitted from the graphite target during vacuum arc evaporation process in a low pressure range, typically ranging from 0.01 to 0.1 mTorr as required for deposition of high quality hydrogen-free DLC. The substrate table was connected to an RF generator with a 13.56 MHz frequency to provide RF bias during coating deposition process since DLC has a very high electrical resistivity>$10^6$ Ohm cm. The process starts with ion cleaning in Ar as described in Example 1. After the ion cleaning stage, the gas supply line was closed and the filter deflecting field produced by the deflecting coils 20 and focusing coils 21 was turned ON to start the DLC deposition process. This coating deposition run lasted 3 hrs. The coatings deposited in this process were characterized by their thickness, hardness, elastic modulus and corrosion resistance. The preliminary characterization of the aluminum disk samples with DLC deposited in this run was published in N. Novikov, V. Gorokhovsky and B. Uryukov, "Superhard i-C Coatings Used in Complex Processes of Surface Strengthening of Tools and Machine Parts," Surface and Coatings Technology, 47, (1991) 770, which is incorporated herein by reference. The DLC deposited in this run had a thickness of 6 μm. The hardness and elastic modulus of the 6 μm thick DLC on Al disk was measured using nanoindentation (MTS Nanoindenter XP, CSM). A continuous stiffness module was used. 8 indents were measured on the coating with a fixed total displacement of 1400 nm. A Berkovich tip was used. As shown in FIGS. 8A and 8B, the deposited DLC coating exhibits extremely high hardness and elastic modulus. The mean hardness calculated over 200-500 nm displacement (~4-8% of coating thickness) is 73.0+/−2.5 GPa. The mean modulus calculated over 50-150 nm displacement is 645+/−30 GPa. The rapid decrease in both hardness and modulus with displacement of above 400 nm indicates the strong effect of the soft Al substrate on the measured hardness and modulus. This softening effect of the metal substrate on superhard DLC layer properties is eliminated when the intermediate hard metal ceramic coating having hardness ranging from 15 to 40 GPa is deposited between a metal substrate and the top DLC segment.

Figure 9:
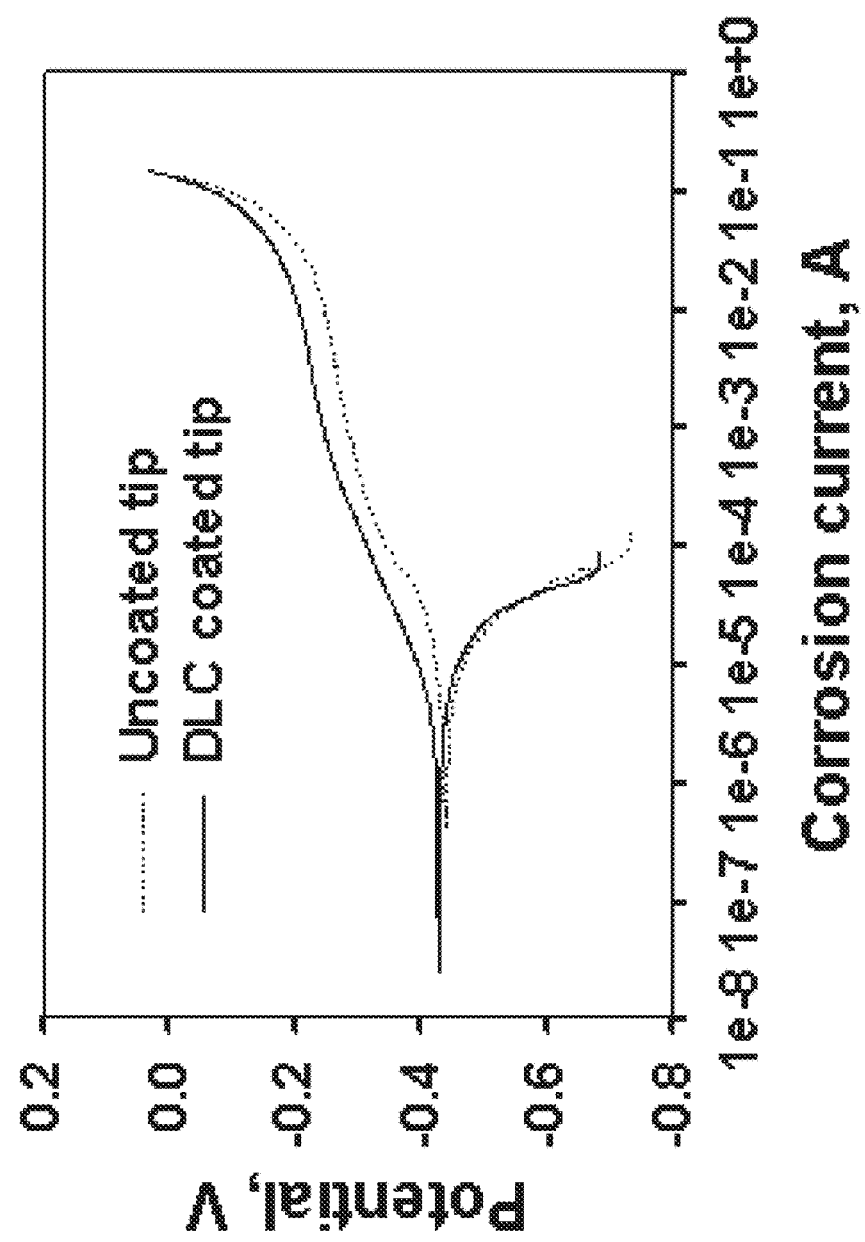
FIG. 9 is a typical potential-current curves for 0.5 μm DLC coated 440A steel samples vs. 2 μm TiN coated 440A steel samples.

In another LAFAD process run, a set of thin DLC coatings were deposited on high chromium 440A stainless steel substrates using the same LAFAD coating process as described in Example 3 but the substrates were not water cooled. The thickness of these coating was 0.5 μm. The corrosion resistance of these coatings was compared to a 2 mm thick Ti/TiN multilayer coatings deposited by the LAFAD process described in Example 2. An electrochemical method was performed to characterize the corrosion properties of the coated practices. This methodology is described in K. Gordashnik, V. Gorokhovsky, B. Uryukov, "Study of Corrosion Stability of Medical Instruments with TiN-Covers," Proceedings of the International Ion Engineering Congress, ISIAT 83, Institute of Electrical Engineers, Kyoto, Japan, 1983. A potentiodynamic scan in the voltage range of −250 mV vs. $E_{oc}$ (open circuit potential) to +500 mV vs. $E_{oc}$ was used to measure the corrosion properties, such as corrosion potential and corrosion current. Testing was performed in 3.5% NaCl solution using PowerCORR software with a EG&G 263A potentiostat from Princeton Applied Research. The reference and auxiliary electrodes are a saturated calomel electrode (SCE) and a graphite rod electrode, respectively. FIG. 9 shows typical Potential-Current curves for DLC coated and TiN coated scale tips. As shown, the curve of the DLC coated scale tip shifts to higher potential and lower current. The curves were analyzed using the Tafel model, and the corrosion current and corrosion potential for DLC coated samples and uncoated samples were calculated to be 7.2 μA, 12 μA, −428 mV, and −439 mV, respectively, indicating good corrosion properties of DLC coated scales. The improved corrosion resistance properties of the DLC coatings result from their high density and inertness in aquatic electrolyte solution.

Example 5: TiBCN Erosion and Corrosion Resistant Nanocomposite Coatings on Compressor Blades (Airfoils) of Turbine Engine The process and a hybrid dual filtered cathodic arc-magnetron sputtering coating system similar to the one used in Example 3 shown in FIG. 1 is used for deposition of superhard TiBCN nanocomposite coatings on airfoils, a set of compressor blades of turbine engine. As shown in FIG. 1, the airfoils are installed at rotational turntable 2. The metal vapor plasma and codirected metal sputtering flow is generated by hybrid filtered arc-magnetron sputtering source 1*a* operating in magnetic shutter open mode, while opposite, filtered arc source 1*b* is operating in magnetically shuttered mode for generation of a remote arc discharge that increases ionization and activation of the metal gaseous plasma environment in coating chamber 42. Airfoils 4 are installed either at an acute angle ranging from 30 to 75 deg to the radius of turntable 2, as for example shown in FIG. 1 for airfoils 4*b*, or with the ability of double rotation, as for example shown in FIG. 1 for airfoil 4*a*. Cathodic arc targets 12 of the primary cathodic arc sources of filtered arc source 1*a* are made of titanium, while the magnetron targets of the coincided magnetrons 245*c,d*, magnetically coupled with filtered arc source 1*a*, are made of $B_4C$ ceramic. Cathode targets 12 of the primary cathodic arc sources of the filtered arc source 1*b* are also made of titanium, and are further aimed on generation of the remote arc discharge between (a) primary cathodic arc targets 12 of filtered arc source 1*b* operating in the magnetically shattered mode to block all metal vapor particles from reaching coating chamber 42, and (b) remote anode 70 in coating chamber 42. The airfoils 4 are subjected to wet blasting, dry blasting, glass bed peening or laser peening pre-treatment before being loaded in coating chamber 42 for plasma processing. After loading the airfoils, the coating chamber 42 is pumped down to an ultimate vacuum of 1E-6 Torr, after which argon as a plasma creating gas is added to a pressure of 0.5 mTorr. The auxiliary arc discharge is ignited between cathode targets 12 of the primary cathodic arc sources of magnetically shuttered filtered arc source 1*b* and remote anode 70. The current of the remote arc discharge is ranging from 100 to 200 amperes. Optionally, the remote arc can be used for electron heating of substrates (airfoils) by switching the positive terminal of the remote arc power supply (not shown) from remote anode 70 to turntable 2, while at the same time disconnecting the bias power supply from the turntable 2. The pre-heating stage usually has a duration in the range from 30 min to 1 hr. Optionally, radiation heater 75 is also used to stabilize the temperature of airfoils 4 within the range 400-450° C. (the substrate temperature may be measured by an IR pyrometer, shown in FIG. 1). The heating stage is following by an ion cleaning stage. During ion cleaning, the positive terminal of the remote arc power supply is switched back to remote anode 70, and turntable 2 is switched to a bias power supply (not shown) to negatively bias substrates to be coated 4 from −10V to about −1000V during all subsequent stages of the coating deposition process. A negative bias potential of −400 volts is applied to turntable 2 with substrates to be coated (airfoils) 4 to provide ion cleaning in argon remote arc discharge plasma by means of ion bombardment for 30 min. After this stage, a short stage of metal ion etching is provided for 5 min specifically aimed to improve coating adhesion. During the metal ion etching stage, the bias potential provided by the bias power supply (not shown) is increased to −1000 volts. The primary cathodic arc sources of dual filtered cathodic arc source 1a are activated and vacuum arcs are ignited at the titanium cathode targets 12. The current of each of the primary arc discharges is ranging from 100 to 140 amperes. The deflecting and focusing magnetic system of dual filtered cathodic arc source 1a is activated by turning on deflecting coil 20 and focusing coil 21, opening the magnetic shutter and allowing the metal vapor plasma to be transported toward coating chamber 42, such that the titanium metal vapor plasma is directed toward airfoils 4 on turntable 2. After the metal etching stage, the bias potential of turntable 2 is reduced to −40 volts, and the total arc current (a sum of the primary arc current and remote arc current) of each cathodic arc target 12 is in the range from 240 amperes to 400 amperes, such that the temperature of the evaporating surface of the cathode target 12 exceeds at least half the melting point of the target 12 metal. At this temperature, large pools of melted areas, having sizes typically ranging from 0.1 to 10 mm, are developed by the cathodic arc spots, resulting in dramatic increase of the metal ion flux outcoming from the filtered arc source. During the coating deposition process, the cathode target is getting thinner, which increases heat transfer flux resulting in increased cooling rate and reducing the metal vapor flux from the evaporating surface of the target, which, in turn, results in reducing the thickness of the bilayers in multilayer coatings. This effect can be compensated by increasing the arc current, but it was found that decrease of the thickness of the bilayers in the multilayer coating is beneficial to the coating toughness, erosion and corrosion resistance. Therefore, the multilayer coating architecture, having bilayer thickness reducing with the distance of the coating layer from the substrate, may be prepared intentionally either by reducing the arc current or, alternatively, by increasing the heat transfer from the heated evaporating surface of the target to its water-cooled back side.

During the coating deposition stage of the coating deposition process, nitrogen is added to the gas atmosphere in the coating chamber maintaining the ratio of partial pressures with argon $P_{N2}:P_{Ar}=10:1$ at a total gas pressure of 0.2 mTorr, approximately. Nitrogen is a reactive gas necessary for forming nitride-based ceramic and metal-ceramic coatings. The first ceramic layer of TiN is deposited from nearly 100% ionized (for example at least 95% or at least 98% ionized) titanium metal vapor plasma generated by cathode targets 12 in nitrogen reactive atmosphere with the rate of deposition of Ti component (defining the intensity of metal ion bombardment) exceeding 3 μm/hr at least during deposition of the first micron of the coating layer, but typically within the range from 3 to 30 μm/hr. The thickness of the first TiN layer is typically in the range from 2 to 5 μm. After this stage, the pressure is increased to 2 mTorr by increasing the flowrate of argon while keeping the argon to nitrogen ratio $P_{N2}:P_{Ar}=1:3$, approximately. The coincided magnetron sputtering sources 245c,d, magnetically coupled with filtered arc source 1a, are activated with specific power (total power per 1 cm² of the target area) ranging from 3 to 20 W/cm², but typically within the range from 4 to 10 W/cm², and a nanocomposite TiBCN superhard coating is deposited by the hybrid filtered cathodic arc-magnetron sputtering process for 5 hrs to achieve a coating thickness in the range from 5 μm to 40 μm. A coating thickness less than 5 μm is not enough for erosion and corrosion protection of the airfoils, while a coating thickness exceeding 40 μm may create a problems of cracks and delaminations at the very narrow leading edge of the airfoil. During this stage, the TiN component deposition rate may be reduced to 1 μm/hr and the specific power applied to the magnetron targets may be increased within the range from 10 to 20 W/cm². The deposition of the TiBCN nanocomposite layer may start from predominantly TiN filtered arc deposition by nearly 100% ionized (for example at least 95% or at least 98% ionized) titanium metal vapor plasma flow followed by a gradual reduction of the deposition rate of the filtered arc source and/or increase of the power applied to coincided magnetron sputtering sources 245c,d. This gradual reduction of the deposition rate of the filtered arc source, and/or increase of the power applied to coincided magnetron sputtering sources 245c,d, results in a reduction of the ionization degree in a combined filtered arc-magnetron sputtering flow from nearly 100% (for example at least 95% or at least 98%) at the beginning of the deposition of TiBCN layer to nearly 1% ionization at the end of deposition of the TiBCN layer. The ionization degree may be also modulated from 1% to 100% (or nearly 100%, such as at least 95% or at least 98%) during deposition of the TiBCN layer by modulating the ion flux of the filtered arc source vs. the the metal atoms sputtering flux of the magnetron sputtering source. For example, in the magnetic shutter mode, by turning ON and OFF magnetic deflecting coils 20 and focusing coil 21 of filtered arc source 1a, a nano-multilayer coating architecture with nanolayers of BCN followed by nanolayers of TiBCN may be deposited, which may improve the toughness and other functional properties of the coating. Alternatively, the nano-layers of BCN may be introduced by alternatingly exposing the substrate to be coated to (a) filtered arc metal vapor plasma generated by the filtered arc source 1a and (b) magnetron sputtering deposition by the independent magnetron sputtering sources 245g and 245h generating metal sputtering fluxes 213 simultaneously with co-directional deposition of the TiN+BC metal vapor plasma generating by the hybrid filtered arc-magnetron sputtering source 1a. The thickness of nanolayers in nano-laminated coating architecture of TiBCN coatings deposited by hybrid filtered arc-magnetron sputtering process are typically ranging from 1 to 10 nm.

Deposition of ultra-thick ceramic coatings on thin sheet metal strip substrates imposes considerable mechanical stress on the metal strip substrate resulting in its deformation. To substantially reduce or completely eliminate this effect, the back side of the substrate metal sheet may be supported by a metal cage having thickness of 1 to 10 times the thickness of the metal sheet substrate. The metal cage is attached to the back side of the metal sheet substrate by point-welding. Alternatively, narrow groves may be made on the back side of the metal sheet substrate by laser cutting. The network of groves has a square checked pattern with the side of one cell about 1". The depth of the grooves ranged from 0.2 to 0.8 the thickness of the metal sheet substrate. This network of the grooves relieves the mechanical stress and reduces or completely eliminates deformation of the metal sheet substrate. Alternatively, the coating can be applied in a discontinuous pattern of repeated geometric shapes which are separated by narrow uncoated ribbons. The shapes can be, for example, squares, triangles, and rectangles, other polygons, or other non-polygonal shapes.

Figure 14A:
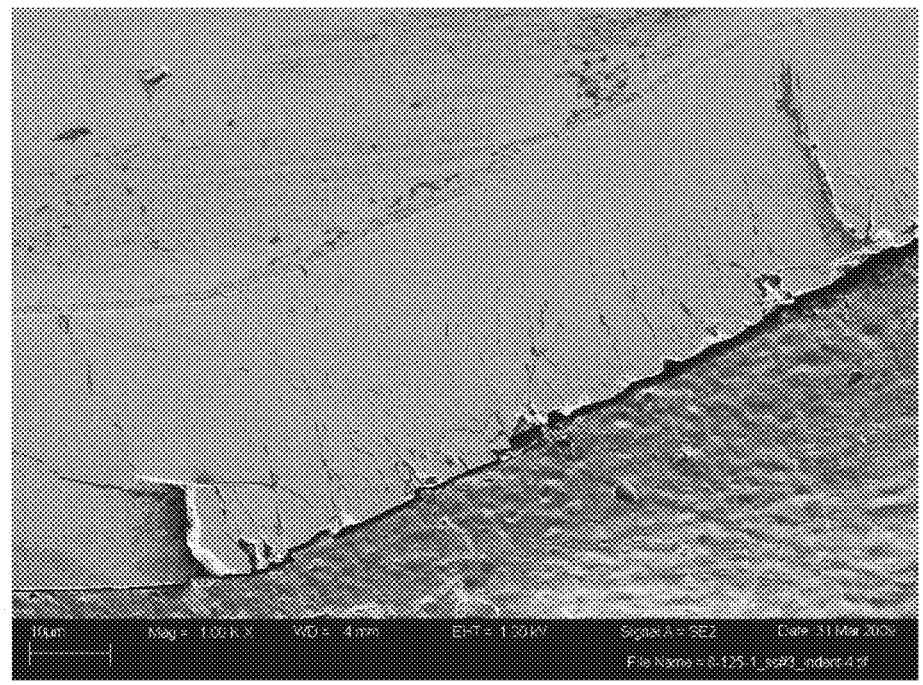
FIGS. 14A and B show SEM micro-images of the cross-section of Rockwell indentations of one exemplary one-segment sub-stoichiometric monolithic TiN coating.
Figure 14B:
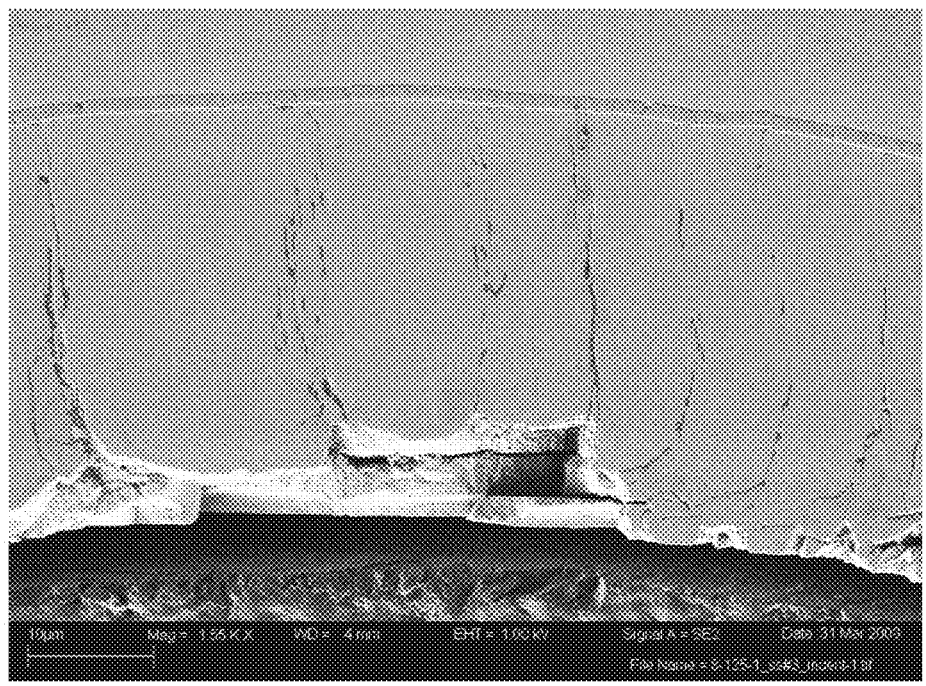

The filtered arc deposition process of the present invention is capable of providing coatings for metal sheets, foil, various instruments and machine components, which protect the surfaces both from wear and corrosion. This is achieved by incorporating metallic elements into the coating such as chrome, aluminum molybdenum either in the metallic sublayers of the multilayer coating architecture or, alternatively, by reducing the concentration of the non-metallic elements such as oxygen, nitrogen or carbon resulting in sub-stoichiometric ceramic and cermet coating with considerable content of elemental metals identical to some of the metallic elements contained in the metal substrate. This substantially reduces or completely eliminates the coating-to-substrate galvanic coupling which otherwise may cause corrosion in a corrosive environment. An example of the composition of nanocomposite sub-stoichiometric coating, which is able to protect the compressor blades of a turbine engine made of 17-4PH stainless steel both from sand and rain erosion and corrosion, is a $(Ti,Cr,Al)_xN_{1-x}$ composition consisting of about 1% to about 20% free elemental chrome and less than about 40% elemental nitrogen. FIGS. 13A-C show mechanical properties of sub-stoichiometric TiN coating vs. nitrogen flowrate during LAFAD titanium nitride coating deposition process. FIGS. 13A-C demonstrate that TiN mechanical properties can be controlled by varying the nitrogen content in a coating. It can be seen that hardness (FIG. 13B) and elastic modulus (FIG. 13A) of sub-stoichiometric coating increase with the nitrogen flowrate and reach the maximum in stoichiometric composition, while the H/E (hardness/elasticity) ratio (FIG. 13C) representing coating toughness reaches the maximum in sub-stoichiometric composition. The cross-section of the Rockwell indentation of sub-stoichiometric TiN coating presented in FIGS. 14A and 14B shows substantially reduced density of cracks, which demonstrates the improved fracture resistance of the sub-stoichiometric coating.

Figure 15:
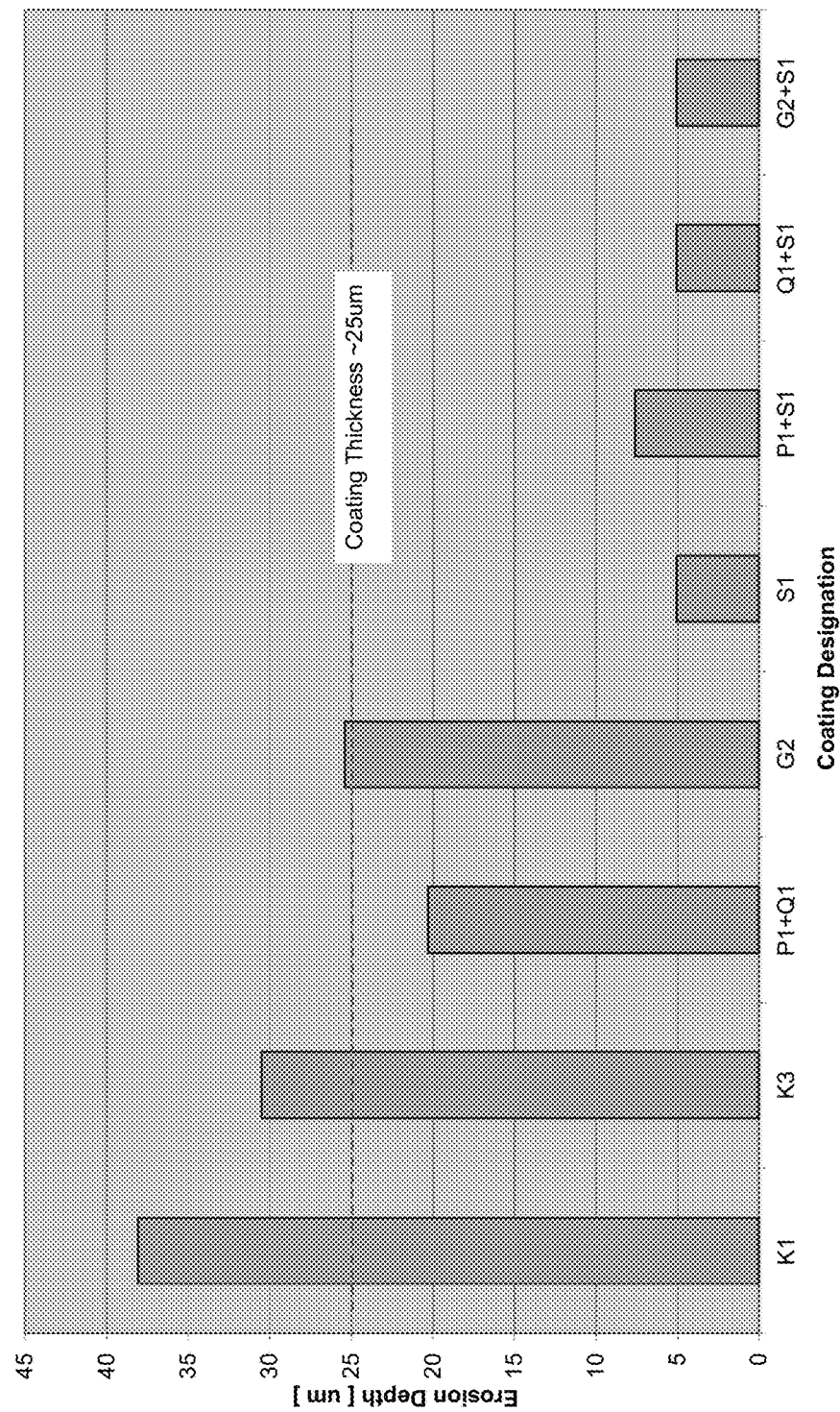
FIG. 15 shows exemplary erosion depth produced by 50 um alumina at 20° angle of impact.
Figure 16:
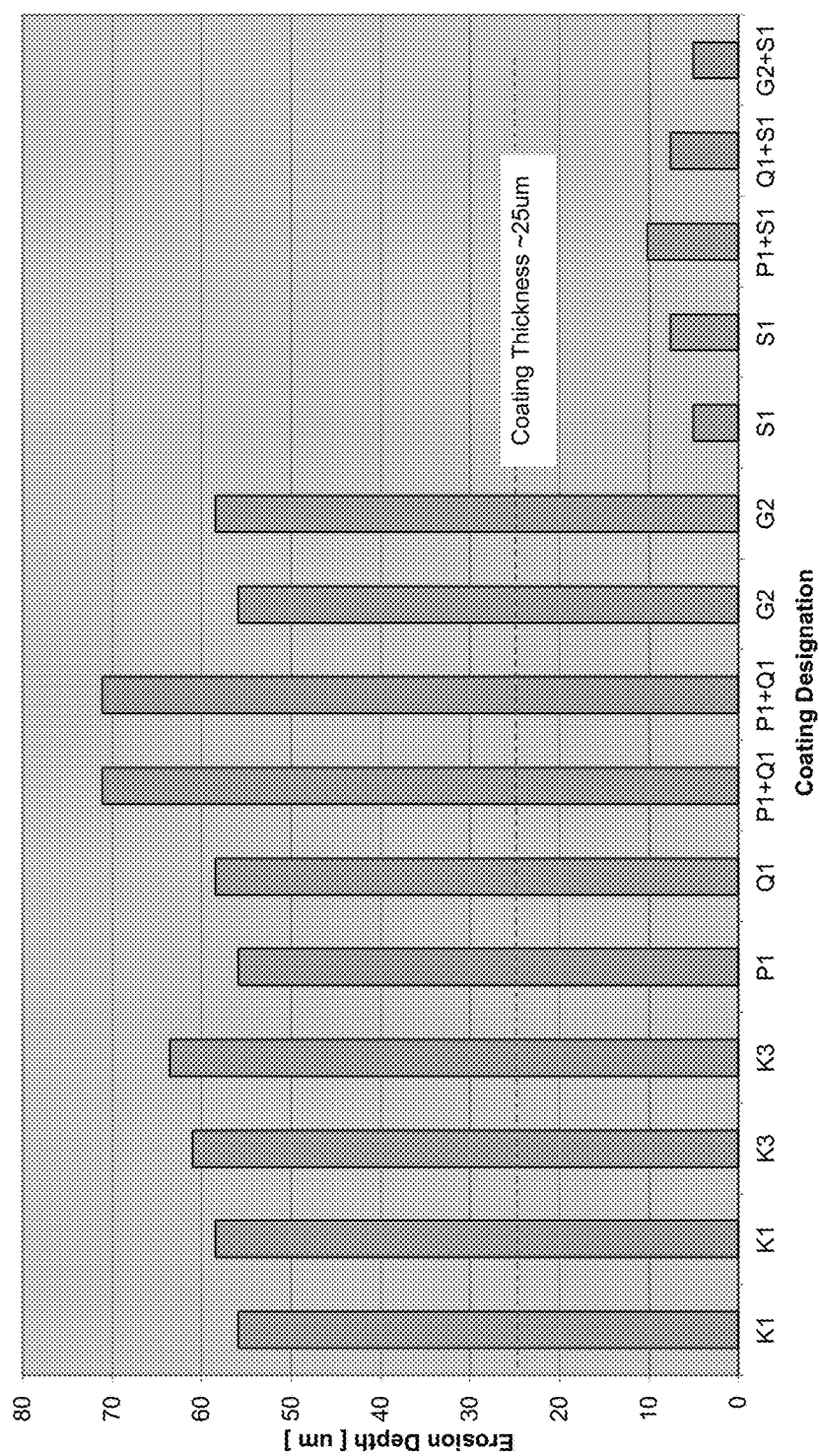
FIG. 16 shows exemplary erosion depth produced by 50 um alumina at 90° angle of impact.
Figure 17:
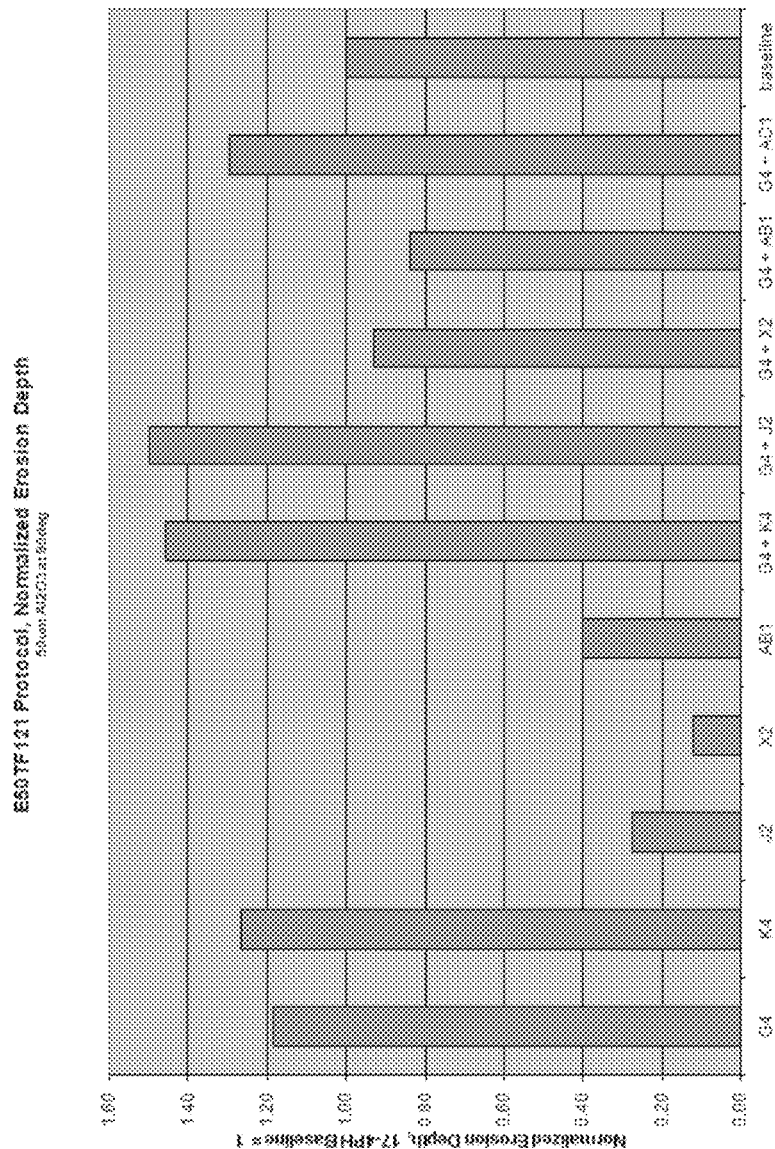
FIG. 17 shows another set of exemplary test results of erosion depth produced by 50 um alumina at 90° angle of impact.
Figure 18:
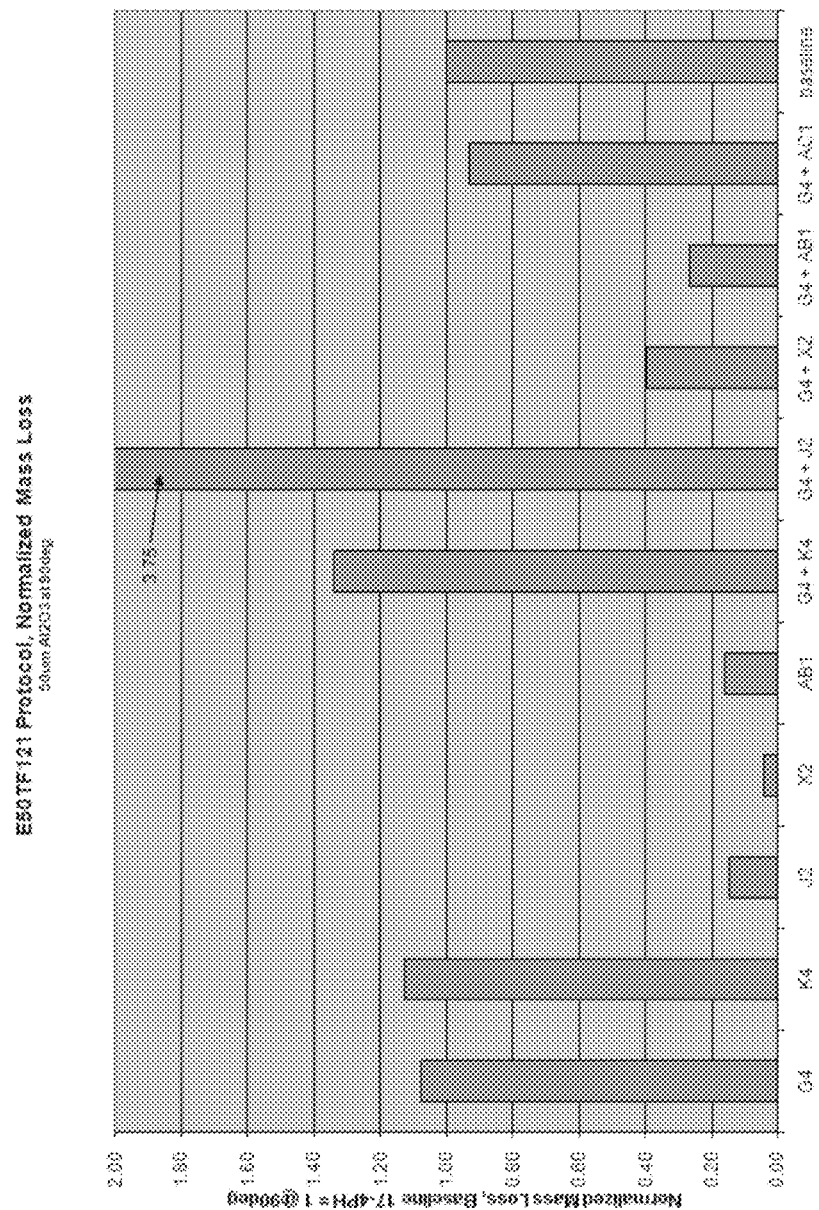
FIG. 18 shows exemplary mass loss produced by 50 um alumina at 90° angle of impact.
Figure 19:
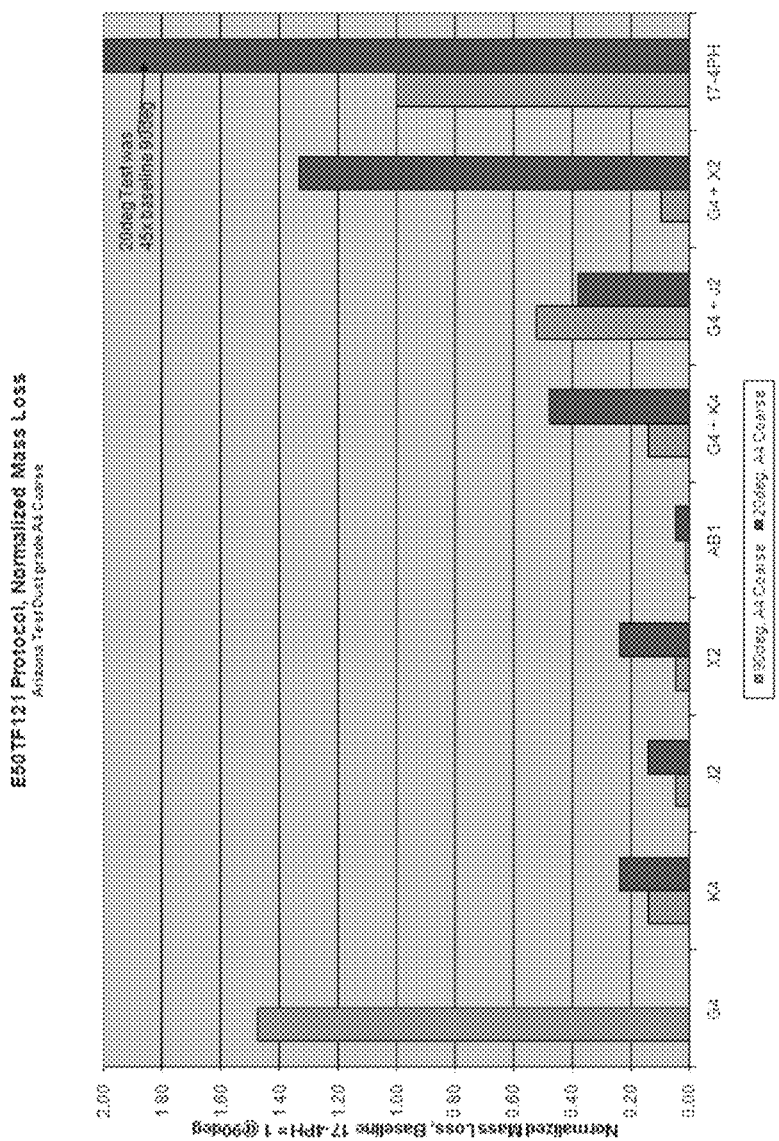
FIG. 19 shows exemplary loss produced by Arizona Test Dust grade A4 Coarse at 90° and 20° angles of impact.
Figure 20:
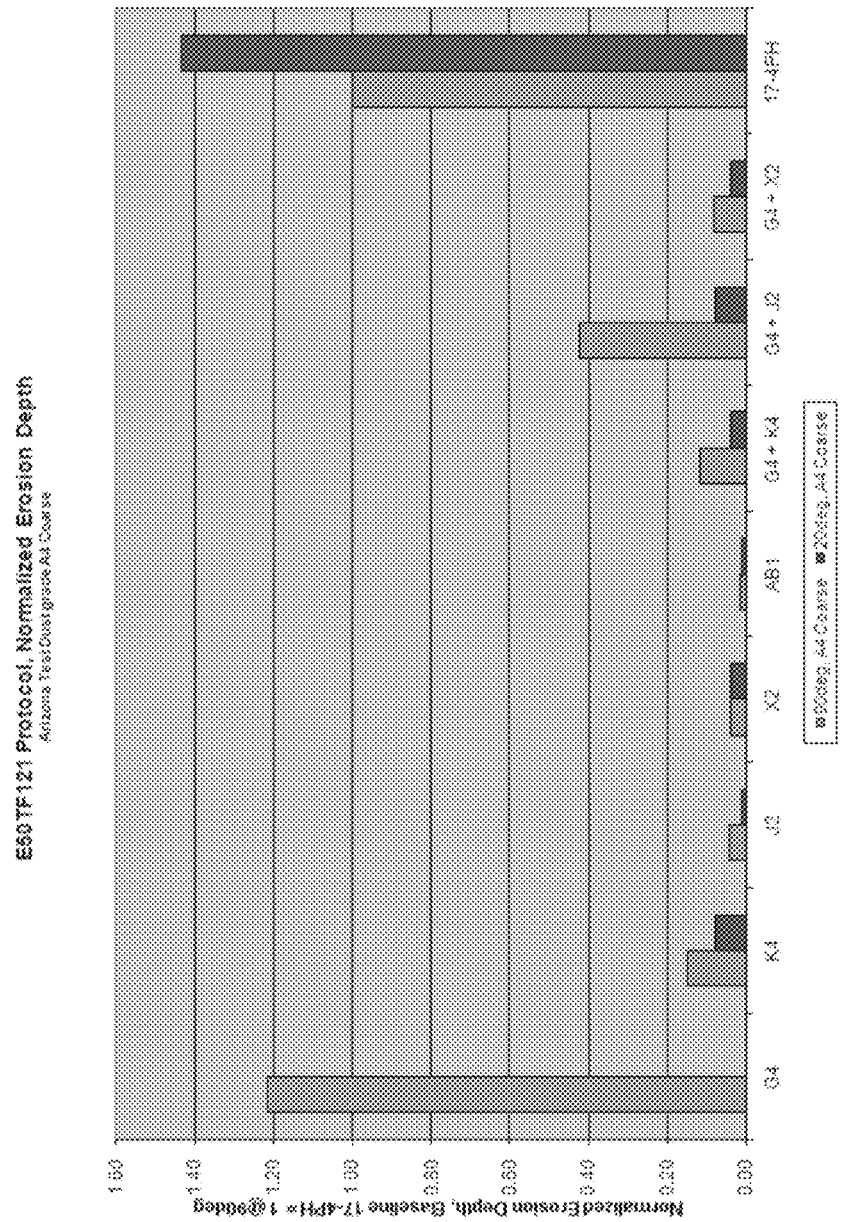
FIG. 20 shows exemplary depth produced by Arizona Test Dust grade A4 Coarse at 90° and 20° angles of impact.

Example 6: Evaluation of a Group of One-Segment and Two-Segment Coatings by their Erosion Resistance Performance Several one-segment and two-segments coatings deposited by LAFAD process were subjected to erosion testing according to the GE ET50TF121 test protocol. The mechanical properties and thickness of these coatings are presented in Table 2 shown in FIG. 21. The deposition times of metallic Ti sublayers vs. TiN ceramic sublayers are also shown in Table 2. Smaller deposition time corresponds to thinner sublayer. In this erosion testing, rectangular titanium coupons, having dimensions 1"×2"×0.050", were subjected to impact with a jet of alumina powder having an average particle size of 50 µm at two different impact angles: 20° and 90°. The weight of abrasive powder erodent used in one test was 600 g and the powder impacted the surface of the coupons at rate of 6.5 g/sec. The flowrate and powder speed were calibrated using identically shaped samples made of Lexan polymeric material. The loss of coating thickness was measured after testing to characterize the erosion resistance performance of the coating. The result of this testing is presented in FIGS. 15 (20°) and 16 (90°). It can be seen that sub-stoichiometric TiN coating, both as a one-segment and as a top segment of the two-segment coating architecture, overperformed multilayer coatings. This can be attributed to high toughness of this coating as indicated by higher H/E ratio in Table 2. Another group of coatings similar to the coatings described in Table 2 was subjected to erosion testing based on GE ET50TF121 test protocol using 50 µm Al2O3 powder as an erodent media at 90° impact. The results of coating performance in this test, both for the normalized erosion depth and normalized mass loss, are shown in FIGS. 17 and 18. These coatings are described in Table 5 shown in FIG. 24. These results support the conclusion of superior erosion resistance performance of sub-stoichiometric coating (X2) vs. multilayer coatings, when tested according to the GE ET50TF121 test protocol. The monolithic single segment coating (J2) and two-layer Ti/TiN coating also performed well in this test. The same group of coating was further subjected to the GE ET50TF121 test protocol at 20° and 90° impact using Arizona Dust A4 Coarse powder with particles larger than 100 µm as erodent media. 600 g of this erodent powder at a rate of ~4 g/sec was used in each of these tests. The results of these tests are presented in FIG. 19 (normalized mass loss) and FIG. 20 (normalized erosion depth). These results, as well as description of the coating, are also presented quantitatively in Tables 3 and 4 shown in FIGS. 23 and 24. These tables also describe if the coating was breached to expose a bear metal substrate after the test. It can be seen that both sub-stoichiometric (X2), dual metal/ceramic (AB1) and monolithic (J2) coatings deposited by LAFAD process perform extremely well in this test. Dual segment coatings similar to that shown in FIG. 3 (G4+K4) as well as ultrathick nanolaminated K4 coating also performed good in this test. The following overall ranking of the coatings can be prepared based on testing results per the GE ET50TF121 test protocol: the best coating is dual layer consisting of the first titanium metallic layer followed by ultra-thick TiN ceramic layer (AB1), the second best is monolithic TiN J2 coating and the $3^{rd}$ best is sub-stoichiometric X2 coating.

When appropriate, the coating architecture (eg. a sequence of Me/ceramic bilayers) is applied, a simple cold work or appropriate heat treatment can be applied to maintain the distortion of the coated metal sheet substrates for both straight substrates and substrates shaped to the desirable geometries.

In a further advanced embodiment of the invention the coating has two segments forming a duplex architecture as illustrated in FIG. 4. The bottom segment 402 interfacing with the substrate 401 is formed by non-vacuum processing such as electroplating, plasma spray, thermal spray, cold spray, HVOF or a similar process. The thickness of this layer ranges from 50 to 1000 µm followed by top segment 403 deposited by LAFAD process, which can be monolithic or multilayer (as shown in FIG. 3a) and can itself consists of several sub-segments with a total thickness ranging from 50 µm to 500 µm. The role of the bottom segment in this duplex coating architecture is to accommodate coating stress and reduce or completely eliminate deformation of the substrate due to a thick cermet coating. It also increases the flexibility of the substrate-coating system which makes this type of surface engineered protector easier to apply to the helicopter rotorblades.

The following example illustrates the process of deposition of a two segment duplex erosion resistant coating.

Example 7: Thin Metal Foil with Duplex Erosion Resistant Coating for Protection of Helicopter Rotorblades Another approach based on using LAFAD cermet coatings for sand and rain erosion protection of the helicopter rotorblades is utilizing thin sheets of stainless steel having thicknesses ranging from about 40 µm to about 250 µm as the substrate material. A two-segment LAFAD coating having an architecture described in Example 1 and illustrated in FIG. 3a was deposited on thin sheet metal strips having a dimension of 4" width×10" long. The resulting thin sheet metal strips were prepared to be attached around the end of the helicopter rotor blade for protection against sand and rain erosion. An appropriate epoxy-like compound can be used to attach the coated thin sheet metal strip to the helicopter rotorblades. The metal foil coated with the hard cermet LAFAD coating having multilayer duplex architecture is flexible allowing it to be applied to complex shape components without breaking the coating.

Example 8: Deposition of Duplex Ni+Ti/TiN Coating by Cold Spray Followed by LAFAD Process In this example, a 2-segment duplex coating is deposited on rectangular aluminum coupons. The substrate material used in this study is 6061-T6511 aluminum. The typical dimensions of the substrate were 3.0"×1.5"×0.50". Prior to the coating deposition process, the substrate coupons are subjected to wet blasting pre-treatment to improve coating adhesion and accommodate intrinsic stresses in the coatings. A cold-spray powder deposition process is used for deposition of a bottom metallic segment of the coating.

This process, also known as Supersonic Particle Deposition (SPD), is a process whereby metal powder particles are utilized to form a coating by means of ballistic impingement upon a suitable substrate as described in V. Champagne, D. Helfritch, P. Leyman, S. Grendahl, and B. Klotz, "Formation of 'Super Plastic Agglomerate Mixing' (SPAM) Between Copper and 6061-T6511 Aluminum Deposited by the Supersonic Deposition Process (SPD)", ASM Surface Engineering Congress, 15-18 Sep. 2003. The metal powders range in particle size from <5-50 microns and are accelerated by a supersonic (300-1000 m/s) stream of compressed gas. The spray nozzle design incorporates the use of a converging-diverging throat, through which a preheated gas stream is expanded to attain supersonic velocities, with an accompanying decrease in temperature. The ceramic powders, for example WC or $B_4C$, may be added to the metallic powder to increase the hardness and wear resistance of the resulting cold spray coating segment. The term "cold spray" has been used to describe this process due to the relatively low temperatures (0-500° C.) of the expanded gas particle stream that exits the nozzle. The aluminum substrates are placed from 15 to 35 mm from the nozzle exit aperture and coated with nickel to approximately 1 mm in thickness. The coatings are deposited using helium as the powder accelerating gas. The nickel coated aluminum samples are removed from the SPD coating system, and the cold spray coating surface is polished to remove any surface asperities, and subsequently cleaned ultrasonically in acetone and isopropyl alcohol before loading in the LAFAD coating system for deposition of the top cermet coating consisting of two multilayer sections similar to one shown in FIG. 3a. The bottom segment of the top cermet coating consists of 10 Ti/TiN bi-layers with respective ceramic TiN layers having thickness ranging from 5 to 10 µm separated by Ti metallic layers having thickness ranging from 0.5 to 2 µm. The total thickness of the bottom segment of the top cermet coating is 60 µm. The top segment of the top cermet coating consists of 40 Ti/TiN bi-layers with ceramic TiN layers having thickness ranging from 1 to 3 µm and Ti metallic layers having submicron thickness ranging from 0.1 to 0.5 µm. The total thickness of the top segment of the top cermet coating is 50 µm. This coating architecture is shown schematically in FIG. 4. It consists a metal substrate 401, a cold spray metallic layer 402, a bottom multilayer LAFAD coating segment 403 and a top multilayer LAFAD coating segment 404. This allows use of an inexpensive and light aluminum as a substrate metal coated with duplex Ni(SPD)+Ti/TiN (LAFAD) coatings for protectors of the helicopter rotorblades. These protected rotorblades will be nearly 3 times lighter than protectors traditionally made of stainless steel and 2 times lighter than protectors made of titanium.

This conceptual coating design was experimentally proved by deposition of a ~300 µm thick GK coating, similar to one shown in FIG. 3a, on a top of a ~300 µm thick nickel coating deposited on a stainless steel substrate by cold spray deposition process. SEM images of this coating with different magnifications are shown in FIGS. 25a and b. It can be seen that cold spray coating is developing a waving pattern at the cold spray nickel to LAFAD GK coating segment interface. This waving pattern has resulted in improved adhesion of the LAFAD coating to cold spray bottom coating segment.

Example 9: Deposition of Duplex NiTi+Ti/TiN Coating by Cold Spray Followed by LAFAD Process In this example, a 2-segment duplex coating is deposited on rectangular aluminum coupons. The 2-segment duplex coating consists of a bottom segment made of equiatomic NiTi shape memory alloy followed by Ti/TiN multilayer top coating segment. Coupons of the same size and materials as in Example 3 are used. The same cold-spray SPD process, as discussed in Example 8, is used for deposition of NiTi alloy, which resulted in deposition of 1 mm bottom segment NiTi coating. The top segment Ti/TiN microlaminated LAFAD coating is deposited using the same deposition time and same other coating process parameters to a thickness of 120 µm. This coating architecture is shown schematically in FIG. 4. It consists of a metal substrate 401, a cold spray metallic layer 402, a bottom multilayer LAFAD coating segment 403 and a top multilayer LAFAD coating segment 404.

The deposition of NiTi alloys for erosion and corrosion protection was previously described in U.S. Pat. No. 6,043,451 to Julien et al. issued Mar. 28, 2000 which is incorporated herein as reference. In U.S. Pat. No. 6,043,451, the deposition of the NiTi alloy was made by arc plasma spray process, wherein the metal particles are heated to the melting temperature. It is known that NiTi alloy loses its shape memory properties after heating it to high temperatures. The advantage of having NiTi alloy or Nitinol as a bottom segment coating is its vibration damping ability which would be lost after overheating in a plasma spray process. However, when using the cold spray deposition process of the present invention, the Nitinol segment can be deposited without detrimental effect on its vibration damping properties. The top cermet segment of multilayer Ti/TiN coating deposited by LAFAD process is aimed to provide erosion resistance protection which metallic layers don't have.

Example 10: Deposition of NiCrAlY Bond Coating on Turbine Blades by Hybrid Filtered Cathodic Arc-Magnetron Sputtering Deposition Process In this example, a monolithic NiCrAlY coating is applied by hybrid filtered cathodic arc-magnetron sputtering deposition technology for deposition of bond coating on airfoils of turbine engine. As in Example 3, the coating system shown schematically in FIG. 1 is used for this coating deposition process. The airfoils were installed at turntable 2 with ability of double rotation as shown in airfoil sample 4a in FIG. 1, wherein airfoil sample 4a further undergoes rotation about a longitudinal axis of airfoil sample 4a. This longitudinal axis is parallel to the rotation axis of turntable 2. Cathodic arc targets 12 of the primary cathodic arc sources of filtered arc source 1a are made of chromium, while the magnetron targets of the coincided magnetrons 245c,d magnetically coupled with filtered arc source 1a are made of Ni-10% Al-1% Y alloy. Cathode targets 12 of the primary cathodic arc sources of filtered arc source 1b are made of titanium and are further aimed on generation of remote arc discharge between (a) primary cathodic arc targets 12 of the filtered arc source 1b operating in the magnetically shuttered mode, and (b) remote anode 70 in coating chamber 42. The airfoils are subjected to wet blasting, dry blasting, glass bed peening or laser peening pre-treatment before being loaded in coating chamber 42 for plasma processing. After heating the substrates (airfoils) by chamber heaters 75 to 400° C. in argon at 5 mtorr, the ion cleaning stage is performed in an argon remote arc discharge plasma with substrates to be coated 4 biased at −500V. The ion cleaning stage is followed by a 5 min metal etching stage, wherein the substrates to be coated 4 are exposed to chromium metal vapor plasma generated by filtered arc source 1b. During the metal etching stage, filtered arc source 1b is operated in magnetic shutter open mode with deflecting coils 20 and focusing coil 21 activated to transport metal vapor plasma generated by the primary cathodic arc sources toward coating chamber 42 with substrates to be coated 4. During the metal etching stage, the substrate bias is increased to −1000V. After the metal etching stage, the substrate bias is reduced to −40V, the coincided magnetron sputtering sources 245c,d are activated at a power density ranging from 5 to 20 W/cm$^2$, while filtered arc source 1b continues generating metal vapor plasma toward coating chamber 42. The NiAlY sputtering flow generated by magnetrons 245c,d is codirected with chromium metal vapor plasma generated by filtered arc source 1b toward substrates to be coated 4 (airfoils). During deposition of the first micron of the coating, the deposition rate of chromium exceeds 3 μm/hr, while for the rest of the deposition time, the deposition rate of chromium can be reduced to keep the ratio (metal ions)/(metal ions+metal sputtering atoms) greater than 5%. The total arc current of the primary cathodic arc sources is adjusted to achieve a coating composition of the NiCrAlY bond coating deposited on airfoils with Cr content in the range from 10 to 30%. A deposition time of approximately 20 hrs is chosen to provide a bond coating thickness of approximately 150 μm. Typically, the roughness of thick ceramic and metal-ceramic coatings deposited by condensation of energetic ions generated by the LAFAD process or by the hybrid LAFAD-magnetron sputtering process is characterized by Ra<3 μm when the coating is deposited on substrates having initial roughness characterized by Ra<5 μm. In a refinement, the oxide sublayer, preferably an alumina sublayer, is deposited between the metal airfoil substrate and the bond coating layer. The alumina oxide sublayer thickness typically ranges from 0.01 μm to 1 μm and is beneficial for the thermal stability of the bond coatings at high temperatures.

Combinations of Features

Features described above as well as those claimed below may be combined in various ways without departing from the scope hereof. For example, it will be appreciated that aspects of one coating or coating method, described herein, may incorporate or swap features of another coating or coating method described herein. The following examples illustrate possible, non-limiting combinations of embodiments described above. It should be clear that many other changes and modifications may be made to the methods and device herein without departing from the spirit and scope of this invention:

(A1) An erosion and corrosion resistant protective coating for turbomachinery applications may include at least one coating segment deposited on a surface of a conductive metal substrate that has been subjected to a pre-deposition treatment by at least blasting to provide the surface with texture, wherein each of the at least one coating segment is ceramic or metal-ceramic and has thickness of at least about 5 μm and hardness in range between about 0.3 GPa and about 80 GPa, and wherein the erosion and corrosion resistant coating may have (a) surface roughness characterized by Ra<1 μm and (b) a plurality of dome-like structures with dome width between about 0.01 μm and about 30 μm, and wherein the at least one coating segment may be formed by condensation of ion bombardment from a metal-gaseous plasma flow with the deposition rate of metal ions, at least during deposition of the first micron of the coating segment, being at least 3 μm/hr and the kinetic energy of these metal ions, at least during deposition of the first micron of the coating segment, exceeding 5 eV upon deposition.

(A2) In the erosion and corrosion resistant protective coating denoted as (A1), the dome-like structures may include domes with dome width less than about 1 μm.

(A3) Either or both of the erosion and corrosion resistant protective coatings denoted as (A1) and (A2) may have a top surface furthest from the conductive metal substrate, wherein the surface roughness of the top surface is less than the surface roughness of the surface of the conductive metal substrate.

(A4) Any of the erosion and corrosion resistant protective coatings denoted as (A1) through (A3) may have thickness in the range from about 5 μm to about 40 μm.

(A5) In any of the erosion and corrosion resistant protective coatings denoted as (A1) through (A4), the at least one coating segment may include a metal-ceramic coating segment, wherein the metal-ceramic coating segment includes metal and ceramic content blended into one another by concurrent condensation of ion bombardment from at least two metal-gaseous filtered cathodic arc plasma beams overlapped by magnetic fields, and wherein, at least during deposition of first micron of the metal-ceramic coating segment, the deposition rate of metal ions is at least 3 μm/hr and the kinetic energy of these metal ions exceeds 5 eV upon deposition.

(A6) In the erosion and corrosion resistant protective coating denoted as (A5), the at least one coating segment may include a monolithic metal-ceramic coating segment.

(A7) In any of the erosion and corrosion resistant protective coatings denoted as (A1) through (A6), the at least one coating segment may include a metal-ceramic coating segment having (a) metal content decreasing with distance from the conductive metal substrate and (b) hardness and elastic modulus increasing with distance from the conductive metal substrate.

(A8) In any of the erosion and corrosion resistant protective coatings denoted as (A1) through (A7), the at least one coating segment may include at least one multilayer coating segment, wherein each multilayer coating segment includes one or more bilayers each containing a metal layer overlaid by a ceramic layer.

(A9) In the erosion and corrosion resistant protective coating denoted as (A8), one of the at least one multilayer coating segment may have (a) metal content decreasing with distance from the conductive metal substrate and (b) hardness and elastic modulus increasing with distance from the conductive metal substrate.

(A10) In either or both of the erosion and corrosion resistant protective coatings denoted as (A8) and (A9), the at least one multilayer coating segment may include a bottom multilayer coating segment and a top multilayer coating segment deposited on the bottom multilayer coating segment, wherein the bottom and top multilayer coating segments have combined thickness of at least about 5 µm, with thickness of majority of the bilayers of the bottom multilayer coating segment being smaller than thickness of the bilayers of the top multilayer coating segment.

(A11) In the erosion and corrosion resistant protective coating denoted as (A10), hardness of the bottom multilayer coating segment may be in the range from about 0.3 GPa to about 25 GPa, and hardness of the top multilayer coating segment may be in the range from about 25 GPa to about 80 GPa.

(A12) In any of the erosion and corrosion resistant protective coatings denoted as (A1) through (A11) through of claim 1, the at least one metal ceramic coating segment may include at least one multilayer coating segment, each of which (i) having thickness in range from about 5 µm to about 500 µm, (ii) including a plurality of bilayers each including a metal layer overlaid by a ceramic layer, (iii) having metal content decreasing with distance from the conductive metal substrate, and (iv) having hardness and elastic modulus increasing with distance from the conductive metal substrate.

(A13) In the erosion and corrosion resistant protective coating denoted as (A12), the ratio of the thickness of each metal layer to the thickness of the ceramic layer overlaid thereon may decrease with distance from the conductive metal substrate.

(A14) In either or both of the erosion and corrosion resistant protective coatings denoted as (A12) and (A13), the thickness of each metal layer may decrease with distance from the conductive metal substrate.

(A15) In any of the erosion and corrosion resistant protective coatings denoted as (A12) through (A14), the at least one multilayer coating segment may include a bottom multilayer coating segment and a top multilayer coating segment deposited on the bottom multilayer coating segment, wherein at least one of the multilayer coating segments is within the bottom segment and has thickness of each metal layer between about 0.1 µm and about 5 µm and thickness of each ceramic layer between about 0.2 µm and about 10 µm.

(A16) Any of the erosion and corrosion resistant protective coatings denoted as (A12) through (A15) may further include a monolithic ceramic layer overlaying the at least one multilayer coating segment.

(A17) In any of the erosion and corrosion resistant protective coatings denoted as (A12) through (A16), each metal layer may be substantially composed of a same type of metal as metal component of each ceramic layer.

(A18) In any of the erosion and corrosion resistant protective coatings denoted as (A12) through (A17), each metal layer may be substantially composed of metal selected from the group consisting of titanium, chromium, vanadium, molybdenum, aluminum, hafnium, zirconium, niobium, tungsten, and alloys thereof.

(A19) In any of the erosion and corrosion resistant protective coatings denoted as (A12) through (A18), each ceramic layer may include one or more ceramic compounds selected from the group consisting of: carbides of X, nitrides of X, borides of X, oxides of X, silicites of X, oxycarbides of X, and oxynitrides of X, wherein X is a metal selected from the group consisting of titanium, chromium, vanadium, molybdenum, aluminum, hafnium, zirconium, niobium, tungsten, and alloys thereof.

(A20) In any of the erosion and corrosion resistant protective coatings denoted as (A12) through (A19), the ceramic layers proximate the conductive metal substrate having a lesser concentration of non-metallic elements than the ceramic layers further from the conductive metal substrate.

(A21) In any of the erosion and corrosion resistant protective coatings denoted as (A1) through (A20), the at least one coating segment may have concentration of non-metallic elements increasing with distance from the conductive metal substrate.

(A22) Any of the erosion and corrosion resistant protective coatings denoted as (A1) through (A21) may further include a carbon diamond-like coating having a hardness from about 30 to about 80 GPa and thickness from about 5 µm to about 150 µm.

(A23) In the erosion and corrosion resistant protective coating denoted as (A22), the carbon diamond-like coating may include metal and be implemented as a top segment of the at least one coating segment deposited.

(A24) In any of the erosion and corrosion resistant protective coatings denoted as (A1) through (A23), the conductive metal substrate may be substantially composed of a material selected from the group consisting of titanium alloy, nickel alloy, and stainless steel.

(A25) In any of the erosion and corrosion resistant protective coatings denoted as (A1) through (A24), the side of the conductive metal substrate opposite the surface may include a pattern of grooves.

(A26) In any of the erosion and corrosion resistant protective coatings denoted as (A1) through (A25), the surface of the conductive metal substrate may have a pattern of grooves.

(A27) In any of the erosion and corrosion resistant protective coatings denoted as (A1) through (A26), the side of the conductive metal substrate opposite the deposition surface of the metal conductive substrate may have a grid attached thereto.

(A28) Any of the erosion and corrosion resistant protective coatings denoted as (A1) through (A27) may be discontinuous and form repeated geometrical shapes separated by narrow uncoated ribbons.

(A29) In any of the erosion and corrosion resistant protective coatings denoted as (A1) through (A28), the at least one coating segment may include one or more ceramic compounds selected from the group consisting of: carbides of X, nitrides of X, carbonatides of X, oxycarbides of X, and oxynitrides of X, X being a metal selected from the group consisting of titanium, chromium, vanadium, molybdenum, aluminum, hafnium, zirconium, niobium, tungsten, and alloys thereof.

(A30) Any of the erosion and corrosion resistant protective coatings denoted as (A1) through (A29) may further include a base metal layer applied to the conductive metal substrate to be overlaid by the at least one multilayer coating segment.

(A31) In the erosion and corrosion resistant protective coating denoted as (A30), the base metal layer may be applied to the conductive metal substrate by a method selected from the group consisting of cold spray, thermal spray, HVOF, D-gun, and electroplating.

(A32) In either or both of the erosion and corrosion resistant protective coatings denoted as (A30) and (A31), the base metal layer may have a thickness in the range from about 20 μm to about 1 mm.

(A33) Any of the erosion and corrosion resistant protective coatings denoted as (A1) through (A32) may have toughness characterized by H/E>0.02.

(A34) In any of the erosion and corrosion resistant protective coatings denoted as (A1) through (A33), each of the at least one coating segment may be formed at least in part by simultaneous condensation of (i) the metal ions from a filtered arc source and (ii) metal atoms from a sputtering or evaporation source.

(A35) In the erosion and corrosion resistant protective coating denoted as (A34), deposition onto the conductive metal substrate of the metal atoms may spatially overlap with deposition onto the conductive metal substrate of the metal ions, while ratio of metal ion flux to combined flux of metal ions and metal atoms being greater than 5%.

(A36) In the erosion and corrosion resistant protective coating denoted as (A35), the ratio of metal ion flux to combined flux of metal ions and metal atoms may decrease from the initial stage of deposition to a later stage of deposition.

(B1) An erosion and corrosion resistant protective coating for turbomachinery applications may include (a) at least one ceramic or metal-ceramic coating segment deposited on a surface of a conductive metal substrate that has been subjected to a pre-deposition treatment by at least blasting to provide the surface of the conductive metal substrate with texture, wherein each ceramic or metal-ceramic coating segment is formed by concurrent condensation of ion bombardment from metal-gaseous plasma flow and nearly 100% ionized metal atoms, and wherein, at least during deposition of the first micron of the at least one ceramic or metal-ceramic coating segment, deposition rate of metal ions is at least 3 μm/hr while kinetic energy of metal ions exceeds at least 5 eV upon deposition, and wherein each coating segment has thickness of at least about 5 μm, and (b) an array of dome-like surface structures with a dome width of about 0.01 μm to about 30 μm.

(B2) In the erosion and corrosion resistant protective coating denoted as (B1), the array of dome-like surface structures may form at least part of a surface of the at least one ceramic or metal-ceramic coating segment furthest from the conductive metal substrate.

(B3) In either or both of the erosion and corrosion resistant protective coatings denoted as (B1) and (B2), the array of dome-like surface structures may include domes with a dome width less than about 1 μm.

(B4) Any of the erosion and corrosion resistant protective coatings denoted as (B1) through (B3) may have thickness in the range from about 5 μm to about 40 μm.

(B5) In any of the erosion and corrosion resistant protective coatings denoted as (B1) through (B4), the at least one ceramic or metal-ceramic coating segment may include a metal layer and a ceramic layer blended into one another by concurrent condensation of ion bombardment from at least two metal-gaseous filtered cathodic arc plasma beams overlapped by a filtering focusing magnetic field.

(B6) In any of the erosion and corrosion resistant protective coatings denoted as (B1) through (B5), the pre-deposition treatment may include blasting to provide the surface with a pattern of cold work spots without changing surface roughness.

(B7) In any of the erosion and corrosion resistant protective coatings denoted as (B1) through (B6), the pre-deposition treatment may include powder spray coating.

(B8) Any of the erosion and corrosion resistant protective coatings denoted as (B1) through (B7) may have hardness from about 18 Gpa to about 80 Gpa.

(B9) In any of the erosion and corrosion resistant protective coatings denoted as (B1) through (B8), the texture of the surface following pre-deposition treatment may have a surface roughness characterized by Ra>0.1 μm.

(B10) Any of the erosion and corrosion resistant protective coatings denoted as (B1) through (B9) may have a top surface, furthest from the conductive metal substrate, with surface roughness characterized by Ra<3 μm.

(B11) Any of the erosion and corrosion resistant protective coatings denoted as (B1) through (B10) surface roughness of the top surface may be less than surface roughness of the metal substrate.

(C1) An erosion and corrosion resistant protective coating for turbomachinery applications may include at least one coating segment each being ceramic or metal-ceramic and having thickness of at least about 5 μm and hardness in range between about 0.3 GPa and about 80 GPa, wherein the erosion and corrosion resistant coating has roughness characterized by Ra<1 μm, and dome-like structures with dome width between about 0.01 μm and about 30 μm.

(C2) In the erosion and corrosion resistant protective coating denoted as (C1), the dome-like structures may include domes with dome width less than about 1 μm.

(C3) Either or both of the erosion and corrosion resistant protective coatings denoted as (C1) and (C3) may have thickness in range from about 5 μm to about 40 μm.

(C4) In any of the erosion and corrosion resistant protective coatings denoted as (C1) through (C3), the at least one coating segment may include a metal-ceramic coating segment, wherein the metal-ceramic coating segment includes metal and ceramic content blended into one another.

(C5) In the erosion and corrosion resistant protective coating denoted as (C4), the metal-ceramic coating segment may be monolithic.

(C6) In either or both of the erosion and corrosion resistant protective coatings denoted as (C4) and (C5), the metal-ceramic coating segment may have (a) metal content decreasing with distance from a substrate on which the erosion and corrosion resistant protective coating is deposited and (b) hardness and elastic modulus increasing with distance from the substrate.

(C7) In the erosion and corrosion resistant protective coating denoted as (C4), the at least one coating segment may include at least one multilayer coating segment, each including one or more bilayers each containing a metal layer overlaid by a ceramic layer.

(C8) In the erosion and corrosion resistant protective coating denoted as (C7), the one or more bilayers may be a plurality of bilayers.

(C9) In the erosion and corrosion resistant protective coating denoted as (C8), one of the at least one multilayer segment may have (a) metal content decreasing with distance from a substrate on which the erosion and corrosion resistant protective coating is deposited and (b) hardness and elastic modulus increasing with distance from the substrate.

(C10) In either of both of the erosion and corrosion resistant protective coatings denoted as (C8) and (C9), the at least one multilayer coating segment may include a bottom multilayer coating segment and a top multilayer coating segment deposited on the bottom multilayer coating segment, wherein the bottom and top multilayer coating segments have combined thickness of at least about 5 μm, with thickness of the bilayers of the bottom multilayer coating segment being generally smaller than thickness of the bilayers of the top multilayer coating segment.

(C11) In the erosion and corrosion resistant protective coating denoted as (C10), hardness of the bottom multilayer coating segment may be in the range from about 0.3 GPa to about 25 GPa, and hardness of the top multilayer coating segment may be in the range from about 25 GPa to about 80 GPa.

(C12) In any of the erosion and corrosion resistant protective coatings denoted as (C1) through (C11), the at least one coating segment may include at least one multilayer coating segment (i) having thickness in range from about 5 μm to about 500 μm, (ii) including a plurality of bilayers each including a metal layer overlaid by a ceramic layer, (iii) having metal content decreasing with distance from a substrate on which the erosion and corrosion resistant protective coating is deposited, and (iv) having hardness and elastic modulus increasing with distance from the substrate.

(C13) In the erosion and corrosion resistant protective coating denoted as (C12), the ratio of the thickness of the metal layer to the thickness of the ceramic layer overlaid thereon may decrease with distance from the substrate.

(C14) In either or both of the erosion and corrosion resistant protective coatings denoted as (C12) and (C13), the thickness of the metal layers may decrease with distance from the substrate.

(C15) In any of the erosion and corrosion resistant protective coatings denoted as (C12) through (C14), at least one of the multilayer coating segments may be within a bottom segment, closest to the substrate, and have thickness of each metal layer in the range between about 0.1 μm and about 5 μm and thickness of each ceramic layer in the range between about 0.2 μm and about 10 μm.

(C16) Any of the erosion and corrosion resistant protective coatings denoted as (C12) through (C15) may include a continuous monolithic ceramic layer overlaying the at least one multilayer coating segment.

(C17) In any of the erosion and corrosion resistant protective coating denoted as (C12) through (C16), each metal layer may be substantially composed of the same type of metal as the metal component of each ceramic layer.

(C18) In any of the erosion and corrosion resistant protective coating denoted as (C12) through (C17), each metal layer may being substantially composed of metal selected from the group consisting of titanium, chromium, vanadium, molybdenum, aluminum, hafnium, zirconium, niobium, tungsten, and alloys thereof.

(C19) In any of the erosion and corrosion resistant protective coating denoted as (C12) through (C18), each ceramic layer may include one or more ceramic compounds selected from the group consisting of: carbides of X, nitrides of X, carbonatides of X, oxycarbides of X, and oxynitrides of X, wherein X is a metal selected from the group consisting of titanium, chromium, vanadium, molybdenum, aluminum, hafnium, zirconium, niobium, tungsten, and alloys thereof.

(C20) In any of the erosion and corrosion resistant protective coating denoted as (C12) through (C19), concentration of non-metallic elements in the ceramic layers may be less for the ceramic layers proximate the substrate than for the ceramic layers further from the substrate.

(C21) In any of the erosion and corrosion resistant protective coating denoted as (C12) through (C20), concentration of non-metallic elements may decrease with distance from the substrate.

(C22) Any of the erosion and corrosion resistant protective coatings denoted as (C1) through (C21) may further include a carbon diamond-like coating having hardness from about 30 to about 80 GPa and thickness from about 5 μm to about 150 μm.

(C23) In the erosion and corrosion resistant protective coating denoted as (C22), the carbon diamond-like coating may include metal and be implemented as a top segment of the at least one coating segment furthest from the substrate.

(C24) Any of the erosion and corrosion resistant protective coatings denoted as (C1) through (C23) may be discontinuous and form repeated geometrical shapes separated by narrow uncoated ribbons.

(C25) In any of the erosion and corrosion resistant protective coatings denoted as (C1) through (C24), the at least one coating segment may include one or more ceramic compounds selected from the group consisting of: carbides of X, nitrides of X, carbonatides of X, oxycarbides of X, and oxynitrides of X, wherein X is a metal selected from the group consisting of titanium, chromium, vanadium, molybdenum, aluminum, hafnium, zirconium, niobium, tungsten, and alloys thereof.

(C26) Any of the erosion and corrosion resistant protective coatings denoted as (C1) through (C25) may have toughness characterized by $H/E>0.02$.

(D1) An erosion and corrosion resistant protective coating for turbomachinery applications may include at least one ceramic or metal-ceramic coating segment having an array of dome-like surface structures with a dome width in the range from about 0.01 μm to about 30 μm.

(D2) In the erosion and corrosion resistant protective coating denoted as (D1), the array of dome-like surface structures may form at least part of a surface of the at least one ceramic or metal-ceramic coating segment furthest from a substrate on which the erosion and corrosion resistant protective coating is deposited.

(D3) In either or both of the erosion and corrosion resistant protective coatings denoted as (D1) and (D2), the array of dome-like surface structures may include domes with a dome width less than about 1 μm.

(D4) Any of the erosion and corrosion resistant protective coatings denoted as (C1) through (D3) may have thickness in the range from about 5 μm to about 40 μm.

(D5) In any of the erosion and corrosion resistant protective coatings denoted as (D1) through (D4), the at least one ceramic or metal-ceramic coating segment may include a metal layer and a ceramic layer blended into one another by concurrent condensation of ion bombardment from at least two metal-gaseous filtered cathodic arc plasma beams overlapped by a filtering focusing magnetic field.

(D6) Any of the erosion and corrosion resistant protective coatings denoted as (D1) through (D5) may have hardness in the range from about 18 Gpa to about 80 Gpa.

(D7) In any of the erosion and corrosion resistant protective coating denoted as (D1) through (D6), surface on which the erosion and corrosion resistant protective coating is deposited may be textured and have surface roughness characterized by $Ra>0.1$ μm.

(D8) Any of the erosion and corrosion resistant protective coating denoted as (D1) through (D7) may have a top surface, furthest from a substrate on which the erosion and corrosion resistant protective coating is deposited, with surface roughness characterized by Ra<3 µm.

(D9) Any of the erosion and corrosion resistant protective coating denoted as (D1) through (D8) may have a top surface furthest from a substrate on which the erosion and corrosion resistant protective coating is deposited, wherein the surface roughness of the top surface is less than the surface roughness of the metal substrate.

It is understood that the foregoing examples are merely illustrative of the present invention. Certain modifications of the articles and/or methods employed may be made and still achieve the objectives of the invention. Such modifications are contemplated as within the scope of the claimed invention.

What is claimed is:

1. An erosion and corrosion resistant protective coating for turbomachinery applications, comprising:
   at least one coating segment deposited on a surface of a conductive metal substrate subjected to a pre-deposition treatment by at least blasting to provide the surface with texture, each of the at least one coating segment being ceramic or metal-ceramic and having thickness of at least about 5 µm and hardness in range between about 0.3 GPa and about 80 GPa;
   the erosion and corrosion resistant coating having surface roughness characterized by Ra<1 µm, and a plurality of dome-like structures with dome width between about 0.01 µm and about 30 µm; and
   the at least one coating segment being formed by condensation of ion bombardment from a metal-gaseous plasma flow, wherein, at least during deposition of the first micron of the at least one coating segment, deposition rate of metal ions is at least 3 µm/hr and kinetic energy of the metal ions exceeds 5 eV upon deposition.

2. The erosion and corrosion resistant protective coating of claim 1, the dome-like structures including domes with dome width less than about 1 µm.

3. The erosion and corrosion resistant protective coating of claim 1, having a top surface furthest from the conductive metal substrate, surface roughness of the top surface being less than surface roughness of the surface of the conductive metal substrate.

4. The erosion and corrosion resistant protective coating of claim 1, having thickness in range from about 5 µm to about 40 µm.

5. The erosion and corrosion resistant protective coating of claim 1, the at least one coating segment comprising a metal-ceramic coating segment having (a) metal content decreasing with distance from the conductive metal substrate and (b) hardness and elastic modulus increasing with distance from the conductive metal substrate.

6. The erosion and corrosion resistant protective coating of claim 1, the at least one coating segment having concentration of non-metallic elements increasing with distance from the conductive metal substrate.

7. The erosion and corrosion resistant protective coating of claim 1, being discontinuous and forming repeated geometrical shapes separated by narrow uncoated ribbons.

8. The erosion and corrosion resistant protective coating of claim 1, having toughness characterized by H/E>0.02.

9. The erosion and corrosion resistant protective coating of claim 1, the at least one coating segment comprising a metal-ceramic coating segment, the metal-ceramic coating segment including metal and ceramic content blended into one another by concurrent condensation of ion bombardment from at least two metal-gaseous filtered cathodic arc plasma beams overlapped by magnetic fields, wherein, at least during deposition of first micron of the metal-ceramic coating segment, deposition rate of metal ions is at least 3 µm/hr and kinetic energy of the metal ions exceeds 5 eV upon deposition.

10. The erosion and corrosion resistant protective coating of claim 9, the at least one coating segment comprising a monolithic metal-ceramic coating segment.

11. The erosion and corrosion resistant protective coating of claim 1, the at least one coating segment comprising at least one multilayer coating segment, each including one or more bilayers each containing a metal layer overlaid by a ceramic layer.

12. The erosion and corrosion resistant protective coating of claim 11, one of the at least one multilayer coating segment having (a) metal content decreasing with distance from the conductive metal substrate and (b) hardness and elastic modulus increasing with distance from the conductive metal substrate.

13. The erosion and corrosion resistant protective coating of claim 11, the at least one multilayer coating segment comprising a bottom multilayer coating segment and a top multilayer coating segment deposited on the bottom multilayer coating segment, the bottom and top multilayer coating segments having combined thickness of at least about 5 µm, with thickness of the majority of the bilayers of the bottom multilayer coating segment being smaller than the thickness of the bilayers of the top multilayer coating segment.

14. The erosion and corrosion resistant protective coating of claim 13, hardness of the bottom multilayer coating segment being in range from about 0.3 GPa to about 25 GPa, and hardness of the top multilayer coating segment being in range from about 25 GPa to about 80 GPa.

15. The erosion and corrosion resistant protective coating of claim 1, the at least one coating segment comprising at least one multilayer coating segment (i) having thickness in range from about 5 µm to about 500 µm, (ii) including a plurality of bilayers each including a metal layer overlaid by a ceramic layer, (iii) having metal content decreasing with distance from the conductive metal substrate, and (iv) having hardness and elastic modulus increasing with distance from the conductive metal substrate.

16. The erosion and corrosion resistant protective coating of claim 15, ratio of thickness of each metal layer to thickness of ceramic layer overlaid thereon decreasing with distance from the conductive metal substrate.

17. The erosion and corrosion resistant protective coating of claim 15, thickness of each metal layer decreasing with distance from the conductive metal substrate.

18. The erosion and corrosion resistant protective coating of claim 15, the at least one multilayer coating segment comprising a bottom multilayer coating segment and a top multilayer coating segment deposited on the bottom multilayer coating segment, at least one of the multilayer coating segments being within the bottom segment and having thickness of each metal layer between about 0.1 µm and about 5 µm and thickness of each ceramic layer between about 0.2 µm and about 10 µm.

19. The erosion and corrosion resistant protective coating of claim 15, further comprising a monolithic ceramic layer overlaying the at least one multilayer coating segment.

20. The erosion and corrosion resistant protective coating of claim 15, each metal layer being substantially composed of a same metal as the metal component of each ceramic layer.

21. The erosion and corrosion resistant protective coating of claim 15, each metal layer being substantially composed of metal selected from the group consisting of titanium, chromium, vanadium, molybdenum, aluminum, hafnium, zirconium, niobium, tungsten, and alloys thereof.

22. The erosion and corrosion resistant protective coating of claim 15, each ceramic layer including one or more ceramic compounds selected from the group consisting of: carbides of X, nitrides of X, borides of X, oxides of X, silicites of X, oxycarbides of X, and oxynitrides of X, wherein X is a metal selected from the group consisting of titanium, chromium, vanadium, molybdenum, aluminum, hafnium, zirconium, niobium, tungsten, and alloys thereof.

23. The erosion and corrosion resistant protective coating of claim 15, each ceramic layer in a region proximate the conductive metal substrate having lesser concentration of non-metallic elements than each ceramic layer in a region further from the conductive metal substrate.

24. The erosion and corrosion resistant protective coating of claim 1, further comprising a carbon diamond-like coating having a hardness from about 30 to about 80 GPa and thickness from about 5 μm to about 150 μm.

25. The erosion and corrosion resistant protective coating of claim 24, the carbon diamond-like coating including metal and being implemented as a top segment of the at least one coating segment deposited.

26. The erosion and corrosion resistant protective coating of claim 1, further comprising a base metal layer applied to the conductive metal substrate by a method selected from the group consisting of cold spray, thermal spray, HVOF, D-gun, and electroplating to be overlaid by the at least one multilayer coating segment.

27. The erosion and corrosion resistant protective coating of claim 26, the base metal layer having a thickness from about 20 μm to about 1 mm.

28. The erosion and corrosion resistant protective coating of claim 1, each of the at least one coating segment being formed by simultaneous condensation of (i) the metal ions from filtered arc source and (ii) metal atoms from sputtering or evaporation source.

29. The erosion and corrosion resistant protective coating of claim 28, deposition onto the conductive metal substrate of the metal atoms spatially overlapping with deposition onto the conductive metal substrate of the metal ions, while ratio of metal ion flux to combined flux of metal ions and metal atoms being greater than 5%.

30. The erosion and corrosion resistant protective coating of claim 29, the ratio of metal ion flux to combined flux of metal ions and metal atoms decreasing from initial stage of deposition to a later stage of deposition.

31. An erosion and corrosion resistant protective coating for turbomachinery applications, comprising:
at least one ceramic or metal-ceramic coating segment deposited on a surface of a conductive metal substrate subjected to a pre-deposition treatment by at least blasting to provide the surface of the conductive metal substrate with texture, each ceramic or metal-ceramic coating segment being formed by concurrent condensation of ion bombardment from metal-gaseous plasma flow and at least 95% ionized metal atoms, wherein, at least during deposition of the first micron of the at least one ceramic or metal-ceramic coating segment, the deposition rate of metal ions is at least 3 μm/hr while kinetic energy of metal ions is at least 5 eV upon deposition, each coating segment having a thickness of at least about 5 μm; and
an array of dome-like surface structures with a dome width of about 0.01 μm to about 30 μm.

32. The erosion and corrosion resistant protective coating of claim 31, wherein the array of dome-like surface structures forms at least part of a surface of the at least one ceramic or metal-ceramic coating segment furthest from the conductive metal substrate.

33. The erosion and corrosion resistant protective coating of claim 31, the array of dome-like surface structures including domes with a dome width less than about 1 μm.

34. The erosion and corrosion resistant protective coating of claim 31, having a thickness in the range of about 5 μm to about 40 μm.

35. The erosion and corrosion resistant protective coating of claim 31, the pre-deposition treatment comprising blasting to provide the surface with a pattern of cold work spots without changing surface roughness.

36. The erosion and corrosion resistant protective coating of claim 31, the pre-deposition treatment comprising powder spray coating.

37. An erosion and corrosion resistant protective coating for turbomachinery applications, comprising:
at least one coating segment each being ceramic or metal-ceramic and having thickness of at least about 5 μm and hardness in range between about 0.3 GPa and about 80 GPa;
the erosion and corrosion resistant coating having roughness characterized by Ra<1 μm, and dome-like structures with dome width between about 0.01 μm and about 30 μm.

38. The erosion and corrosion resistant protective coating of claim 37, the dome-like structures including domes with dome width less than about 1 μm.

39. The erosion and corrosion resistant protective coating of claim 37, having a top surface furthest from a conductive metal substrate on which the erosion and corrosion resistant coating is formed, surface roughness of the top surface being less than surface roughness of the surface of the conductive metal substrate.

40. The erosion and corrosion resistant protective coating of claim 37, the at least one coating segment comprising a monolithic metal-ceramic coating segment.

41. The erosion and corrosion resistant protective coating of claim 37, the at least one coating segment comprising a metal-ceramic coating segment having (a) metal content decreasing with distance from a conductive metal substrate, on which the erosion and corrosion resistant protective coating is formed, and (b) hardness and elastic modulus increasing with distance from the conductive metal substrate.

42. The erosion and corrosion resistant protective coating of claim 37, the at least one coating segment having concentration of non-metallic elements increasing with distance from the conductive metal substrate.

43. The erosion and corrosion resistant protective coating of claim 37, being discontinuous and forming repeated geometrical shapes separated by narrow uncoated ribbons.

44. The erosion and corrosion resistant protective coating of claim 37, having toughness characterized by H/E>0.02.

45. The erosion and corrosion resistant protective coating of claim 37, the at least one coating segment comprising at least one multilayer coating segment, each including one or more bilayers each containing a metal layer overlaid by a ceramic layer.

46. The erosion and corrosion resistant protective coating of claim 45, one of the at least one multilayer coating segment having (a) metal content decreasing with distance from a conductive metal substrate on which the erosion and corrosion resistant protective coating is formed and (b) hardness and elastic modulus increasing with distance from the conductive metal substrate.

47. The erosion and corrosion resistant protective coating of claim 45, the at least one multilayer coating segment comprising a bottom multilayer coating segment and a top multilayer coating segment deposited on the bottom multilayer coating segment, the bottom and top multilayer coating segments having combined thickness of at least about 5 μm, with thickness of the majority of the bilayers of the bottom multilayer coating segment being smaller than the thickness of the bilayers of the top multilayer coating segment.

48. The erosion and corrosion resistant protective coating of claim 47, hardness of the bottom multilayer coating segment being in range from about 0.3 GPa to about 25 GPa, and hardness of the top multilayer coating segment being in range from about 25 GPa to about 80 GPa.

49. The erosion and corrosion resistant protective coating of claim 37, the at least one coating segment comprising at least one multilayer coating segment (i) having thickness in range from about 5 μm to about 500 μm, (ii) including a plurality of bilayers each including a metal layer overlaid by a ceramic layer, (iii) having metal content decreasing with distance from a conductive metal substrate, on which the erosion and corrosion resistant protective coating is formed, and (iv) having hardness and elastic modulus increasing with distance from the conductive metal substrate.

50. The erosion and corrosion resistant protective coating of claim 49, wherein the ratio of thickness of each metal layer to the thickness of the ceramic layer overlaid thereon decreases with distance from the conductive metal substrate.

51. The erosion and corrosion resistant protective coating of claim 49, wherein the thickness of each metal layer decreases with distance from the conductive metal substrate.

52. The erosion and corrosion resistant protective coating of claim 49, the at least one multilayer coating segment comprising a bottom multilayer coating segment and a top multilayer coating segment deposited on the bottom multilayer coating segment, at least one of the multilayer coating segments being within the bottom segment and having thickness of each metal layer between about 0.1 μm and about 5 μm and thickness of each ceramic layer between about 0.2 μm and about 10 μm.

53. The erosion and corrosion resistant protective coating of claim 49, further comprising a monolithic ceramic layer overlaying the at least one multilayer coating segment.

54. The erosion and corrosion resistant protective coating of claim 49, each metal layer being substantially composed of a same metal as the metal component of each ceramic layer.

55. The erosion and corrosion resistant protective coating of claim 49, each ceramic layer in a region proximate the conductive metal substrate having lesser concentration of non-metallic elements than each ceramic layer in a region further from the conductive metal substrate.

56. The erosion and corrosion resistant protective coating of claim 37, further comprising a carbon diamond-like coating having a hardness from about 30 to about 80 GPa and thickness from about 5 μm to about 150 μm.

57. The erosion and corrosion resistant protective coating of claim 56, the carbon diamond-like coating including metal and being implemented as a top segment of the at least one coating segment deposited.

* * * * *